(12) United States Patent
Toscano et al.

(10) Patent No.: US 12,007,411 B2
(45) Date of Patent: Jun. 11, 2024

(54) TEST SOCKET HAVING AN AUTOMATED LID

(71) Applicant: Teradyne, Inc., North Reading, MA (US)

(72) Inventors: John P. Toscano, North Reading, MA (US); Christopher Bruno, North Reading, MA (US); David Graziose, North Reading, MA (US)

(73) Assignee: TERADYNE, INC., North Reading, MA (US)

(*) Notice: Subject to any disclaimer, the term of this patent is extended or adjusted under 35 U.S.C. 154(b) by 339 days.

(21) Appl. No.: 17/354,444

(22) Filed: Jun. 22, 2021

(65) Prior Publication Data
US 2022/0404394 A1 Dec. 22, 2022

(51) Int. Cl.
*G01R 31/28* (2006.01)
*G01R 1/04* (2006.01)

(52) U.S. Cl.
CPC ......... *G01R 1/0466* (2013.01); *G01R 1/0458* (2013.01); *G01R 31/2863* (2013.01); *G01R 31/2875* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 557,186 A | 3/1896 | Joseph |
| 2,224,407 A | 12/1940 | Passur |
| 2,380,026 A | 7/1945 | Clarke |
| 2,631,775 A | 3/1953 | Gordon |
| 2,635,524 A | 4/1953 | Jenkins |
| 3,120,166 A | 2/1964 | Lyman |
| 3,360,032 A | 12/1967 | Sherwood |
| 3,364,838 A | 1/1968 | Bradley |
| 3,517,601 A | 6/1970 | Courchesne |
| 3,845,286 A | 10/1974 | Zeiss et al. |
| 4,147,299 A | 4/1979 | Freeman |
| 4,233,644 A | 11/1980 | Hiwang et al. |

(Continued)

FOREIGN PATENT DOCUMENTS

| CM | 1114109 C | 7/2003 |
| CN | 1177187 A | 3/1998 |

(Continued)

OTHER PUBLICATIONS

International Search Report for International Application No. PCT/US2022/033894, dated Oct. 13, 2022, (3 pages).

(Continued)

*Primary Examiner* — Tung X Nguyen
(74) *Attorney, Agent, or Firm* — Burns & Levinson LLP

(57) ABSTRACT

An example test socket for a test system includes a receptacle to make electrical and mechanical connections to a device under test (DUT) and a lid to cover the DUT in the receptacle. The lid is controllable to open automatically to enable receipt of the DUT in the receptacle and, following receipt of the DUT, to close automatically to cover the DUT in the receptacle. Closing the lid applies force to the DUT to complete the electrical and mechanical connections between the test socket and the DUT.

26 Claims, 69 Drawing Sheets

(56) References Cited

U.S. PATENT DOCUMENTS

| | | |
|---|---|---|
| 4,336,748 A | 6/1982 | Martin et al. |
| 4,379,259 A | 4/1983 | Varadi et al. |
| 4,477,127 A | 10/1984 | Kume |
| 4,495,545 A | 1/1985 | Dufresne et al. |
| 4,526,318 A | 7/1985 | Fleming et al. |
| 4,620,248 A | 10/1986 | Gitzendanner |
| 4,648,007 A | 3/1987 | Garner |
| 4,654,727 A | 3/1987 | Blum et al. |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,700,293 A | 10/1987 | Grone |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,775,281 A | 10/1988 | Prentakis |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,878,137 A | 10/1989 | Yamashita et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,094,584 A | 3/1992 | Bullock |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,143,193 A | 9/1992 | Geraci |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,223,785 A * | 6/1993 | Becker ............... G01R 1/0466 414/416.01 |
| 5,237,484 A | 8/1993 | Ferchau et al. |
| 5,263,537 A | 11/1993 | Plucinski et al. |
| 5,268,637 A | 12/1993 | Liken |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,343,403 A | 8/1994 | Beidle et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,531 A | 5/1995 | Clapp, III |
| 5,412,534 A | 5/1995 | Cutts et al. |
| 5,414,591 A | 5/1995 | Kimura et al. |
| 5,426,581 A | 6/1995 | Kishi et al. |
| 5,434,737 A | 7/1995 | Okimi |
| 5,469,037 A | 11/1995 | McMurtrey, Sr. et al. |
| 5,477,416 A | 12/1995 | Schkrohowsky |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,766 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,703,843 A | 12/1997 | Katsuyama et al. |
| 5,718,627 A | 2/1998 | Wicks |
| 5,718,628 A | 2/1998 | Nakazato et al. |
| 5,719,985 A | 2/1998 | Norikazu et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,785,482 A | 7/1998 | Nobuhiro |
| 5,793,610 A | 8/1998 | Schmitt et al. |
| 5,811,678 A | 9/1998 | Hirano |
| 5,812,761 A | 9/1998 | Seki et al. |
| 5,813,817 A | 9/1998 | Matsumiya et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,892,367 A | 4/1999 | Magee et al. |
| 5,894,218 A | 4/1999 | Farnworth et al. |
| 5,912,799 A | 6/1999 | Grouell et al. |
| 5,913,926 A | 6/1999 | Anderson et al. |
| 5,914,856 A | 6/1999 | Morton et al. |
| 5,927,386 A | 7/1999 | Lin |
| 5,955,877 A | 9/1999 | Farnworth et al. |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Masayuki |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,084,768 A | 7/2000 | Bolognia |
| 6,094,342 A | 7/2000 | Dague et al. |
| 6,104,607 A | 8/2000 | Behl |
| 6,107,813 A | 8/2000 | Sinsheimer et al. |
| 6,115,250 A | 9/2000 | Schmitt |
| 6,122,131 A | 9/2000 | Jeppson |
| 6,122,232 A | 9/2000 | Schell et al. |
| 6,124,707 A | 9/2000 | Kim et al. |
| 6,129,428 A | 10/2000 | Helwig et al. |
| 6,130,817 A | 10/2000 | Flotho et al. |
| 6,144,553 A | 11/2000 | Hileman et al. |
| 6,166,901 A | 12/2000 | Gamble et al. |
| 6,169,413 B1 | 1/2001 | Paek et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |

(56) References Cited

U.S. PATENT DOCUMENTS

| | | |
|---|---|---|
| 6,185,097 B1 | 2/2001 | Behl |
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Shen-Yi |
| 6,233,148 B1 | 5/2001 | Shen |
| 6,236,563 B1 | 5/2001 | Buican et al. |
| 6,247,944 B1 | 6/2001 | Bolognia et al. |
| 6,249,824 B1 | 6/2001 | Henrichs |
| 6,252,769 B1 | 6/2001 | Tullstedt et al. |
| 6,262,581 B1 | 7/2001 | Han |
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,301,105 B2 | 10/2001 | Glorioso et al. |
| 6,302,714 B1 | 10/2001 | Bolognia et al. |
| 6,304,839 B1 | 10/2001 | Ho et al. |
| 6,307,386 B1 | 10/2001 | Fowler et al. |
| 6,327,150 B1 | 12/2001 | Levy et al. |
| 6,330,154 B1 | 12/2001 | Fryers et al. |
| 6,351,379 B1 | 2/2002 | Cheng |
| 6,353,329 B1 | 3/2002 | Kiffe |
| 6,354,792 B1 | 3/2002 | Kobayashi et al. |
| 6,356,409 B1 | 3/2002 | Price et al. |
| 6,356,415 B1 | 3/2002 | Kabasawa |
| 6,384,593 B1 | 5/2002 | Kobayashi et al. |
| 6,384,995 B1 | 5/2002 | Smith |
| 6,388,437 B1 | 5/2002 | Wolski et al. |
| 6,388,875 B1 | 5/2002 | Chen |
| 6,388,878 B1 | 5/2002 | Chang |
| 6,389,225 B1 | 5/2002 | Malinoski et al. |
| 6,390,756 B1 | 5/2002 | Isaacs et al. |
| 6,411,584 B2 | 6/2002 | Davis et al. |
| 6,421,236 B1 | 7/2002 | Montoya et al. |
| 6,434,000 B1 | 8/2002 | Pandolfi |
| 6,434,498 B1 | 8/2002 | Ulrich et al. |
| 6,434,499 B1 | 8/2002 | Ulrich et al. |
| 6,459,572 B1 | 10/2002 | Huang et al. |
| 6,464,080 B1 | 10/2002 | Morris et al. |
| 6,467,153 B2 | 10/2002 | Butts et al. |
| 6,473,297 B1 | 10/2002 | Behl et al. |
| 6,473,301 B1 | 10/2002 | Levy et al. |
| 6,476,627 B1 | 11/2002 | Pelissier et al. |
| 6,477,044 B2 | 11/2002 | Foley et al. |
| 6,477,442 B1 | 11/2002 | Valerino, Sr. |
| 6,480,380 B1 | 11/2002 | French et al. |
| 6,480,382 B2 | 11/2002 | Cheng |
| 6,487,071 B1 | 11/2002 | Tata et al. |
| 6,489,793 B2 | 12/2002 | Jones et al. |
| 6,494,663 B2 | 12/2002 | Ostwald et al. |
| 6,515,470 B2 | 2/2003 | Suzuki et al. |
| 6,525,933 B2 | 2/2003 | Eland |
| 6,526,841 B1 | 3/2003 | Wanek et al. |
| 6,535,384 B2 | 3/2003 | Huang |
| 6,537,013 B2 | 3/2003 | Emberty et al. |
| 6,544,309 B1 | 4/2003 | Hoefer et al. |
| 6,546,445 B1 | 4/2003 | Hayes |
| 6,553,279 B2 | 4/2003 | Brown |
| 6,553,532 B2 | 4/2003 | Aoki |
| 6,560,107 B1 | 5/2003 | Beck et al. |
| 6,565,163 B2 | 5/2003 | Behl et al. |
| 6,566,859 B2 | 5/2003 | Wolski et al. |
| 6,567,266 B2 | 5/2003 | Ives et al. |
| 6,568,770 B2 | 5/2003 | Gonska et al. |
| 6,570,734 B2 | 5/2003 | Ostwald et al. |
| 6,577,586 B1 | 6/2003 | Yang et al. |
| 6,577,687 B2 | 6/2003 | Hall et al. |
| 6,618,246 B2 | 9/2003 | Sullivan et al. |
| 6,618,254 B2 | 9/2003 | Ives |
| 6,618,548 B1 | 9/2003 | Shuji et al. |
| 6,626,846 B2 | 9/2003 | Spencer |
| 6,628,518 B2 | 9/2003 | Behl et al. |
| 6,635,115 B2 | 10/2003 | Fairbairn et al. |
| 6,640,235 B1 | 10/2003 | Anderson |
| 6,644,982 B1 | 11/2003 | Ondricek et al. |
| 6,651,192 B1 | 11/2003 | Viglione et al. |
| 6,654,240 B1 | 11/2003 | Tseng et al. |
| 6,679,128 B2 | 1/2004 | Wanek et al. |
| 6,693,757 B2 | 2/2004 | Hayakawa et al. |
| 6,701,003 B1 | 3/2004 | Feinstein |
| 6,736,583 B2 | 5/2004 | Ostwald et al. |
| 6,741,529 B2 | 5/2004 | Getreuer |
| 6,746,648 B1 | 6/2004 | Mattila et al. |
| 6,751,093 B1 | 6/2004 | Hsu et al. |
| 6,791,785 B1 | 9/2004 | Messenger et al. |
| 6,791,799 B2 | 9/2004 | Fletcher |
| 6,798,651 B2 | 9/2004 | Syring et al. |
| 6,798,972 B1 | 9/2004 | Ito et al. |
| 6,801,834 B1 | 10/2004 | Konshak et al. |
| 6,806,700 B2 | 10/2004 | Wanek et al. |
| 6,808,353 B2 | 10/2004 | Ostwald et al. |
| 6,811,427 B2 | 11/2004 | Garrett et al. |
| 6,822,412 B1 | 11/2004 | Gan et al. |
| 6,822,858 B2 | 11/2004 | Allgeyer et al. |
| 6,826,046 B1 | 11/2004 | Muncaster et al. |
| 6,830,372 B2 | 12/2004 | Ju et al. |
| 6,832,929 B2 | 12/2004 | Garrett et al. |
| 6,838,051 B2 | 1/2005 | Marquiss et al. |
| 6,854,174 B2 | 2/2005 | Jiang |
| 6,861,861 B2 | 3/2005 | Song |
| 6,862,173 B1 | 3/2005 | Konshak et al. |
| 6,867,939 B2 | 3/2005 | Katahara et al. |
| 6,882,141 B2 | 4/2005 | Kim |
| 6,892,328 B2 | 5/2005 | Klein et al. |
| 6,904,479 B2 | 6/2005 | Hall et al. |
| 6,908,330 B2 | 6/2005 | Garrett et al. |
| 6,928,336 B2 | 8/2005 | Peshkin et al. |
| 6,937,432 B2 | 8/2005 | Sri-Jayantha et al. |
| 6,957,291 B2 | 10/2005 | Moon et al. |
| 6,960,908 B2 | 11/2005 | Chung et al. |
| 6,965,811 B2 | 11/2005 | Dickey et al. |
| 6,974,017 B2 | 12/2005 | Oseguera |
| 6,976,190 B1 | 12/2005 | Goldstone |
| 6,980,381 B2 | 12/2005 | Gray et al. |
| 6,982,872 B2 | 1/2006 | Behl et al. |
| 7,002,363 B2 | 2/2006 | Mathieu |
| 7,006,325 B2 | 2/2006 | Emberty et al. |
| 7,013,198 B2 | 3/2006 | Haas |
| 7,021,883 B1 | 4/2006 | Plutt et al. |
| 7,039,924 B2 | 5/2006 | Goodman et al. |
| 7,047,106 B2 | 5/2006 | Butka et al. |
| 7,054,150 B2 | 5/2006 | Orriss et al. |
| 7,070,323 B2 | 7/2006 | Wanek et al. |
| 7,076,391 B1 | 7/2006 | Pakzad et al. |
| 7,077,614 B1 | 7/2006 | Hasper et al. |
| 7,084,655 B2 | 8/2006 | Min et al. |
| 7,088,541 B2 | 8/2006 | Orriss et al. |
| 7,092,251 B1 | 8/2006 | Henry |
| 7,106,582 B2 | 9/2006 | Albrecht et al. |
| 7,123,477 B2 | 10/2006 | Coglitore et al. |
| 7,126,777 B2 | 10/2006 | Flechsig et al. |
| 7,130,138 B2 | 10/2006 | Lum et al. |
| 7,134,553 B2 | 11/2006 | Stephens |
| 7,139,145 B1 | 11/2006 | Archibald et al. |
| 7,142,419 B2 | 11/2006 | Cochrane |
| 7,164,579 B2 | 1/2007 | Muncaster et al. |
| 7,167,360 B2 | 1/2007 | Inoue et al. |
| 7,181,458 B1 | 2/2007 | Higashi |
| 7,203,021 B1 | 4/2007 | Ryan et al. |
| 7,203,060 B2 | 4/2007 | Kay et al. |
| 7,206,201 B2 | 4/2007 | Behl et al. |
| 7,216,968 B2 | 5/2007 | Smith et al. |
| 7,219,028 B2 | 5/2007 | Bae et al. |
| 7,219,273 B2 | 5/2007 | Fisher et al. |
| 7,227,746 B2 | 6/2007 | Tanaka et al. |

(56) References Cited

U.S. PATENT DOCUMENTS

| | | |
|---|---|---|
| 7,232,101 B2 | 6/2007 | Wanek et al. |
| 7,243,043 B2 | 7/2007 | Shin |
| 7,248,467 B2 | 7/2007 | Sri-Jayantha et al. |
| 7,249,992 B2 | 7/2007 | Kalenian et al. |
| 7,251,544 B2 | 7/2007 | Christie, Jr. |
| 7,257,747 B2 | 8/2007 | Song |
| 7,259,966 B2 | 8/2007 | Connelly, Jr. et al. |
| 7,273,344 B2 | 9/2007 | Ostwald et al. |
| 7,280,352 B2 | 10/2007 | Wilson et al. |
| 7,280,353 B2 | 10/2007 | Wendel et al. |
| 7,304,855 B1 | 12/2007 | Milligan et al. |
| 7,315,447 B2 | 1/2008 | Inoue et al. |
| 7,333,283 B2 | 2/2008 | Akamatsu et al. |
| 7,349,205 B2 | 3/2008 | Hall et al. |
| 7,353,524 B1 | 4/2008 | Lin et al. |
| 7,362,961 B2 | 4/2008 | Shigeru et al. |
| 7,375,960 B2 | 5/2008 | Blaalid et al. |
| 7,385,385 B2 | 6/2008 | Magliocco et al. |
| 7,387,485 B2 | 6/2008 | Dickey et al. |
| 7,390,458 B2 | 6/2008 | Burow et al. |
| 7,391,609 B2 | 6/2008 | Wendel et al. |
| 7,395,133 B2 | 7/2008 | Lowe |
| 7,403,451 B2 | 7/2008 | Goodman |
| 7,408,338 B2 | 8/2008 | Ham et al. |
| 7,416,332 B2 | 8/2008 | Rountree et al. |
| 7,421,623 B2 | 9/2008 | Haugh |
| 7,437,212 B2 | 10/2008 | Farchmin |
| 7,447,011 B2 | 11/2008 | Wade et al. |
| 7,457,112 B2 | 11/2008 | Fukuda et al. |
| 7,467,024 B2 | 12/2008 | Flitsch |
| 7,476,362 B2 | 1/2009 | Angros |
| 7,480,807 B2 | 1/2009 | Wilson et al. |
| 7,483,269 B1 | 1/2009 | Marvin, Jr. et al. |
| 7,505,264 B2 | 3/2009 | Hall et al. |
| 7,554,811 B2 | 6/2009 | Scicluna et al. |
| 7,568,122 B2 | 7/2009 | Mechalke et al. |
| 7,570,455 B2 | 8/2009 | Deguchi et al. |
| 7,573,715 B2 | 8/2009 | Mojaver et al. |
| 7,584,016 B2 | 9/2009 | Weaver |
| 7,584,851 B2 | 9/2009 | Hong et al. |
| 7,612,996 B2 | 11/2009 | Atkins et al. |
| 7,625,027 B2 | 12/2009 | Kiaie et al. |
| 7,630,196 B2 | 12/2009 | Hall et al. |
| 7,635,246 B2 | 12/2009 | Neeper |
| 7,643,289 B2 | 1/2010 | Ye et al. |
| 7,646,596 B2 | 1/2010 | Ng |
| 7,710,684 B2 | 5/2010 | Koujiro |
| 7,729,107 B2 | 6/2010 | Atkins et al. |
| 7,729,112 B2 | 6/2010 | Atkins |
| 7,737,715 B2 | 6/2010 | Tilbor et al. |
| 7,777,985 B2 | 8/2010 | Barkley |
| 7,778,031 B1 | 8/2010 | Merrow et al. |
| 7,789,267 B2 | 9/2010 | Hutchinson et al. |
| 7,796,724 B2 | 9/2010 | Ito |
| 7,848,106 B2 | 12/2010 | Merrow |
| 7,852,723 B2 | 12/2010 | Onagi et al. |
| 7,890,207 B2 | 2/2011 | Toscano et al. |
| 7,904,211 B2 | 3/2011 | Merrow et al. |
| 7,908,029 B2 | 3/2011 | Slocum, III |
| 7,911,778 B2 | 3/2011 | Merrow |
| 7,920,380 B2 | 4/2011 | Merrow et al. |
| 7,929,303 B1 | 4/2011 | Merrow |
| 7,932,734 B2 | 4/2011 | Merrow et al. |
| 7,936,534 B2 | 5/2011 | Orriss et al. |
| 7,940,529 B2 | 5/2011 | Merrow et al. |
| 7,945,424 B2 | 5/2011 | Garcia et al. |
| 7,987,018 B2 | 7/2011 | Polyakov et al. |
| 7,995,349 B2 | 8/2011 | Merrow et al. |
| 7,996,174 B2 | 8/2011 | Garcia et al. |
| 8,041,449 B2 | 10/2011 | Noble et al. |
| 8,046,187 B2 | 10/2011 | Klein et al. |
| 8,061,155 B2 | 11/2011 | Farquhar et al. |
| 8,086,343 B2 | 12/2011 | Slocum, III |
| 8,095,234 B2 | 1/2012 | Polyakov et al. |
| 8,102,173 B2 | 1/2012 | Merrow |
| 8,116,079 B2 | 2/2012 | Merrow |
| 8,117,480 B2 | 2/2012 | Merrow et al. |
| 8,140,182 B2 | 3/2012 | Noble et al. |
| 8,160,739 B2 | 4/2012 | Toscano et al. |
| 8,167,521 B2 | 5/2012 | Nakao et al. |
| 8,238,099 B2 | 8/2012 | Merrow |
| 8,279,603 B2 | 10/2012 | Merrow et al. |
| 8,305,751 B2 | 11/2012 | Merrow |
| 8,318,512 B2 | 11/2012 | Shah et al. |
| 8,339,445 B2 | 12/2012 | Yoro et al. |
| 8,405,971 B2 | 3/2013 | Merrow et al. |
| 8,466,699 B2 | 6/2013 | Merrow et al. |
| 8,467,180 B2 | 6/2013 | Merrow et al. |
| 8,482,915 B2 | 7/2013 | Merrow |
| 8,485,511 B2 | 7/2013 | Di Stefano |
| 8,499,611 B2 | 8/2013 | Merrow et al. |
| 8,504,194 B2 | 8/2013 | Mitsuyoshi |
| 8,547,123 B2 | 10/2013 | Merrow et al. |
| 8,549,912 B2 | 10/2013 | Merrow et al. |
| 8,628,239 B2 | 1/2014 | Merrow et al. |
| 8,631,698 B2 | 1/2014 | Merrow et al. |
| 8,655,482 B2 | 2/2014 | Merrow |
| 8,687,349 B2 | 4/2014 | Truebenbach |
| 8,687,356 B2 | 4/2014 | Merrow |
| 8,755,177 B2 | 6/2014 | Farquhar et al. |
| 8,770,204 B2 | 7/2014 | Bencivenni et al. |
| 8,886,946 B1 | 11/2014 | Fraser et al. |
| 8,926,196 B2 | 1/2015 | Detofsky et al. |
| 8,941,726 B2 | 1/2015 | Marks et al. |
| 8,964,361 B2 | 2/2015 | Truebenbach |
| 8,967,605 B2 | 3/2015 | Kogure |
| 8,970,244 B2 | 3/2015 | Di Stefano et al. |
| 9,001,456 B2 | 4/2015 | Campbell et al. |
| 9,002,186 B2 | 4/2015 | Akers et al. |
| 9,196,518 B1 | 11/2015 | Hofmeister et al. |
| 9,201,093 B2 | 12/2015 | Chae-Yoon |
| 9,459,312 B2 | 10/2016 | Arena et al. |
| 9,463,574 B2 | 10/2016 | Purkayastha et al. |
| 9,483,040 B2 | 11/2016 | Kazumasa |
| 9,580,245 B2 | 2/2017 | Mansfield et al. |
| 9,606,145 B2 | 3/2017 | Peng et al. |
| 9,779,780 B2 | 10/2017 | Martino |
| 9,789,605 B2 | 10/2017 | Meier et al. |
| 10,359,779 B2 | 7/2019 | Duda et al. |
| 10,466,273 B1 | 11/2019 | Hwang et al. |
| 10,675,487 B2 | 6/2020 | Zwart et al. |
| 10,725,091 B2 | 7/2020 | Bowyer et al. |
| 10,845,410 B2 | 11/2020 | Bowyer et al. |
| 11,002,787 B2 | 5/2021 | Wolff et al. |
| 11,754,596 B2 | 9/2023 | McKenna et al. |
| 11,754,622 B2 | 9/2023 | Akers et al. |
| 2001/0006453 A1 | 7/2001 | Glorioso et al. |
| 2001/0044023 A1 | 11/2001 | Johnson et al. |
| 2001/0046118 A1 | 11/2001 | Yamanashi et al. |
| 2001/0048590 A1 | 12/2001 | Behl et al. |
| 2002/0009391 A1 | 1/2002 | Marquiss et al. |
| 2002/0026258 A1 | 2/2002 | Suzuki et al. |
| 2002/0030981 A1 | 3/2002 | Sullivan et al. |
| 2002/0044416 A1 | 4/2002 | Harmon et al. |
| 2002/0051338 A1 | 5/2002 | Jiang et al. |
| 2002/0056057 A1 | 5/2002 | Co |
| 2002/0071248 A1 | 6/2002 | Huang et al. |
| 2002/0079422 A1 | 6/2002 | Jiang |
| 2002/0090320 A1 | 7/2002 | Burow et al. |
| 2002/0116087 A1 | 8/2002 | Brown |
| 2002/0161971 A1 | 10/2002 | Dimitri et al. |
| 2002/0172004 A1 | 11/2002 | Ives et al. |
| 2003/0035271 A1 | 2/2003 | Lelong et al. |
| 2003/0043550 A1 | 3/2003 | Ives |
| 2003/0121337 A1 | 7/2003 | Wanek et al. |
| 2003/0206397 A1 | 11/2003 | Allgeyer et al. |
| 2004/0051544 A1 | 3/2004 | Malathong et al. |
| 2004/0165489 A1 | 8/2004 | Goodman et al. |
| 2004/0207387 A1 | 10/2004 | Chung et al. |
| 2004/0208354 A1 | 10/2004 | Vilela |
| 2004/0230399 A1 | 11/2004 | Shin |
| 2004/0236465 A1 | 11/2004 | Butka et al. |
| 2004/0251866 A1 | 12/2004 | Gan et al. |
| 2004/0264121 A1 | 12/2004 | Orriss et al. |

(56) References Cited

U.S. PATENT DOCUMENTS

| | | |
|---|---|---|
| 2005/0004703 A1 | 1/2005 | Christie |
| 2005/0010836 A1 | 1/2005 | Bae et al. |
| 2005/0012498 A1 | 1/2005 | Lee et al. |
| 2005/0018397 A1 | 1/2005 | Kav et al. |
| 2005/0055601 A1 | 3/2005 | Wilson et al. |
| 2005/0057849 A1 | 3/2005 | Twogood et al. |
| 2005/0062463 A1 | 3/2005 | Kim |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0164530 A1 | 7/2005 | Yates et al. |
| 2005/0179457 A1 | 8/2005 | Min et al. |
| 2005/0207059 A1 | 9/2005 | Cochrane |
| 2005/0216811 A1 | 9/2005 | Song |
| 2005/0219809 A1 | 10/2005 | Muncaster et al. |
| 2005/0225338 A1 | 10/2005 | Sands et al. |
| 2005/0270737 A1 | 12/2005 | Wilson et al. |
| 2006/0010353 A1 | 1/2006 | Haugh |
| 2006/0023331 A1 | 2/2006 | Flechsia et al. |
| 2006/0028802 A1 | 2/2006 | Shaw et al. |
| 2006/0035563 A1 | 2/2006 | Kalenian et al. |
| 2006/0066974 A1 | 3/2006 | Akamatsu et al. |
| 2006/0130316 A1 | 6/2006 | Takase et al. |
| 2006/0190205 A1 | 8/2006 | Klein et al. |
| 2006/0208757 A1 | 9/2006 | Bjork |
| 2006/0227517 A1 | 10/2006 | Zayas et al. |
| 2006/0250766 A1 | 11/2006 | Blaalid et al. |
| 2007/0018673 A1 | 1/2007 | Hsieh |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0040570 A1 | 2/2007 | Gopal et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0144542 A1 | 6/2007 | Bencivenni et al. |
| 2007/0152655 A1 | 7/2007 | Ham et al. |
| 2007/0183871 A1 | 8/2007 | Hofmeister et al. |
| 2007/0185676 A1 | 8/2007 | Ding et al. |
| 2007/0195497 A1 | 8/2007 | Atkins |
| 2007/0248142 A1 | 10/2007 | Rountree et al. |
| 2007/0253157 A1 | 11/2007 | Atkins et al. |
| 2007/0286045 A1 | 12/2007 | Onagi et al. |
| 2007/0296408 A1 | 12/2007 | Liao et al. |
| 2007/0296426 A1 | 12/2007 | Krishnaswami et al. |
| 2008/0002538 A1 | 1/2008 | Raaymakers |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0191725 A1 | 8/2008 | Cojocneanu et al. |
| 2008/0238460 A1 | 10/2008 | Kress et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2008/0297140 A1 | 12/2008 | An et al. |
| 2008/0317575 A1 | 12/2008 | Yamazaki et al. |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow et al. |
| 2009/0175705 A1 | 7/2009 | Nakao et al. |
| 2009/0261047 A1 | 10/2009 | Merrow |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow et al. |
| 2009/0265136 A1 | 10/2009 | Garcia et al. |
| 2009/0297328 A1 | 12/2009 | Slocum, III |
| 2010/0074404 A1 | 3/2010 | Ito |
| 2010/0083732 A1 | 4/2010 | Merrow et al. |
| 2010/0165498 A1 | 7/2010 | Merrow et al. |
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0220183 A1 | 9/2010 | Yoro |
| 2010/0230885 A1 | 9/2010 | Di Stefano |
| 2010/0249993 A1 | 9/2010 | Mitsuyoshi |
| 2010/0265609 A1 | 10/2010 | Merrow et al. |
| 2010/0265610 A1 | 10/2010 | Merrow et al. |
| 2010/0279439 A1 | 11/2010 | Shah et al. |
| 2010/0283476 A1 | 11/2010 | Shen |
| 2010/0302678 A1 | 12/2010 | Merrow |
| 2011/0011844 A1 | 1/2011 | Merrow et al. |
| 2011/0012631 A1 | 1/2011 | Merrow et al. |
| 2011/0012632 A1 | 1/2011 | Merrow et al. |
| 2011/0013362 A1 | 1/2011 | Merrow et al. |
| 2011/0013665 A1 | 1/2011 | Merrow et al. |
| 2011/0013666 A1 | 1/2011 | Merrow et al. |
| 2011/0013667 A1 | 1/2011 | Merrow et al. |
| 2011/0064546 A1 | 3/2011 | Merrow |
| 2011/0074458 A1 | 3/2011 | Di Stefano et al. |
| 2011/0148020 A1 | 6/2011 | Kogure |
| 2011/0157825 A1 | 6/2011 | Merrow et al. |
| 2011/0172807 A1 | 7/2011 | Merrow |
| 2011/0185811 A1 | 8/2011 | Merrow et al. |
| 2011/0189934 A1 | 8/2011 | Merrow |
| 2011/0236163 A1 | 9/2011 | Smith et al. |
| 2011/0261483 A1 | 10/2011 | Campbell et al. |
| 2011/0305132 A1 | 12/2011 | Merrow et al. |
| 2011/0310724 A1 | 12/2011 | Martino |
| 2012/0023370 A1 | 1/2012 | Truebenbach |
| 2012/0034054 A1 | 2/2012 | Polyakov et al. |
| 2012/0050903 A1 | 3/2012 | Campbell et al. |
| 2012/0106351 A1 | 5/2012 | Gohel et al. |
| 2012/0321435 A1 | 12/2012 | Truebenbach |
| 2013/0071224 A1 | 3/2013 | Merrow et al. |
| 2013/0108253 A1 | 5/2013 | Akers et al. |
| 2013/0181576 A1 | 7/2013 | Shiozawa et al. |
| 2013/0200915 A1 | 8/2013 | Panagas |
| 2013/0256967 A1 | 10/2013 | Carvalho |
| 2013/0340445 A1 | 12/2013 | Yosef et al. |
| 2013/0345836 A1 | 12/2013 | Ikushima |
| 2014/0002123 A1 | 1/2014 | Lee |
| 2014/0093214 A1 | 4/2014 | Detofsky et al. |
| 2014/0160270 A1 | 6/2014 | Naito et al. |
| 2014/0260333 A1 | 9/2014 | Lopez et al. |
| 2014/0271064 A1 | 9/2014 | Merrow et al. |
| 2014/0306728 A1 | 10/2014 | Arena et al. |
| 2015/0127986 A1 | 5/2015 | Tahara |
| 2016/0041202 A1 | 2/2016 | Peng et al. |
| 2017/0059635 A1 | 3/2017 | Orchanian et al. |
| 2017/0277185 A1 | 9/2017 | Duda et al. |
| 2017/0285102 A1 | 10/2017 | Ding et al. |
| 2018/0294244 A1 | 10/2018 | Onozawa et al. |
| 2018/0313890 A1 | 11/2018 | Wolff |
| 2018/0314249 A1 | 11/2018 | Appu et al. |
| 2019/0064252 A1 | 2/2019 | Bowyer et al. |
| 2019/0064254 A1 | 2/2019 | Bowyer et al. |
| 2019/0064261 A1 | 2/2019 | Bowyer et al. |
| 2019/0064305 A1 | 2/2019 | Khalid |
| 2019/0277907 A1 | 9/2019 | Wolff et al. |
| 2020/0025823 A1 | 1/2020 | Teich et al. |
| 2020/0319231 A1 | 10/2020 | Adams et al. |
| 2021/0293877 A1* | 9/2021 | Gopal ............... G01R 31/2863 |

FOREIGN PATENT DOCUMENTS

| | | |
|---|---|---|
| CN | 1192544 A | 9/1998 |
| CN | 2341188 Y | 9/1999 |
| DE | 3786944 T2 | 11/1993 |
| DE | 69111634 T2 | 5/1996 |
| DE | 69400145 T2 | 10/1996 |

(56) References Cited

FOREIGN PATENT DOCUMENTS

| | | |
|---|---|---|
| DE | 19701548 A1 | 8/1997 |
| DE | 19804813 A1 | 9/1998 |
| DE | 69614460 T2 | 6/2002 |
| DE | 69626584 T2 | 12/2003 |
| DE | 19861388 B4 | 8/2007 |
| EP | 0242970 A2 | 2/1987 |
| EP | 0277634 A2 | 8/1988 |
| EP | 0210497 B1 | 12/1988 |
| EP | 0356977 B1 | 10/1990 |
| EP | 0442642 A2 | 6/1991 |
| EP | 0466073 A2 | 1/1992 |
| EP | 0523633 | 1/1993 |
| EP | 0582017 A1 | 2/1994 |
| EP | 0617570 A1 | 9/1994 |
| EP | 0635836 A1 | 1/1995 |
| EP | 0657887 | 6/1995 |
| EP | 0757351 A2 | 2/1997 |
| EP | 0776009 B1 | 7/1997 |
| EP | 0757320 A2 | 2/1998 |
| EP | 0741508 A2 | 10/1998 |
| EP | 1045301 A2 | 10/2000 |
| EP | 0840476 B1 | 1/2001 |
| EP | 1209557 A2 | 5/2002 |
| EP | 1234308 B1 | 8/2002 |
| EP | 1422713 A2 | 5/2004 |
| EP | 1612798 B1 | 1/2006 |
| EP | 1760722 A1 | 3/2007 |
| GB | 2241118 A | 8/1991 |
| GB | 2276275 A | 9/1994 |
| GB | 2299436 A | 10/1996 |
| GB | 2312984 A | 11/1997 |
| GB | 2328782 A | 3/1999 |
| GB | 2347597 | 9/2000 |
| GB | 2439844 A | 1/2008 |
| JP | 61115279 A | 6/1986 |
| JP | 62177621 A | 8/1987 |
| JP | 62239394 A | 10/1987 |
| JP | 62251915 A | 11/1987 |
| JP | 63002160 A | 1/1988 |
| JP | 63004483 A | 1/1988 |
| JP | 63016482 A | 1/1988 |
| JP | 63062057 A | 3/1988 |
| JP | 63201946 A | 8/1988 |
| JP | 63214972 A | 9/1988 |
| JP | 63269376 A | 11/1988 |
| JP | S63195697 U | 12/1988 |
| JP | 84-089034 A | 4/1989 |
| JP | 2091565 A | 3/1990 |
| JP | 12098197 A | 4/1990 |
| JP | 2185784 A | 7/1990 |
| JP | 2199690 A | 8/1990 |
| JP | 2278375 A | 11/1990 |
| JP | 2297770 A | 12/1990 |
| JP | 3008066 A | 1/1991 |
| JP | H03-8086 | 1/1991 |
| JP | H03-52183 | 3/1991 |
| JP | 3078160 A | 4/1991 |
| JP | H03-78160 | 4/1991 |
| JP | 3105704 A | 5/1991 |
| JP | 3207947 A | 9/1991 |
| JP | 3210662 A | 9/1991 |
| JP | 3212859 A | 9/1991 |
| JP | 3214490 A | 9/1991 |
| JP | 3240821 A | 10/1991 |
| JP | 3295071 A | 12/1991 |
| JP | 4017134 A | 1/1992 |
| JP | 4143989 A | 5/1992 |
| JP | 4172658 A | 6/1992 |
| JP | 4214288 A | 8/1992 |
| JP | 4247385 A | 9/1992 |
| JP | 4259956 A | 9/1992 |
| JP | 4307440 A | 10/1992 |
| JP | 4325923 A | 11/1992 |
| JP | 5035053 A | 2/1993 |
| JP | 5035415 A | 2/1993 |
| JP | 5066896 A | 3/1993 |
| JP | 5068257 A | 3/1993 |
| JP | 5073566 A | 3/1993 |
| JP | 5073803 A | 3/1993 |
| JP | 5101603 A | 4/1993 |
| JP | 5173718 A | 7/1993 |
| JP | 5189163 A | 7/1993 |
| JP | 5204725 A | 8/1993 |
| JP | 5223551 A | 8/1993 |
| JP | H05319520 A | 12/1993 |
| JP | 6004220 B2 | 1/1994 |
| JP | 6004981 A | 1/1994 |
| JP | H6162645 A | 6/1994 |
| JP | H6181561 A | 6/1994 |
| JP | H6215515 A | 8/1994 |
| JP | H6274943 A | 9/1994 |
| JP | 6314173 A | 11/1994 |
| JP | 7007321 B | 1/1995 |
| JP | 7029364 A | 1/1995 |
| JP | H07-29364 | 1/1995 |
| JP | H07010212 A | 1/1995 |
| JP | 7037376 A | 2/1995 |
| JP | 7056654 A | 3/1995 |
| JP | 7111078 A | 4/1995 |
| JP | 7115497 A | 5/1995 |
| JP | 7201082 A | 8/1995 |
| JP | 7226023 A | 8/1995 |
| JP | H07-230669 | 8/1995 |
| JP | 1982246 C | 10/1995 |
| JP | 7257525 A | 10/1995 |
| JP | 7307059 A | 11/1995 |
| JP | H087994 B2 | 1/1996 |
| JP | 8030398 A | 2/1996 |
| JP | 8030407 A | 2/1996 |
| JP | 8079672 A | 3/1996 |
| JP | H08106776 A | 4/1996 |
| JP | H08110821 A | 4/1996 |
| JP | H08167231 A | 6/1996 |
| JP | H08212015 A | 8/1996 |
| JP | H08244313 A | 9/1996 |
| JP | H08263525 A | 10/1996 |
| JP | H08263909 A | 10/1996 |
| JP | 2553315 B2 | 11/1996 |
| JP | H08297957 A | 11/1996 |
| JP | 0944445 A | 2/1997 |
| JP | 09082081 A | 3/1997 |
| JP | H09064571 A | 3/1997 |
| JP | 2635127 B2 | 7/1997 |
| JP | H09306094 A | 11/1997 |
| JP | H09319466 A | 12/1997 |
| JP | 10040021 A | 2/1998 |
| JP | 10049365 A | 2/1998 |
| JP | 10064173 A | 3/1998 |
| JP | 10098521 A | 4/1998 |
| JP | 2771297 B2 | 7/1998 |
| JP | 10275137 A | 10/1998 |
| JP | 10281799 A | 10/1998 |
| JP | 10320128 A | 12/1998 |
| JP | 10340139 A | 12/1998 |
| JP | 2862679 B2 | 3/1999 |
| JP | 11134852 A | 5/1999 |
| JP | 11139839 A | 5/1999 |
| JP | 2906930 B2 | 6/1999 |
| JP | 11203201 A | 7/1999 |
| JP | 11213182 A | 8/1999 |
| JP | 11327800 A | 11/1999 |
| JP | 11353128 A | 12/1999 |
| JP | 11353129 A | 12/1999 |
| JP | 2000-056935 | 2/2000 |
| JP | 2000066845 A | 3/2000 |
| JP | 2000112831 A | 4/2000 |
| JP | 2000113563 A | 4/2000 |
| JP | 2000114759 A | 4/2000 |
| JP | 2000125290 A | 4/2000 |
| JP | 2000132704 A | 5/2000 |
| JP | 2000149431 A | 5/2000 |
| JP | 3052183 B2 | 6/2000 |
| JP | 2000228686 A | 8/2000 |
| JP | 2000236188 A | 8/2000 |

(56) References Cited

FOREIGN PATENT DOCUMENTS

| | | | |
|---|---|---|---|
| JP | 2000242598 A | 9/2000 |
| JP | 3097994 B2 | 10/2000 |
| JP | 2000278647 A | 10/2000 |
| JP | 2000305860 A | 11/2000 |
| JP | 2001005501 A | 1/2001 |
| JP | 2001023270 A | 1/2001 |
| JP | 2001100925 A | 4/2001 |
| JP | 2002042446 A | 2/2002 |
| JP | 2007087498 A | 4/2007 |
| JP | 2007188615 A | 7/2007 |
| JP | 2007220184 A | 8/2007 |
| JP | 2007293936 A | 11/2007 |
| JP | 2007305206 A | 11/2007 |
| JP | 2007305290 A | 11/2007 |
| JP | 2007328761 A | 12/2007 |
| JP | 2008503824 A | 2/2008 |
| JP | 2000235762 A | 2/2021 |
| KR | 19980035445 A | 8/1998 |
| KR | 0176527 B1 | 4/1999 |
| KR | 10-0214308 B1 | 8/1999 |
| KR | 10-0403039 B1 | 12/2003 |
| KR | 10-2004-0053235 | 6/2004 |
| KR | 10-0639436 | 10/2006 |
| KR | 10-2007-0024354 | 3/2007 |
| KR | 10-2013-0093262 | 8/2013 |
| KR | 10-2013-0111915 A | 10/2013 |
| KR | 10-1420185 | 9/2014 |
| KR | 10-2017-0095655 | 8/2017 |
| KR | 200486462 Y1 | 5/2018 |
| KR | 10-2019-0106616 A | 9/2019 |
| SG | 45223 A1 | 1/1998 |
| TW | 387574 Y | 4/2000 |
| UA | 583716 B2 | 5/1989 |
| WO | 198901682 A1 | 2/1989 |
| WO | 1997006532 A1 | 2/1997 |
| WO | 0049487 A1 | 8/2000 |
| WO | 0067253 A1 | 11/2000 |
| WO | 200104644 A1 | 1/2001 |
| WO | 0109627 A2 | 2/2001 |
| WO | 0141148 A1 | 6/2001 |
| WO | 03013783 A1 | 2/2003 |
| WO | 03021597 A1 | 3/2003 |
| WO | 03021598 A1 | 3/2003 |
| WO | 03067385 A2 | 8/2003 |
| WO | 2004006260 A1 | 1/2004 |
| WO | 2004114286 A1 | 12/2004 |
| WO | 2005024830 A1 | 3/2005 |
| WO | 2005024831 A1 | 3/2005 |
| WO | 2005083749 | 9/2005 |
| WO | 2005109131 A1 | 11/2005 |
| WO | 2006030185 A1 | 3/2006 |
| WO | 2006048611 A1 | 5/2006 |
| WO | 2006100441 A1 | 9/2006 |
| WO | 2006100445 A1 | 9/2006 |
| WO | 2007031729 A1 | 3/2007 |
| WO | 2019217057 | 11/2019 |

OTHER PUBLICATIONS

Written Opinion for International Application No. PCT/US2022/033894, dated Oct. 13, 2022, (5 pages).
International Search Report for International Patent Application No. PCT/US2021/055895, dated Feb. 4, 2022, (3 pages).
Written Opinion for International Patent Application No. PCT/US2021/055895, dated Feb. 4, 2022, (7 pages).
International Preliminary Report on Patentability for PCT/US2018/046725, 6 pages (dated Mar. 12, 2020).
Office Action dated Sep. 19, 2019 in U.S. Appl. No. 15/688,048; response thereto; and application as filed.
International Preliminary Report on Patentability for PCT/US2018/046734, 8 pages (dated Mar. 12, 2020).
International Preliminary Report on Patentability for PCT/US2018/046740, 6 pages (dated Mar. 12, 2020).
Final Office Action for U.S. Appl. No. 15/688,048 (50 pages) dated Feb. 18, 2020.
Non-Final Office Action for U.S. Appl. No. 15/688,048 (50 pages) dated Jun. 12, 2020.
Final Office Action for U.S. Appl. No. 15/688,104 (45 pages) dated Mar. 4, 2020.
Final Office Action for U.S. Appl. No. 15/688,112 (43 pages) dated Dec. 11, 2019.
Non-Final Office Action for U.S. Appl. No. 15/688,112 (66 pages) dated Mar. 5, 2020.
International Search Report for PCT/US2019/38909, 3 pages (dated Oct. 11, 2019).
Written Opinion for PCT/US2019/38909, 8 pages {dated Oct. 11, 2019).
International Preliminary Report on Patentability for PCT/US2018/046720, 8 pages (dated Mar. 12, 2020).
Office Action dated Oct. 2, 2019 in U.S. Appl. No. 15/688,073; response thereto; and application as filed.
International Search Report for PCT/US2016/046720. 3 pages (dated Dec. 11, 2018).
Written Opinion for PCT/US2016/046720 7 pages (dated Dec. 11, 2018).
Abraham et al., "Thermal Proximity Imaging of Hard-Disk Substrates", IEEE Transactions on Mathematics 36:3997-4004, Nov. 2000.
Abramovitch, "Rejecting Rotational Disturbances on Small Disk Drives Using Rotational Accelerometers", Proceedings of the 1996 IFAC World Congress in San Francisco, CA, 8 pages (Jul. 1996).
Ali et al., "Modeling and Simulation of Hard Disk Drive Final Assembly Using a HDD Template" Proceedings of the 2007 Winter Simulation Conference, IEEE pp. 1641-1650 (2007).
Anderson el al., "Clinical chemistry: concepts and applications", The McGraw-Hill Companies, Inc. DP. 131-132 2003.
Anderson et al., "High Reliability Variable Load Time Controllable Vibration Free Thermal Processing Environment", Delphion, 3 pages (Dec. 1993). https://www.delphion.com/tdbs/tdb?order=93A+63418 (retrieved Mar. 18, 2009).
Asbrand, "Engineers at One Company Share the Pride and the Profits of Successful Product Design", Professional Issues, 4 pages. 1987.
Bair et al., "Measurements of Asperity Temperatures of a Read/Write Head Slider Bearing in Hard Maanetic Recording Disks", Journal of Tribology 113:547-554, Jul. 1991.
Bakken et al., "Low Cost, Rack Mounted, Direct Access Disk Storage Device", Delphion, 2 pages (Mar. 1977). http://www.delp;hion.com/tdbs/tdb (retrieved Mar. 3, 2005).
Biber et al., "Disk Drive Drawer Thermal Management", Advances in Electronic Packaging vol. 1:43-46, 1995.
Christensen, "How Can Great firms Fail? Insights from the hard Disk Drive Industry", Harvard Business School Press, pp. 1-26, 2006.
Chung et al., "Vibration Absorber for Reduction of the In-plane Vibration in an Optical Disk Drive", IEEE Transactions on Consumer Electronics, Vo. 48, May 2004.
Curtis et al., "InPhase Professional Archive Drive Architecture", InPhase Technologies, Inc., 6 pages (Dec. 17. 2007) http://www.science.edu/TechoftheYear/Nominees/InPhase.
Exhibit 1 in *Xyratex Technology, Ltd v. Teradyne, Inc.*; Newspaper picture that displays the CSO tester; 1990.
Exhibit 1314 in *Xyratex Technology, Ltd. V. Teradyne, Inc.*; Case, "Last products of Disk-File Development at Hursley and Millbrook," IBM, Oct. 12, 1990.
Exhibit 1315 in *Xyratex Technology, Ltd. V. Teradyne, Inc.*; Case, "History of Disk-File Development at Hursley and Millbrook," IBM, Oct. 17, 1990.
Exhibit 1326 in *Xyratex Technology, Ltd v. Teradyne, Inc.*; Image of the back of Exhibit 1 and Exhibit 2 photos, which display the photos dates; 1990.
Exhibit 2 in *Xyratex Technology, Ltd v. Teradyne, Inc.*; Photos of the CSO tester obtained from Hitachi; 1990.

(56) References Cited

OTHER PUBLICATIONS

Findeis et al., "Vibration Isolation Techniques Suitable for Portable Electronic Speckle Pattern Interferometry", Proc. SPIE vol. 4704, pp. 159-167, 2002; http://www.not.uct.ac.za/Paoers/soiendt2002.pdf.
FlexStar Technology, "A World of Storage Testing Solutions," http://www.flexstar.com, 1 page (1999).
FlexStar Technology, "Environment Chamber Products, " http://www.flexstar.com, 1 page (1999).
FlexStar Technology. "FlexStar's Family of Products, " http://www.flexstar.com, 1 page (1999).
FlexStar Technology, 30E/Cascade Users Manual, Doc #98-36387-00 Rev. 1.8, pp. 1-33, Jun. 1, 2004.
Frankovich, "The Basics of Vibration Isolation Using Elastomeric Materials", Aearo EAR Specially Composites, 8 pages (2005) http://www.isoloss.com/11dfs/engineering/Basicsofvibrationisolation.
Grochowski et al., "Future Trends in Hard Disk Drives", IEEE Transactions on Magnetics, 32(3): 1850-1854 (May 1996).
Gurumurthi et al., "Disk Drive Roadmap from the Thermal Perspective: A Case for Dynamic Thermal Management", International Symposium on Computer Architecture Proceedings of the 32nd Annual International Symposium on Computer Architecture, Technical Report CSE-05-001, pp. 38-49 (Feb. 2005).
Gurumurthi et al., "Thermal Issues in Disk Drive Desian: Challenges and Possible Solutions", ACM Transactions on Storage, 2(1): 41-73 (Feb. 2006).
Gurumurthi, "The Need for temperature-Aware Storage Systems", The Tenth Intersociety conference on Thermal and Thermomechanical Phenomena in Electronics, pp. 387-394, 2006.
Haddad et al., "A new Mounting Adapter for Computer Peripherals with Improved Reliability, Thermal Distribution, Low Noise and Vibration Reduction", ISPS, Advances in Information Storage and Processing Systems. 1:97-108, 1995.
HighBeam Research website "ACT debuts six-zone catalytic gas heater. (American Catalytic Technologies offers new heaters)", 4 pages (Oct. 26, 1998). http://www.highbeam.com.
HighBeam Research website "Asynchronous Testing Increases Throughout", 7 pages (Dec. 1, 2000). http://www.highbeam.com.
High Beam Research website "Credence announces Production Release of the EPRO AQ Series for Integrated Test and Back-end Processing", 4 pages (1995). http://www.highbeam.com.
HighBeam Research website "Test Multiple Parts at Once for Air Leaks. (Brief Article)", 1 page (1999) http://www.highbeam.com.
Iwamiya, "Hard Drive Cooling Using a Thermoelectric Cooler", EEP—vol. 19-2, Advances in Electronic Packaging, vol. 2:220 3-2208, ASME 1997.
Johnson et al., "Performance Measurements of Tertiary Storage Devices", Proceedings of the 24th VLDB Conference. New York. pp. 50-61 1998.
Ku, "Investigation of Hydrodynamic Bearing Friction in Data Storage information System Spindle Motors", ISPS vol. 1, Advances in Information Storage and Processing Systems, pp. 159-165, ASME 1995.
Lindner, "Disk drive mounting", IBM Technical Disclosure Brochure, vol. 16, No. 3, pp. 903-904 Aug. 1973.
Low, Y.L. et al., "Thermal network model for temperature prediction in hard disk drive", Microsyst Technol, 15: 1653-1656 (2009).
McAuley, "Recursive Time Trapping for Synchronization of Product and CHAMBER Profiles for Stress Test", Delphion, 3 pages (Jun. 1988), https://www.delphion.com/tdbs/tdb, (retrieved Mar. 18, 2009).
Morgenstem, Micropolis Drives Target High-end Apps; Technology Provides Higher Uninterrupted Data Transfer. (Applications; Microdisk AV LS 3020 and 1050AV and 1760AV LT Stackable Hard Drive Systems) (Product Announcement) MacWeek, vol. 8, No. 6, p. 8; Feb. 7, 1994.
Morris, "Zero Cost Power and Cooling Monitor System", 3 pages (Jun. 1994) https://www.delphion.com/tdbs/tdb (retrieved Jan. 15, 2008).
Nagarajan, "Survey of Cleaning and cleanliness Measurement in Disk Drive Manufacture", North Carolina Department of Environment and Natural Resources, 13-21 (Feb. 1997).
Park, "Vibration and Noise Reduction of an Optical Disk Drive by Using a Vibration Absorber Methods and Apparatus for Securing Disk Drives in a Disk", IEEE Transactions on Consumer Electronics. vol. 48. Nov. 2002.
Prater et al., "Thermal and Heat-Flow Aspects of Actuators for Hard Disk Drives", InterSociety Conference on Thermal Phenomena, pp. 261-268 1994.
Ruwart et al., "Performance Impact of External Vibration on Consumer-grade and enterprise-class Disk Drives", Proceedings of the 22nd IEEE/13th Goddard Conference on Mass Storage Systems and Technologies 2005.
Schroeder et al., "Disk Failures in the Real World: What does an MTTP of 1,000,000 hours mean to you?", In FAST'07: 5th USENIX Conference on File and Storage Technologies, San Jose, CA, Feb. 14-16, 2007.
Schulze et al., "How Reliable is a Raid?," COMPCON Spring apos; 89, Thirty-Fourth IEEE Computer Society International Conference: Intellectual Leverage, Digest of papers; pp. 118-123. Feb. 27-Mar. 3, 1989.
Seagate Product Marketing, "Seagate's Advanced Multidrive System (SAMS) Rotational Vibration Feature", Publication TP-229D, Feb. 2000.
Suwa et al., "Evaluation System for Residual Vibration from HDD Mounting Mechanism" IEEE Transactions on Magnetics, vol. 35. No. 2, pp. 868-873. Mar. 1999.
Suwa et al., "Rotational Vibration Suppressor" IBM Technical Disclosure Bulletin Oct. 1991.
Terwiesch et al., "An Exploratory Study of International Product Transfer and Production Ramp-Up in the Data Storage Industry", The Information Storage Industry Center, University of California, pp. 1-31, 1999. ww w-iros.ucsd.edu/sloan/.
Tzeng, "Dynamic Torque Characteristics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Kyratex Product Test brochure, "Automated Production Test Solutions", 2006.
*Kyratex Technology, Ltd. V. Teradyne, Inc.*, Amended Joint Trial Exhibit List of Xyralex and Teradyne. Case No. CV 08-04545 SJO (PLAx). Nov. 12, 2009.
*Kyratex Technology, Ltd. V. Teradyne, Inc.*, Teradyne, Inc's Prior Art Notice Pursuant to 35; U.S.C. Section 282. Case No. CV 08-04545 SJO (PLAx), Oct. 16, 2009.
Kyratex to Debut its New Automated Test Solution for 2.5-inch Disk Drives at Diskcon USA 2004, PR Newswire Europe (2004).
Kyratex, "Continuous Innovation—Production Test Systems" www.xyratex.com/Products/production-test-system (1995-2008).
Kyratex, "Key Advantages—Production Test Systems" www.xyratex.com/Products/production-test-system (1995-2008).
Kyratex, "Process Challenges in the Hard Drive Industry" slide presentation, Asian Diskcon (2006).
Kyratex, "Production Test Systems" www.xyratex.com/Products/production-test-system (1995-2008).
Kyratex, "Single cell—Production Test Systems" www.xyratex.com/Products/production-test system (1995-2008).
Kyratex, "Storage Infrastructure" www.xyratex.com/Products/storage-infrastructure/default.aspx (1995-2008).
Kyratex, "Testing Drives Colder—Production Test Systems" www.xyratex.com/Products/production-test-system (1995-2008).
International Preliminary Report on Patentability in Application No. PCT/US2022/033894 dated Dec. 14, 2023, 7 pages.
Boigenzahn et al., "Rotational Vibration Suppressor," IBM Technical Disclosure Bulletin (Oct. 1991), 2 pages.

(56) References Cited

OTHER PUBLICATIONS

Henderson, "HAD High Aerial Densities Require Solid Test Fixtures," Flexstar Technology, (Feb. 26, 2007), 3 pages.

\* cited by examiner

- 200mm x 250mm test board sizes
- 35 total test sites

TEST SOCKET HAVING AN AUTOMATED LID

TECHNICAL FIELD

This specification relates generally to automated test systems and test sockets therefor having automated lids.

BACKGROUND

System-level testing (SLT) involves testing an entire device, rather than individual components of the device. If the device passes a battery of system-level tests, it is assumed that the individual components of the device are operating properly. SLT has become more prevalent as the complexity of, and number of components in, devices have increased. For example, a chip-implemented system, such as an application-specific integrated circuit (ASIC), may be tested on a system level in order to determine that components that comprise the system are functioning correctly.

SUMMARY

An example test socket for a test system includes a receptacle to make electrical and mechanical connections to a device under test (DUT) and a lid to cover the DUT in the receptacle. The lid is controllable to open automatically to enable receipt of the DUT in the receptacle and, following receipt of the DUT, to close automatically to cover the DUT in the receptacle. Closing the lid applies force to the DUT to complete the electrical and mechanical connections between the test socket and the DUT. The example test system may include one or more of the following features, either alone or in combination.

The test socket may include an actuator to control opening and closing of the lid. The actuator may be configured to move the lid perpendicularly to the receptacle and to pivot the lid relative to the receptacle. The test socket may include a gear connected to the actuator. The gear being may be to move the lid perpendicularly to the receptacle. The actuator may include a motor. A torque of the motor may provide a clamping force to the DUT to complete the electrical and mechanical connections between the test socket and the DUT. The actuator may include a helical worm drive screw that causes motion of the lid and that is configured to provide a clamping force to the DUT to complete the electrical and mechanical connections between the test socket and the DUT. The actuator may include one of a hydraulic actuator or a pneumatic actuator.

The test socket may include a plate having a track having a first branch that extends perpendicularly to the receptacle and a second branch that extends obliquely relative to the receptacle. The lid may include a roller. The actuator may be for moving the roller along the first branch to move the lid perpendicularly to the receptacle and for moving the roller along the second branch to pivot the lid relative to the receptacle.

The test socket may include a thermal control system to control a temperature of the DUT in the test socket separately from control over temperatures of other DUTs in other test sockets. The thermal control system may include a thermoelectric cooler (TEC) and a structure connected to the lid that is thermally conductive. The TEC may be in thermal communication with the DUT to control the temperature of the DUT by transferring heat between the DUT and the structure. The thermal control system may include liquid coolant to flow through the structure to reduce a temperature of the structure. The liquid coolant may include liquid nitrogen. The thermal control system may include a heater.

The test socket may include a first plate on a first side of the lid, where the first plate includes first tracks; a second plate on a second side of the lid, where the second plate includes second tracks. first rollers on a first side of the lid, and second rollers on a second side of the lid. During opening and closing of the lid, the first rollers move along the first tracks and the second rollers move along the second tracks. At least one of the first tracks and at least one of the second tracks may include a right-angled track. The first plate may be a single plate and the second may be is a single plate.

The test socket may include a hinge to which the lid is connected. The hinge may include a spring that enables compression of the lid to apply force to the DUT to complete the electrical and mechanical connections between the test socket and the DUT.

The test socket may include a first set of plates on a first side of the lid, where the first set of plates includes first tracks; a second set of plates on a second side of the lid, where the second set of plates include second tracks, first rollers on a first side of the lid, and second rollers on a second side of the lid. During opening and closing of the lid, the first rollers move along the first tracks and the second rollers move along the second tracks. The first set of plates may include a first mobile plate and a first stationary plate, and the second set of plates may include a second mobile plate and a second stationary plate. The first mobile plate may be controllable to move relative to the first stationary plate and the second mobile plate may be controllable to move relative to the second stationary plate to cause the lid to open or to close.

The first mobile plate may include a first track and a second track. The first stationary plate may include a third track and a fourth track. The first track may intersect the third track at a location of one of the first rollers and the second track may intersect the fourth track a location of one of the first rollers. The second mobile plate may include a fifth track and a sixth track. The second stationary plate may include a seventh track and an eighth track. The fifth track may intersect the seventh track at a location of one of the second rollers and the sixth track may intersect the eighth track a location of one of the second rollers. Each of the first tracks and the second tracks may include one or more bends.

An example test system includes a test socket for a test system. The test socket includes a receptacle to make electrical and mechanical connections to a device under test (DUT) and a lid to cover the DUT in the receptacle. The lid is controllable to open automatically to enable receipt of the DUT in the receptacle and, following receipt of the DUT, to close automatically to cover the DUT in the receptacle. Closing the lid applies force to the DUT to complete the electrical and mechanical connections between the test socket and the DUT. The test system includes a pick-and-place robot to move the DUT relative to the test socket. The test system includes one or more processing devices to coordinate operation of the pick-and-place robot and to control opening and closing the lid so that the lid is pivoted when the pick-and-place robot reaches the test socket. The test system may include one or more of the following features, either alone or in combination.

The one or more processing devices may be configured to coordinate opening the lid with movement of the pick-and-place robot. The test system may include a gantry on which the pick-and-place robot is mounted. The gantry may be configured to move the pick-and-place robot relative to the test socket to position the pick-and-place robot for picking the DUT from the test socket or placing the DUT into the test sockets. The test socket may be arranged in at least one array of test sockets so that the test socket is accessible to the pick-and-place robot.

An example test system includes packs, each of which includes test sockets for testing DUTs and at least some test electronics for performing tests on the DUTs in the test sockets. Different packs are configured to have different configurations. The different configurations include at least different numbers of test sockets arranged at different pitches. A test socket among the test sockets includes a receptacle to make electrical and mechanical connections a DUT and a lid to cover the DUT in the receptacle. The lid may be controllable to open automatically to enable receipt of the DUT in the receptacle and, following receipt of the DUT, to close automatically to cover the DUT in the receptacle. Closing the lid applies force to the DUT to make the electrical and mechanical connections between the test socket and the DUT. The test system may include one or more of the following features, either alone or in combination.

The test socket may include an actuator to control opening and closing of the lid. The actuator may be configured to move the lid perpendicularly to the receptacle and to pivot the lid relative to the receptacle. The actuator may be configured to move the lid perpendicularly to the receptacle and to pivot the lid relative to the receptacle. The test socket may include a plate having a track having a first branch extends perpendicularly to the receptacle and a second branch that extends obliquely relative to the receptacle. The lid may include a roller. The actuator may be for moving the roller along the first branch to move the lid perpendicularly to the receptacle and for moving the roller along the second branch to pivot the lid relative to the receptacle.

The test socket may include a first plate on a first side of the lid, where the first plate includes first tracks, a second plate on a second side of the lid, where the second plate includes second tracks, first rollers on a first side of the lid, and second rollers on a second side of the lid. During opening and closing of the lid, the first rollers move along the first tracks and the second rollers move along the second tracks.

Any two or more of the features described in this specification, including in this summary section, can be combined to form implementations not specifically described herein.

The systems, techniques, and processes described herein, or portions thereof, can be implemented as and/or controlled by a computer program product that includes instructions that are stored on one or more non-transitory machine-readable storage media, and that are executable on one or more processing devices to control (e.g., coordinate) the operations described herein. The systems, techniques, and processes described herein, or portions thereof, can be implemented as an apparatus, method, or electronic system that can include one or more processing devices and memory to store executable instructions to implement various operations. The systems, techniques, processes, and/or components described herein may be configured, for example, through design, construction, arrangement, placement, programming, operation, activation, deactivation, and/or control.

The details of one or more implementations are set forth in the accompanying drawings and the description below. Other features, objects, and advantages will be apparent from the description and drawings, and from the claims.

DETAILED DESCRIPTION

Figure 1:
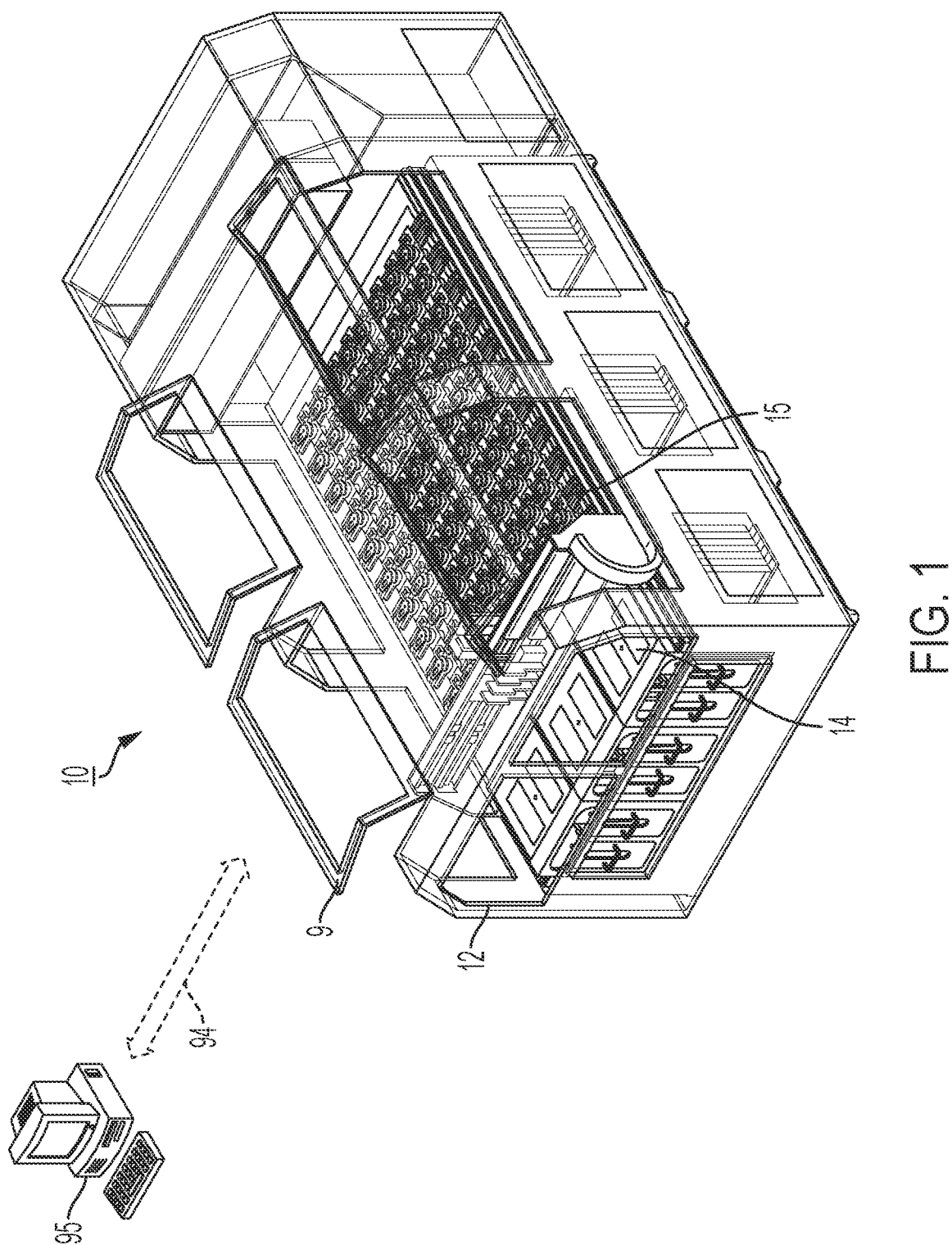
FIG. 1 is a perspective view of an example test system.

Described herein are example implementations of a test socket and components associated therewith that are usable in a test system, such as an SLT test system. In some implementations, the test system includes an automated gantry and pick-and-place automation to transport a device under test (DUTs) to and from the test socket. The test socket includes a lid assembly (or simply "lid") and associated structure that is controllable to open prior to arrival of the automated gantry and pick-and-place automation at the test socket. For example, before or during movement to the test socket, the lid of the test socket is controlled to open so that when the automated gantry and pick-and-place automation arrives at the test socket, the pick-and-place automation can retrieve a tested DUT from the test socket and/or place an untested DUT into the test socket. In a case where an untested DUT is placed in the test socket, the lid is controllable to close while the automated gantry and pick-and-place automation move away from the test socket. In some examples, the pick-and-place automation plays no role in opening or closing the lid. That is done while the automated gantry and pick-and-place automation are performing other tasks, such as those described below. As a result, testing throughput can be increased. That is, because the lid is open by the time the automated gantry and pick-and-place automation arrive, the automated gantry and pick-and-place automation do not need to take time to open the lid or otherwise make the test socket accessible. Rather, the pick-and-place automation, upon arrival at the test socket, may immediately remove a tested DUT or place an untested DUT.

In some implementations, the test system is an SLT system; however, the components and features described herein may be implemented in any appropriate testing context. As noted, SLT involves testing an entire device, rather than individual components of the device. If the device passes a battery of system-level tests, it is assumed that the individual components of the device are operating properly. An overview of an example test system is provided followed by more in-depth descriptions of the various components of the test socket introduced in this overview.

The example test system includes multiple subsystems. In this regard, the test system includes a frame that holds an automated gantry and primary pick-and-place automation. A tray feeder contains automation to move trays that hold devices to be tested and/or devices that have been tested into and out of the system. Packs that are movable into and out of the frame contain test electronics for testing devices held in test sockets. The packs may be movable into and out of the system during device testing. An example pack includes electrical test support infrastructure and at least one liquid-to-air heat exchanger. In some implementations, the liquid-to-air heat exchanger may be omitted from, or external to, the pack. An example pack contains one or more rows of test sockets, which are part of test sites in the test system and which hold DUTs. The test sites may each contain an end-user's test site board. The end-user's test site board contains the test socket that holds the DUT in some implementations. Each row in a pack can contain N customer test sites, where N is an integer between one and however many sites can fit in a row based on system size. Each test site may include an actuator to hold the DUT in the test socket. The actuator can be replaced as needed and to accommodate a device's force requirements.

The example test system also includes a service module that houses system infrastructure and electronics used for liquid cooling, power, and test computations and other processing. A housing, also referred to as a "skin" or "outer shell", encloses at least part of the system and holds cool air generated by the system and circulated down across the test sites and test electronics boards. Additionally, ionized air may be circulated over the test sites before, during, and/or after testing to mitigate electrostatic charge buildup and to reduce or to prevent electrostatic discharge (ESD) events.

The layout of the example test system may be considered advantageous. For example, the test electronics, customer site electronics, and device automation can be configured in a stack. As a result, the test system can be extended to whatever length is required for a testing application, which may enable an efficient usage of the automation. Furthermore, the test system may include a single layer of pick-and-place automation to place DUTs in test sockets and to remove the DUTs from the test sockets. This single layer of pick-and-place automation may reduce the need for multiple automation exchanges found in other test systems, which may improve the test system's reliability. The site-row-pack model also may enhance system configurability and modularity and may reduce the cost of test and serviceability.

Figure 2:
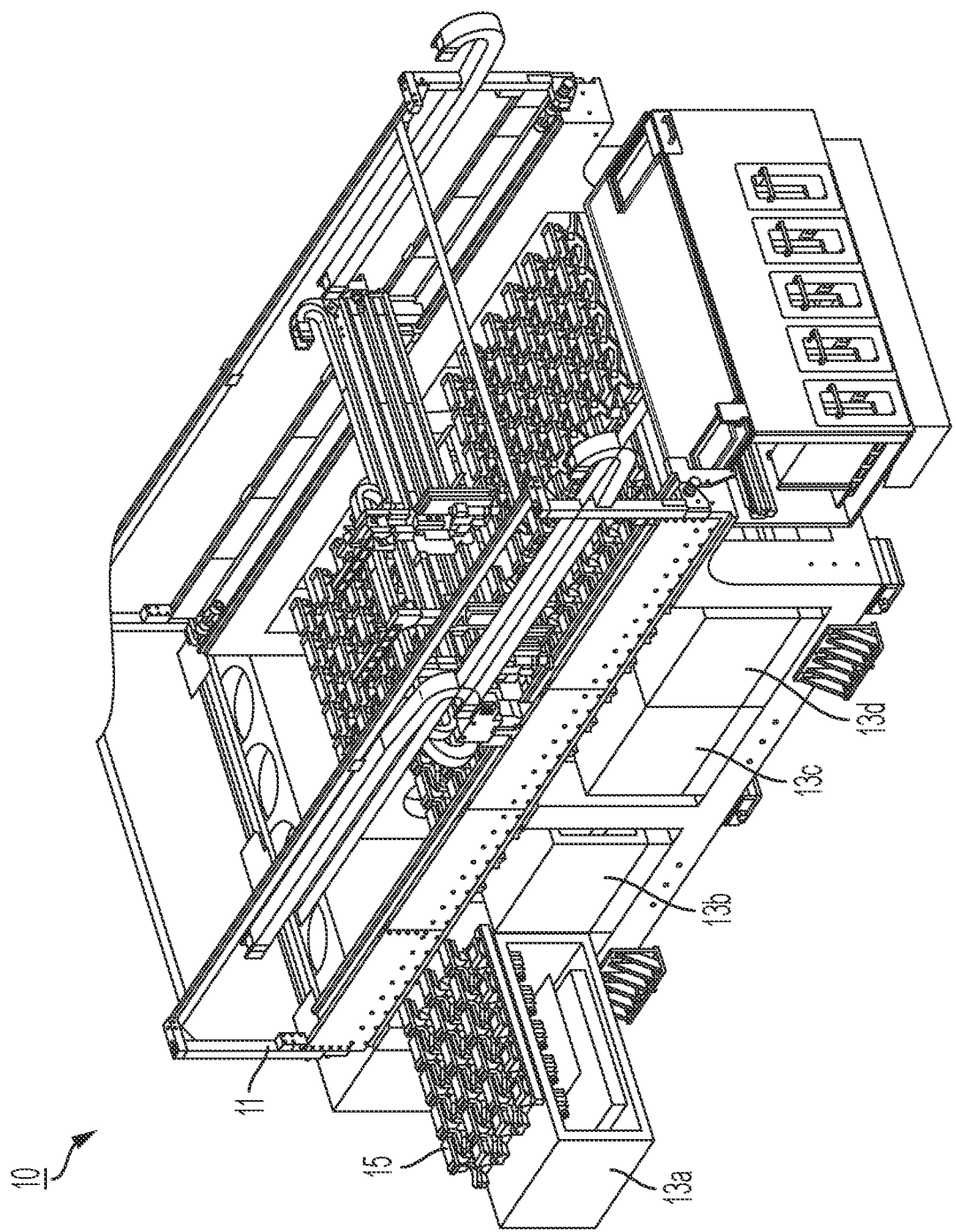
FIG. 2 is a perspective view of the example test system absent its housing to show internal components of the test system.

FIG. 1 shows an example implementation of a test system 10 of the type described in the preceding paragraphs. In FIG. 1, four doors including door 9 are opened to expose the array of test sites in the test system. FIG. 2 shows parts of test system 10 absent its housing or "skin". As noted, example test system 10 is modular, which may enable the test system to accommodate various testing applications. As shown in FIGS. 1 and 2, test system 10 includes a frame 11 and housing 12 that, in this example, hold eight packs, including packs 13a, 13b, 13c, and 13d. As described in more detail below, each pack may be customized for testing a different type of DUT. The packs may each include multiple test sites for testing DUTs. Each test site may include a test socket for holding a DUT, an actuator and lid assembly, and one or more sensors. Example implementations of these features are described below.

Different packs may include test sockets that are sized to hold DUTs having different characteristics, such as different sizes, interfaces, or form factors. For example, the test sockets in one pack 13a may be configured to hold DUTs that have a 10 millimeter (mm) dimension (for example, length, width, or diagonal) and test sockets in another pack 13b may be configured to hold DUTs having a 6 mm dimension. The test sockets may be organized in one or more rows, each containing one or more test sockets. In rows that contain more than one test socket, the test sockets may be arranged at different pitches. A pitch may include the distance between the centers of two adjacent test sockets. For example, the pitch may be the distance between the centers of two adjacent test sockets. The packs may also include test electronics configured to test DUTs held in the test sockets. The test electronics may be customized to test features that are unique to a DUT. The test electronics may include, but are not limited to, pin electronics, parametric measurement units, programmable logic, and/or a microcontroller or other processing device(s). The test electronics may execute, or be used to implement, one or more test routines on each DUT in a test socket.

Test system 10 includes trays 14. In some implementations, each tray includes cells for holding devices to be tested or cells for holding devices that have been tested. The cells may be sized and shaped to hold devices having different sizes, shapes, or form factors. For example, one tray may be configured to hold devices that have a 10 mm dimension and another tray may be configured to hold devices having a 6 mm dimension. In some implementations, there may be two or more trays for each different type of device being tested—for example, one tray containing devices to be tested and one tray containing devices that have been tested, or one tray containing devices to be tested, one tray containing devices that have passed testing, and one tray containing devices that have failed testing. In the example of FIG. 1, there are six trays; however, any appropriate number of trays may be included in the test system. As shown in the figure, the trays may be arranged in a plane that is parallel to, or a co-planar with, a plane in which at some or all of the test sockets 15 are arranged.

Figure 3:
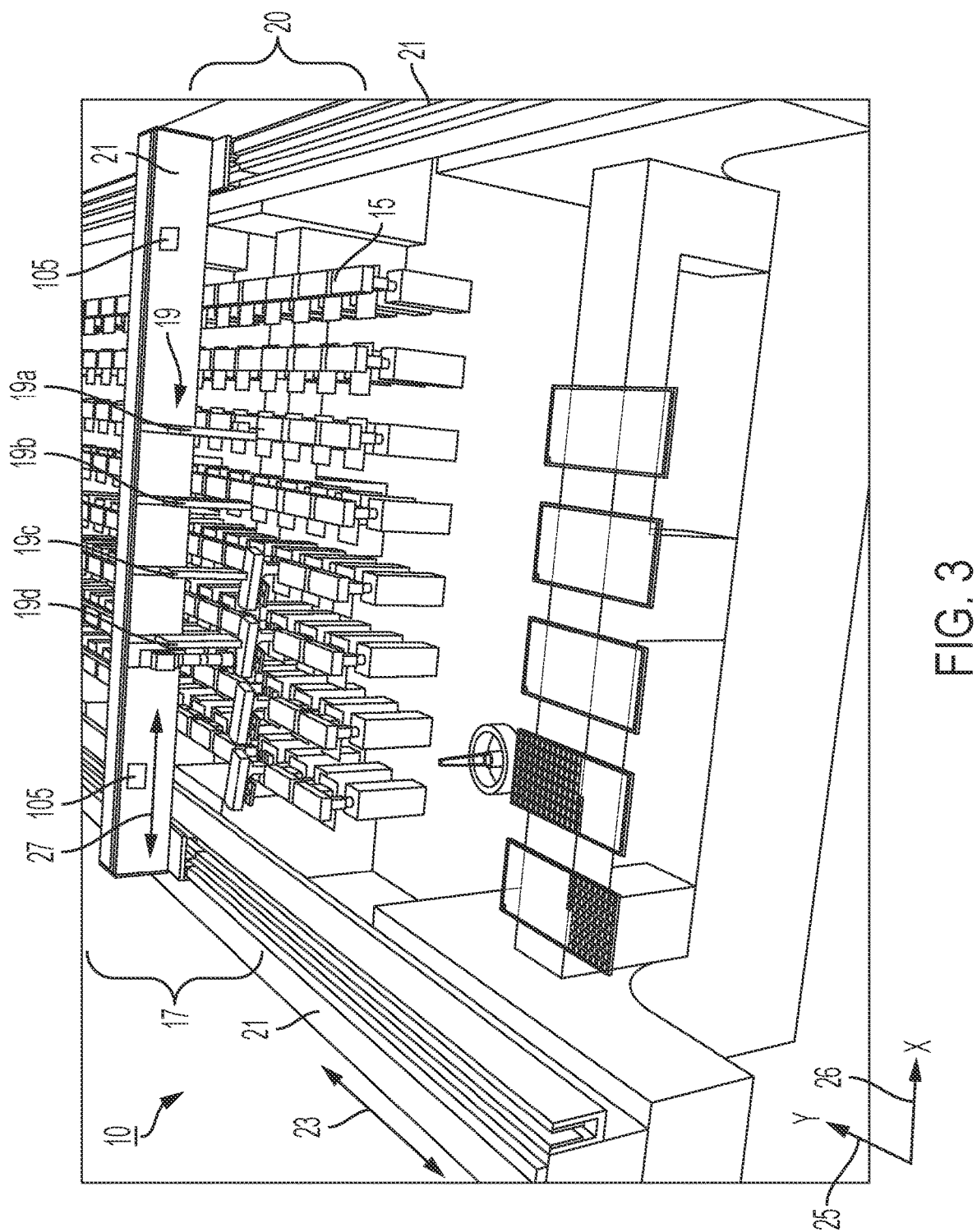
FIG. 3 is a perspective view of parts of pick-and-place automation that may be part of an example test system like that of FIG. 1.

Test system 10 includes pick-and-place automation, which is also referred to as "pick-and-place robotics". As shown in FIG. 3, pick-and-place robotics 17 may include linear actuators 19, also called "actuators" or "pickers". Multiple pickers may be configured to service multiple test sockets independently and/or simultaneously or contemporaneously, where servicing includes at least one of placing DUTs into the multiple test sockets or picking DUTs from the multiple test sockets. Servicing may also include simultaneously picking or placing DUTs into one or more of the trays, as described in more detail below. In the example of FIG. 3, there are four pickers; however, any appropriate number of pickers may be used. That number may be configurable; for example, one or more pickers may be added to or removed from test 10 system to accommodate different testing application requirements. In this example, a picker 19a includes an arm that extends and retracts relative to the test slots. The arm includes a head or nozzle that holds a DUT during movement between cells in the trays and test sockets in the packs. In some examples, a device is picked-up and held on the nozzle during movement using pneumatics, for example a vacuum pressure. In some examples, the device is released by releasing the vacuum pressure and/or by mechanical mechanisms, as described herein.

Pickers are mounted on a robotic gantry ("gantry") 20 that includes a movable gantry beam 21 that spans across an array of test sockets 15, rails 21 over which the gantry beam moves, and one or more motors (not shown) to control such movement. Gantry beam 21 is configured to move over the test sockets in the directions of arrow 23 (the Y-dimension 25), which are arranged in rows that are perpendicular to the gantry beam. Pickers 19a to 19d are arranged linearly along gantry beam 21 so that the test sockets are accessible to the pickers during system operation. The pickers are also configured to move linearly along the gantry beam to move to different locations and to change a pitch of the pickers along the gantry beam to service different types of DUTs. Accordingly, in this example, pickers 19a to 19d are configured to move in the Cartesian X dimension 26 (arrow 27) and gantry beam 21 is configured to move in the Cartesian Y dimension 25 (arrow 23). Pickers 19a to 19d thus move in a single plane that is substantially parallel to a plane or planes containing test sites 15. Pickers 19a to 19d mounted to gantry beam 21 move along with the gantry beam and are sized and operated so that, with their arms extended or retracted, the pickers clear—that is, do not touch—test sockets that are empty or full. In other words, automation 17 is configured to move anywhere within a defined work area and to pass over all sockets, regardless of the state of the socket (open or closed). This includes clearance for the pickers when they are fully retracted. Linear magnetic motors ("linear motors"), which are not shown in FIG. 3, may control movement of both the gantry beam and the pickers.

In some implementations, the pickers perform picking or placing into different packs. For example, two packs on opposite sides of the system, such as packs 81b and 81d of FIG. 31, can have their rows of test sockets aligned in such a way that the pickers can pick and place some DUTs in one pack and others in the other pack simultaneously. Given the two packs facing each other on opposite sides' scenario, the "row" accessible by the pick-and-place robotics becomes the sum of the two rows from these two packs. In an example of six sites per row in one pack, the system-level row has 12 sites. The "Y-axis jog" capability described below may be particularly useful partly because the rows on two opposing packs facing each other may not be perfectly aligned due to various tolerances. The Y-axis job capability—which allows for independent Y-axis movement of the pickers relative to the gantry beam—allows the test system to accommodate for a misalignment of the rows, thereby enabling the system to continue to perform simultaneous pick and place operations.

FIGS. 4 to 28 show a sequence of operations performed by an example test system 30 of the type described with respect to FIGS. 1 to 3 in the preceding paragraphs. The operational positions depicted are random but sequential and are intended to illustrate test system operation. The particular operations depicted are not intended to imply any required operations or sequence of operations.

Figure 4:
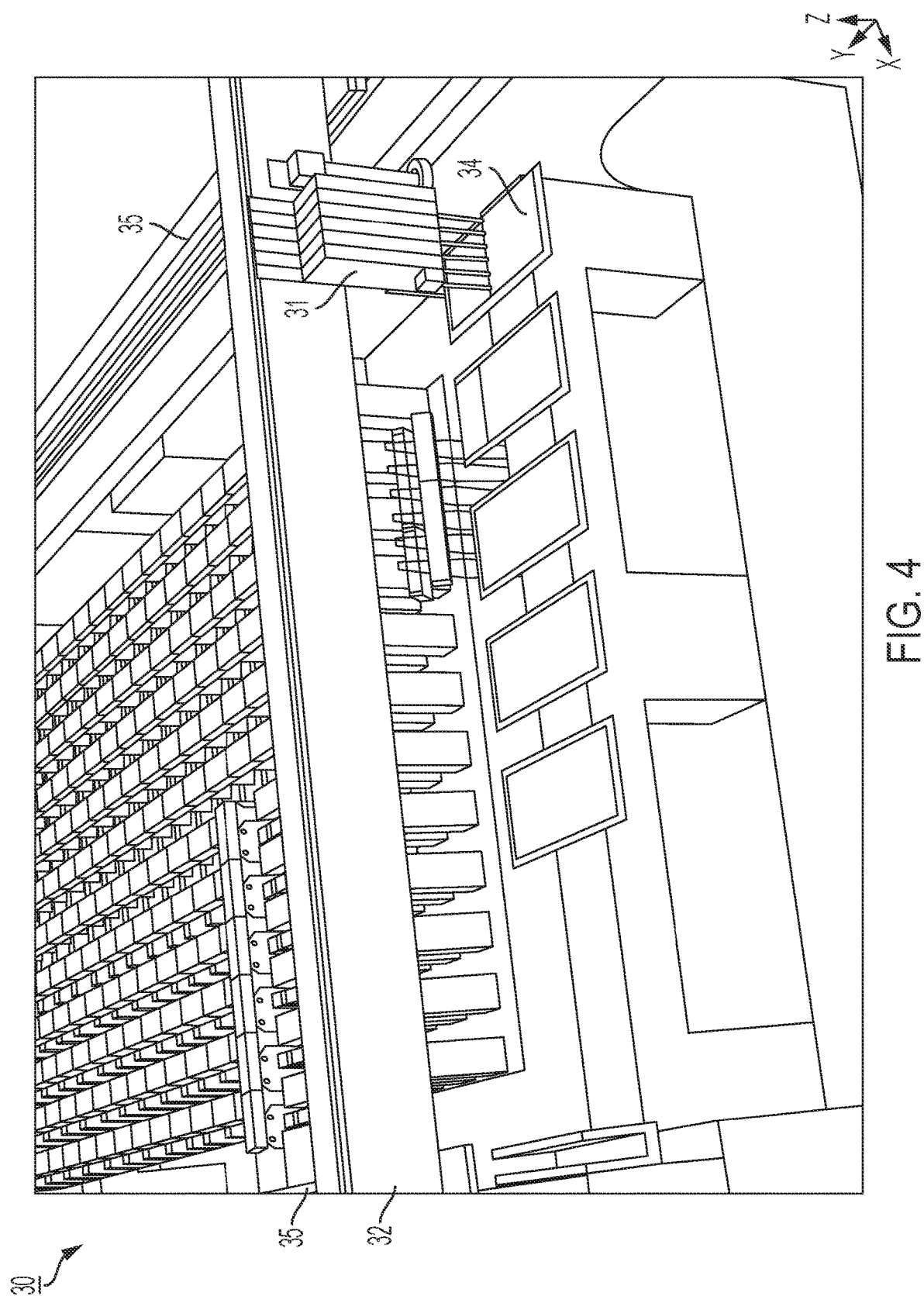
FIGS. 4 through 28 are perspective views of parts of pick-and-place automation that may be part of an example test system like that of FIG. 1, which are shown at various points in time during an operational sequence.

In FIG. 4, pickers 31 are moved by gantry beam 32 into position over tray 34 containing devices to be tested ("DUTs"). More specifically, in this example, pickers 31 are controlled to move linearly along gantry beam 32 and the gantry beam is controlled to move linearly along tracks 35 to position pickers 31 at tray 24. One or more linear motors (not shown), which are controlled by a control system described below, may be operated to position the gantry beam and the pickers.

Figure 5:
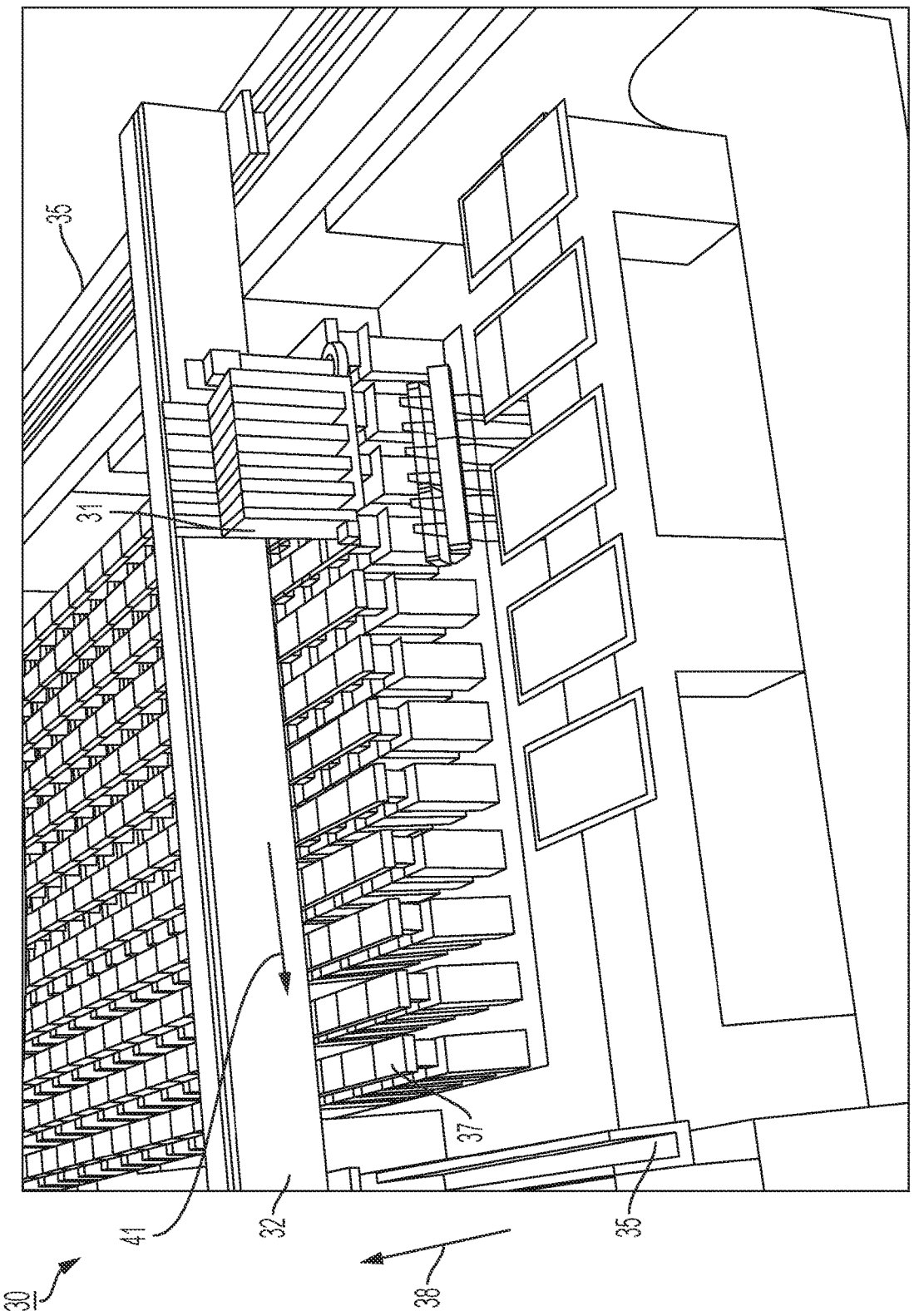
Figure 6:

In this example, there are six pickers 31. The six pickers 31 may pick-up or remove six devices or fewer than six devices from tray 34 concurrently or in parallel. In some examples, each picker picks-up a single device; however, not every picker need pick-up a device. As shown in FIGS. 5 and 6, six picked-up devices are transported across one or more arrays of test sockets 37 in the direction of arrow 38 to target test sockets 40 in which the device are to be placed. As shown in FIGS. 5 to 6, the pitch of the pickers 31 along gantry beam 32 is controlled to change to match the pitch of the target test sockets 40. This change may be fluid in that pickers 32 may be controlled to move linearly along gantry beam 32 in the directions of arrow 41 while—for example, at the same time as—gantry beam 38 is controlled to move along tracks 35.

As described in more detail below, each test socket includes a lid configured—for example, constructed, controlled and/or arranged—to fit over the test socket when a device (a DUT) is placed in the test socket. In example implementations, before a picker arrives at the test socket, the lid for that test socket automatically pivots, rotates, or in any appropriate way moves away from a test socket to expose the test socket and/or a device in the test socket and thereby allow a picker to place a device into the test socket or to remove a device from the test socket. After a device has been placed in the test socket, the lid is controlled to automatically move over and cover the test socket and to apply a force to the device in the test socket that creates, maintains, or both creates and maintains electrical and mechanical connection between the device and the test socket. As explained previously and with respect to FIGS. 38 to 66 below, before or during movement to the test socket, the lid of the test socket is controlled to open automatically so that when the automated gantry and pick-and-place automation arrives at the test socket, the pick-and-place automation can retrieve a tested DUT from the test socket and/or place an untested DUT into the test socket. In a case where an untested DUT is placed in the test socket, the lid is controllable to close automatically while the automated gantry and pick-and-place automation move away from the test socket. A control system, which may include one or more processing devices on each pack, coordinates or synchronizes automated opening and closing of the lids with movement of the automated gantry and pick-and-place automation so that the lids open and close at appropriate times. In some implementations, the control systems may control individual actuators associated with each test socket to open and/or to close the test socket lids at times based on location and/or movement of the gantry and pick-and-place automation.

In the example shown in FIG. 6, the lids of test socket 40 are open—for example, pivoted, rotated, or in any way moved (operations collectively referred to as "moved") to expose each test socket—to allow pickers 31 to place the devices they are holding into respective test sockets 40. As explained, the lids of the test sockets may be controlled to open during gantry movement towards the test sockets and may be controlled to close during gantry movement away from the test sockets.

Figure 7:
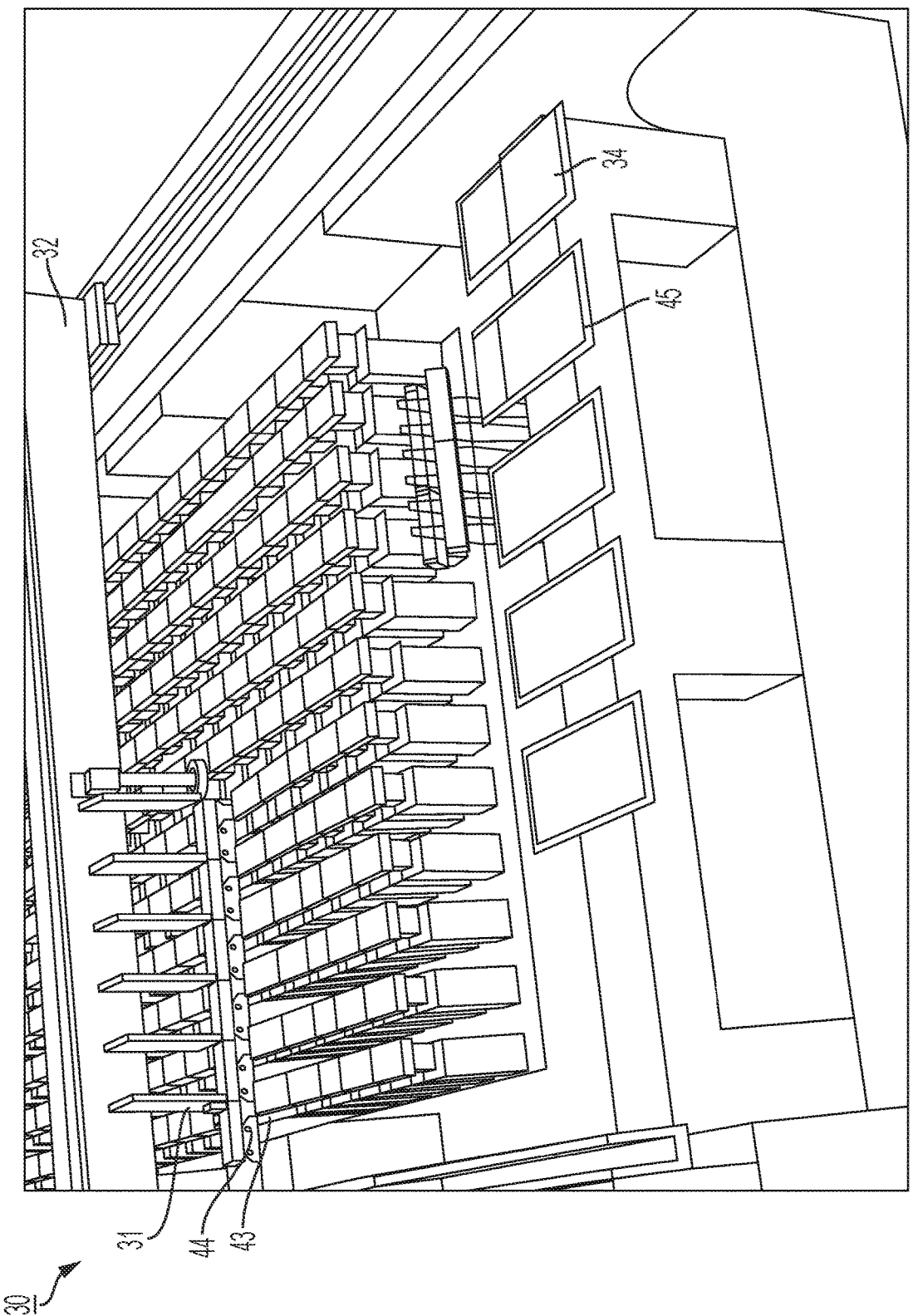
Figure 8:
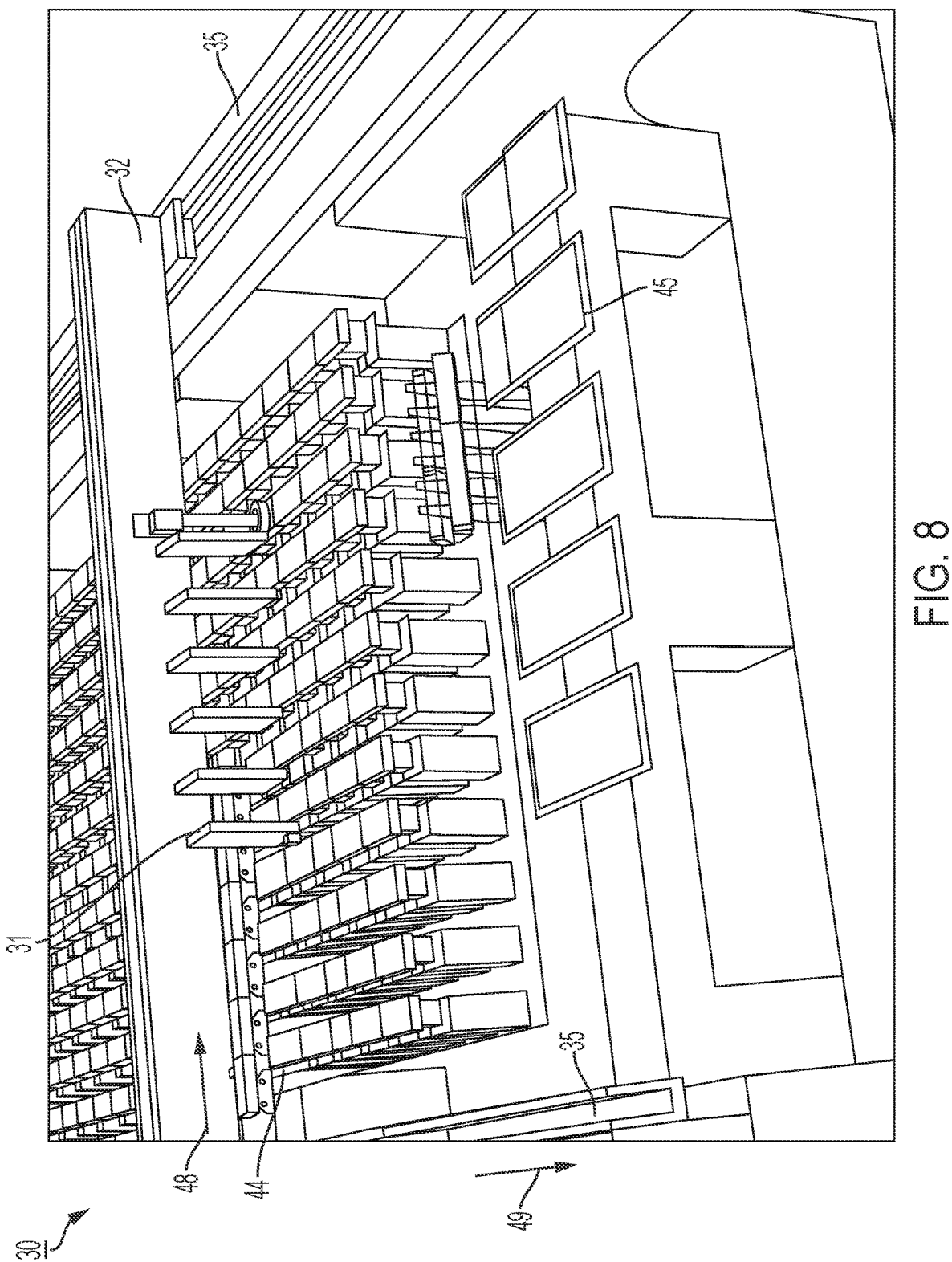
Figure 9:
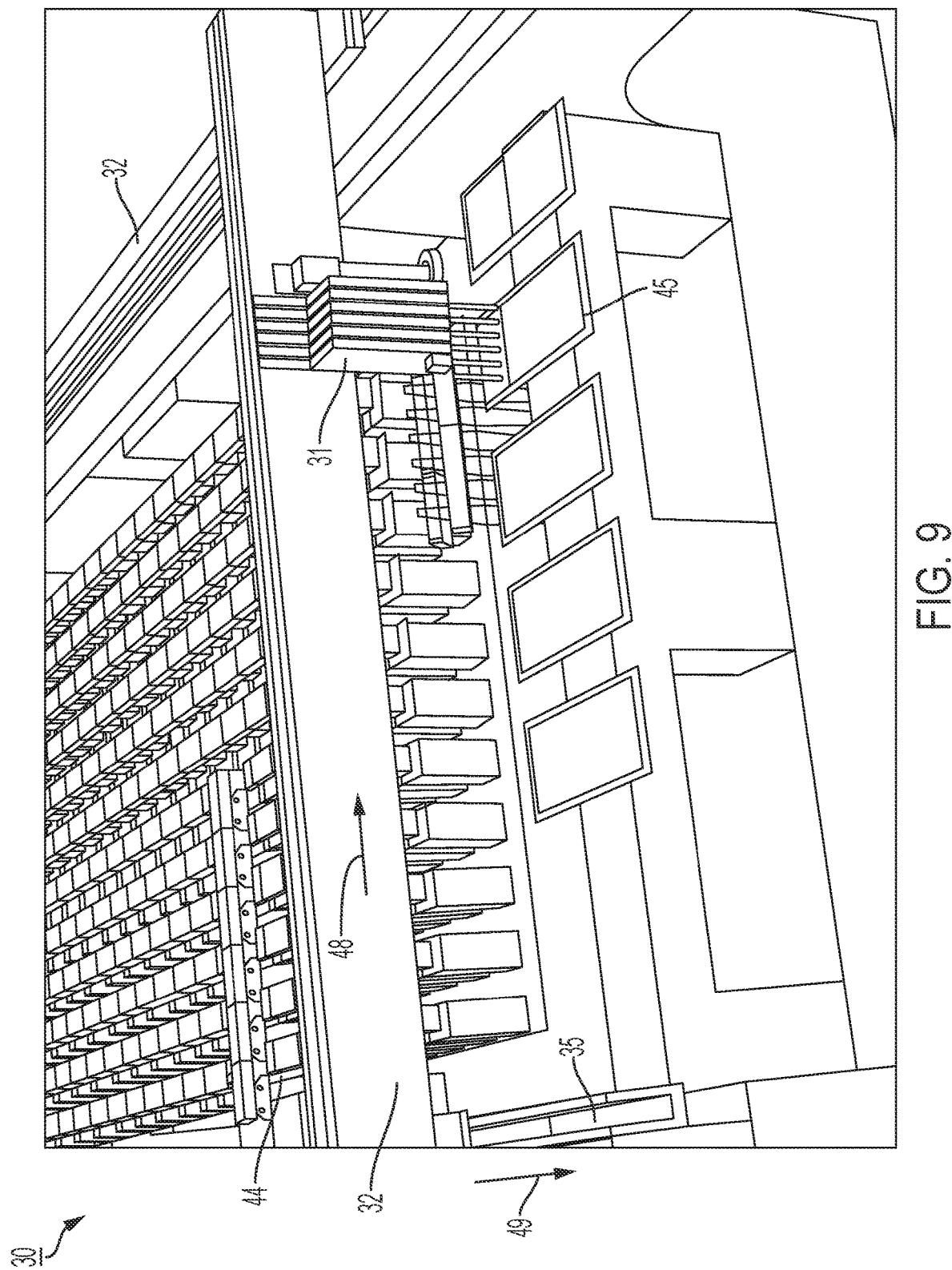

In FIG. 7, after the pickers place the devices into test sockets 40, the lids of those test sockets close automatically over the test sockets. As explained, the pickers and gantry do not interact with the lids to cause the lids to open or to close; their operation is controlled by the control system based on movement of the pickers and the gantry during operation of the test system. Closure of the lids is represented in FIG. 7 by the slightly angled lids 43 moving into place over test sockets 40. Although rotation of the lids is shown with respect to FIGS. 4 to 28, other movements for opening and closing, such as those described with respect to FIGS. 38 to 66, may be used for different configurations of the test sockets, lids therefor, and associated structures. Meanwhile, pickers 31 and gantry beam 32 are controlled to move to a row of test sockets 44 to pick-up (that is, to remove) devices that have been tested from those test sockets and then to transfer those devices that have been tested to tray 45. This transport is shown in FIGS. 8 and 9. As shown, the pitch of pickers 31 is controlled to change from a pitch that is the same as, or approximate to, a pitch of test sockets 44 to a pitch that is the same as or approximate to a pitch of cells in tray 45. As explained above, this change may be fluid in that pickers 31 may be controlled to move linearly along gantry beam 32 in the direction of arrow 48 during movement of gantry beam 32 along tracks 35 in the direction of arrow 49. Pickers 31 may place or deposit the devices that have been tested into respective cells in tray 45 by releasing vacuum pressure, using the mechanical mechanisms described herein, or a combination of the two.

Figure 10:
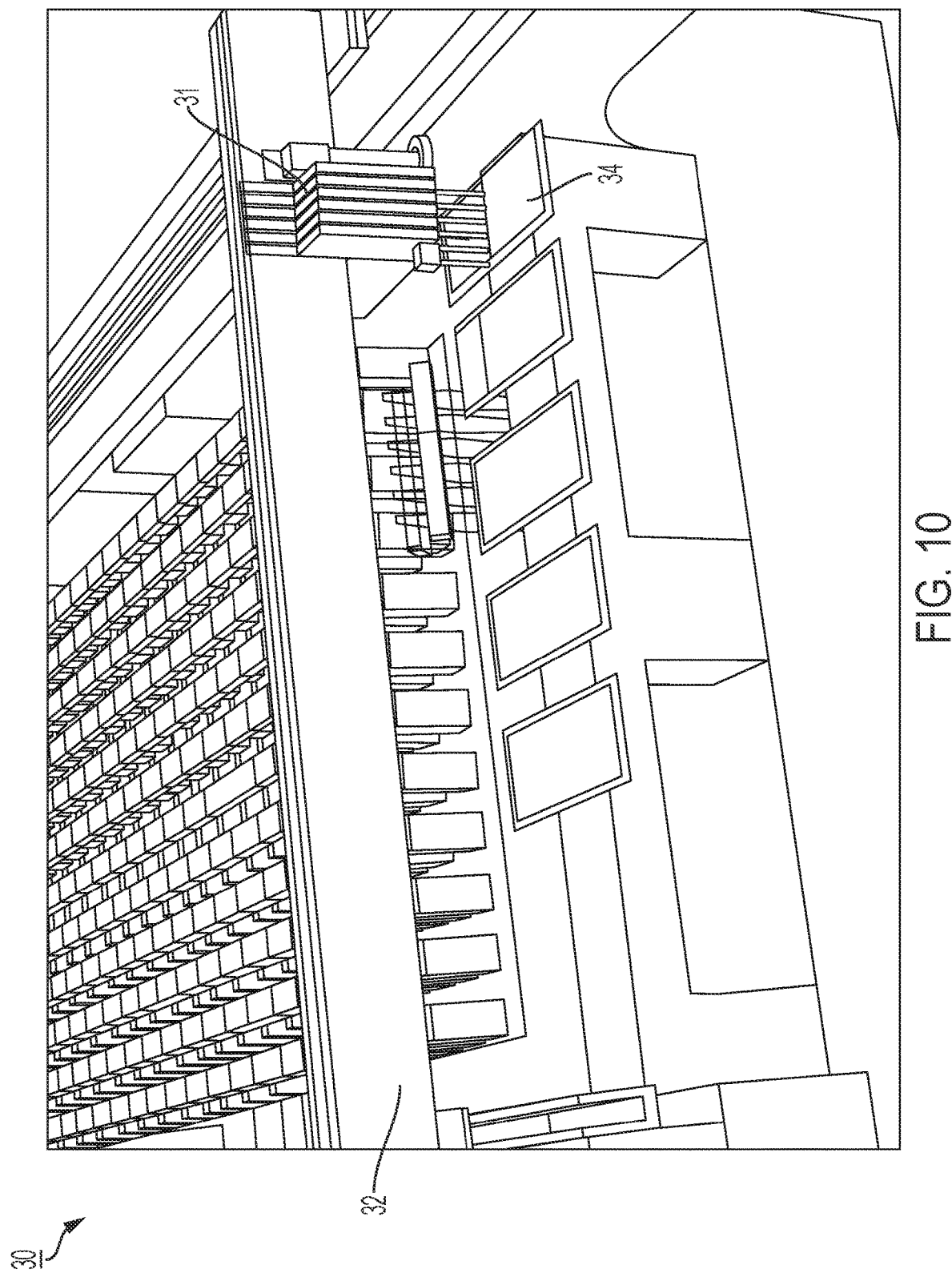
Figure 11:
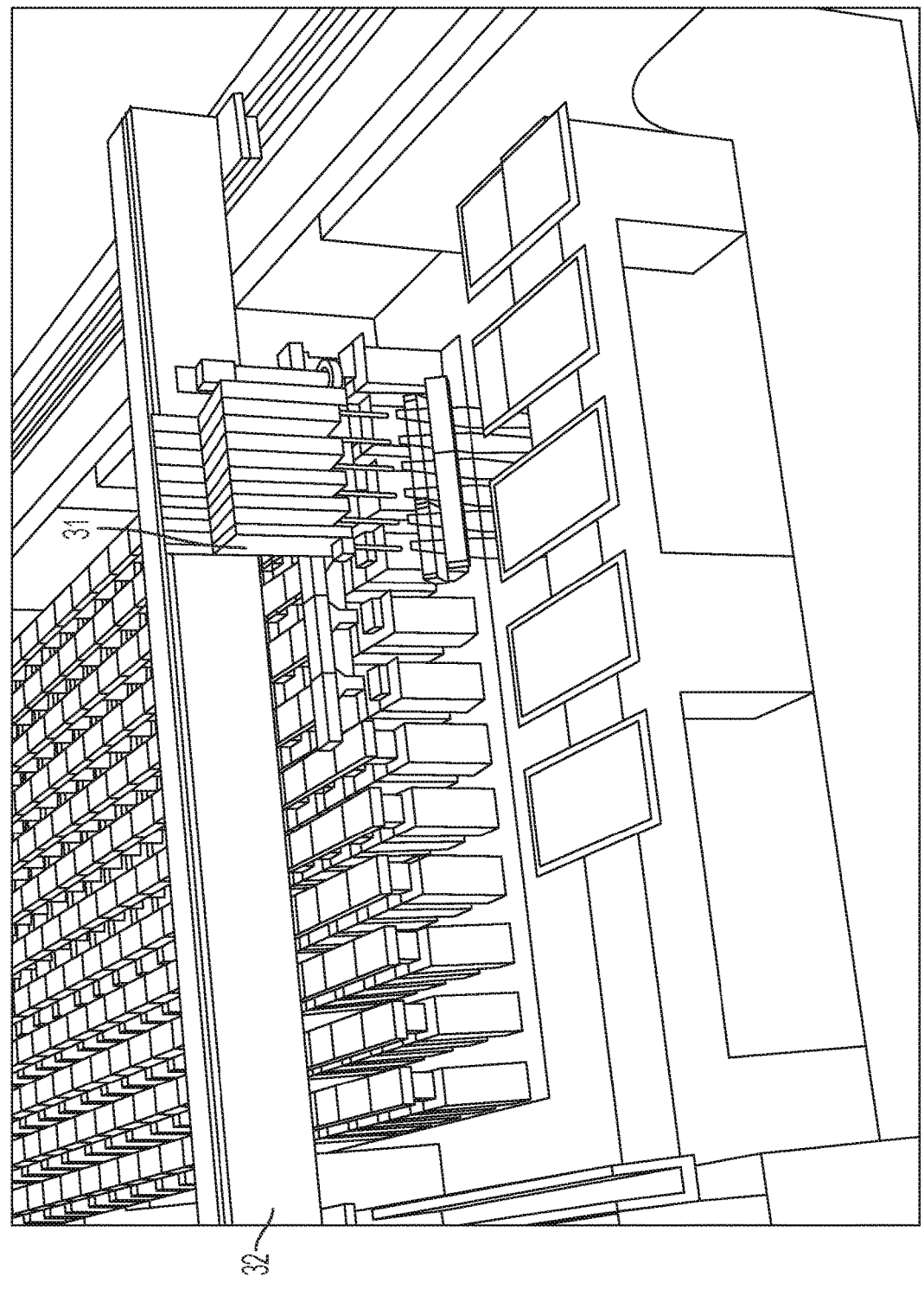
Figure 12:
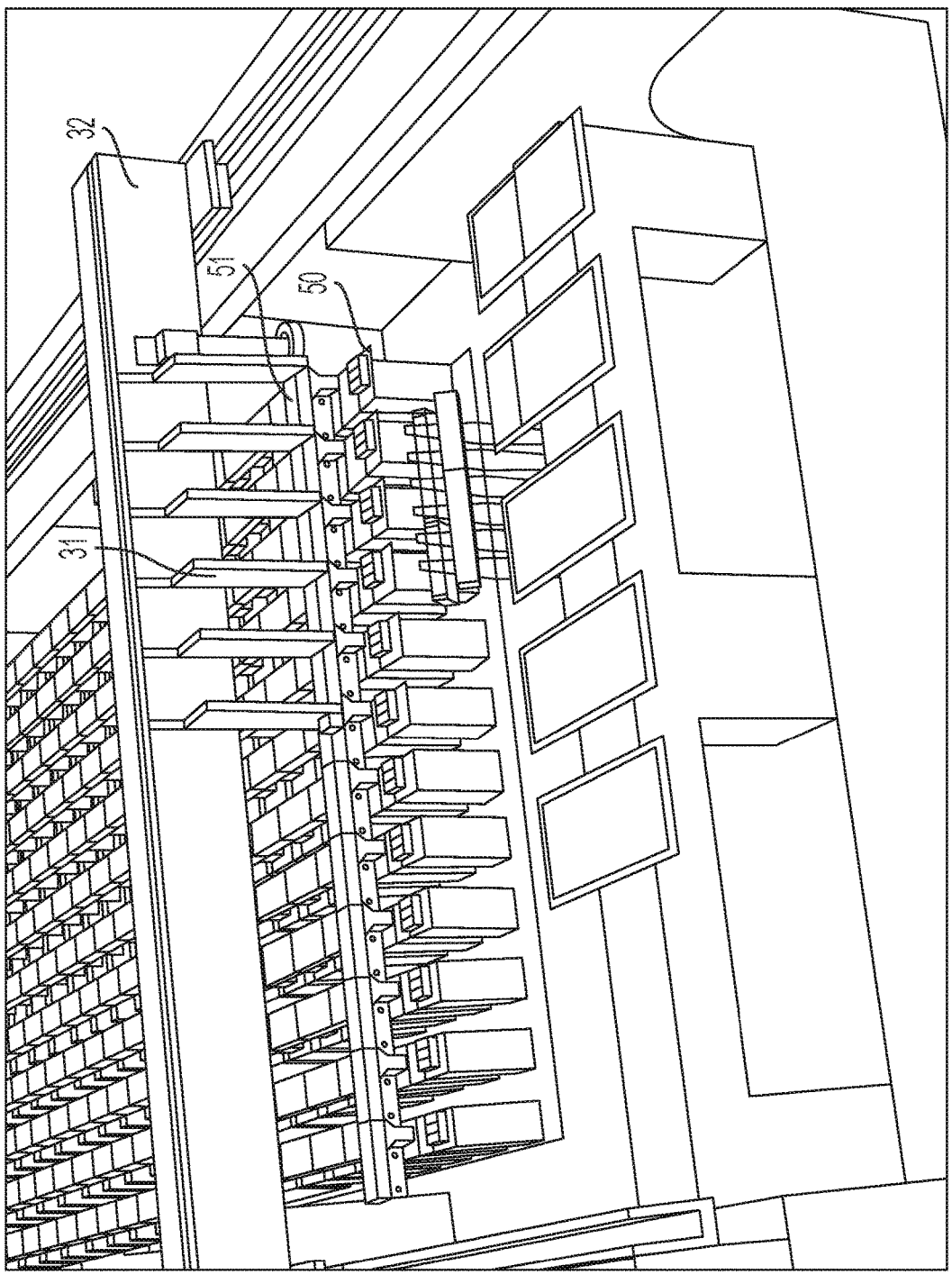
Figure 13:
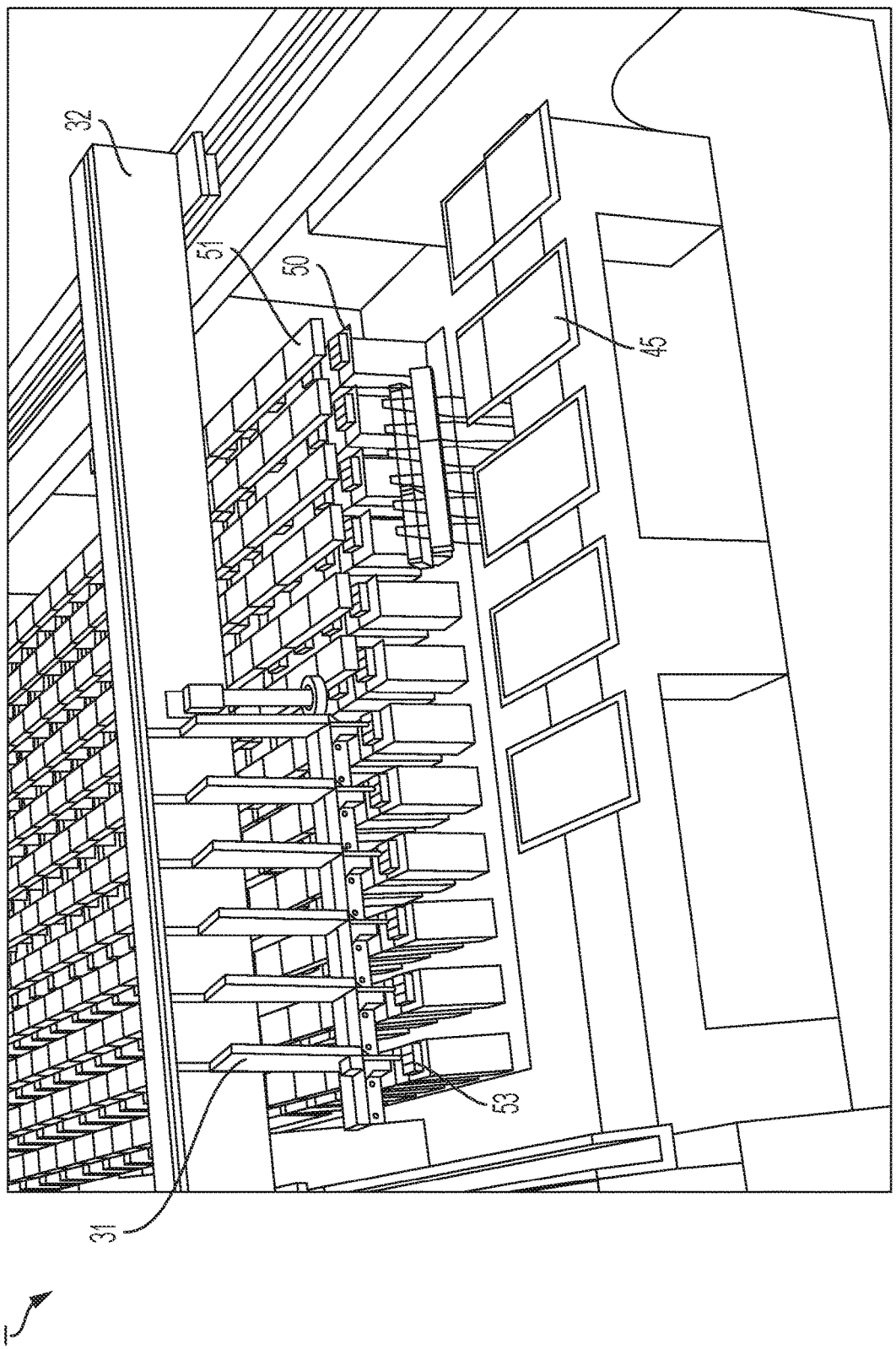

As shown in FIG. 10, pickers 31 and gantry beam 32 are next controlled to move so that the pickers align to a new row of cells in tray 34 containing devices to be tested. Pickers 31 pick-up the devices in that row as described herein and, with gantry beam 32, transport those devices to test sockets 50, as shown in FIGS. 11 and 12. In FIG. 12, lids 51 of test sockets 50 are opened to allow the pickers to place the devices to be tested into the test sockets. As shown in FIG. 13, after or while pickers 31 and/or gantry beam 32 are controlled to move away from test sockets 50 to next destination test sockets, lids 51 are controlled to close to cover devices in test sockets 30.

In FIG. 13, pickers 31 are controlled to pick-up devices that have been tested from test sockets 53. Those devices that have tested are moved to, and placed into, cells on tray 45. As described above, the pitch of pickers 31 is controlled to change—in this example, to narrow—from a pitch equal to or approximate to a pitch of test sockets 53 to a pitch that is equal or approximate to a pitch of the cells of tray 45 in order to place the devices that have been tested into the cells.

Figure 14:
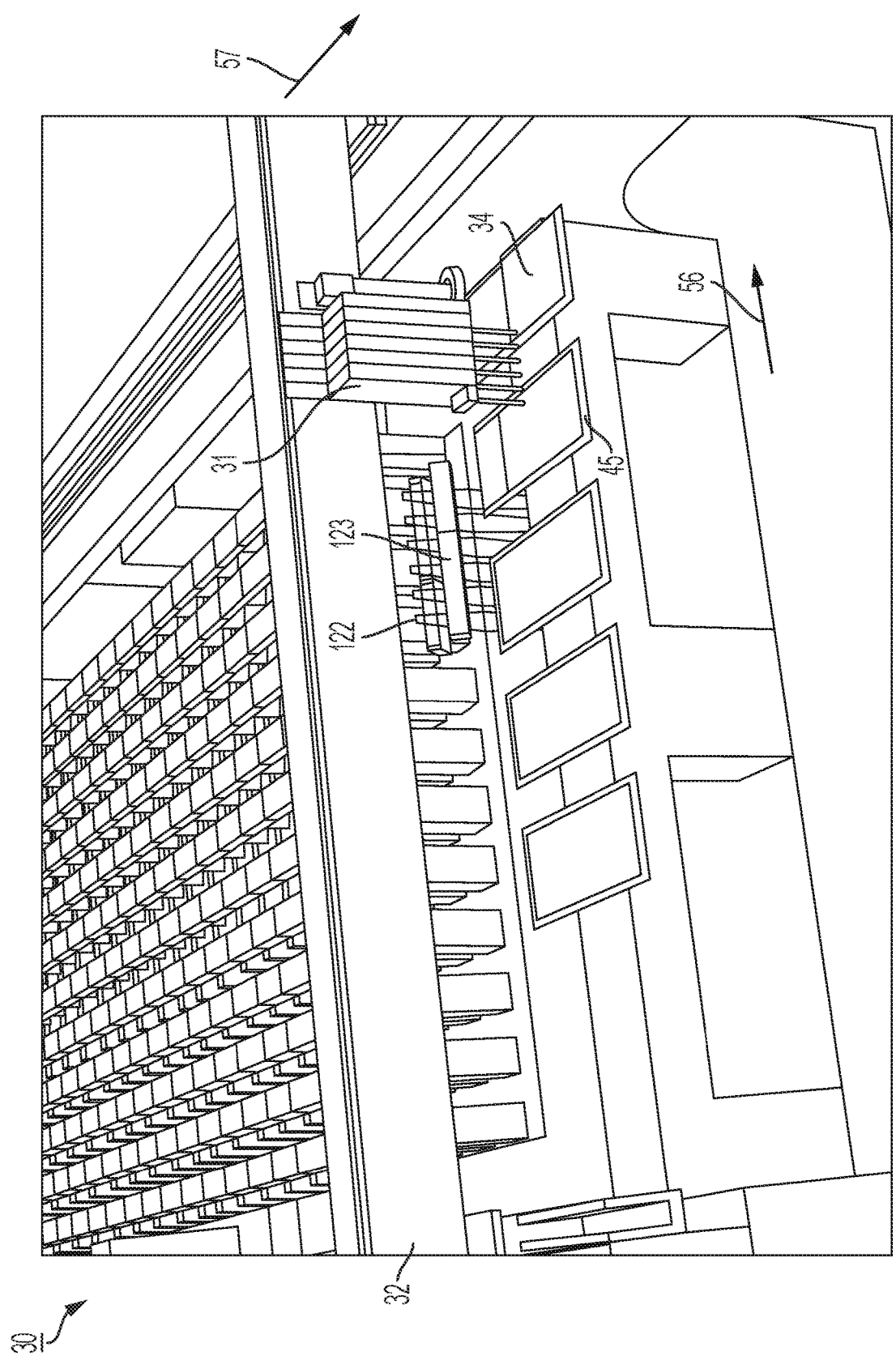
Figure 15:
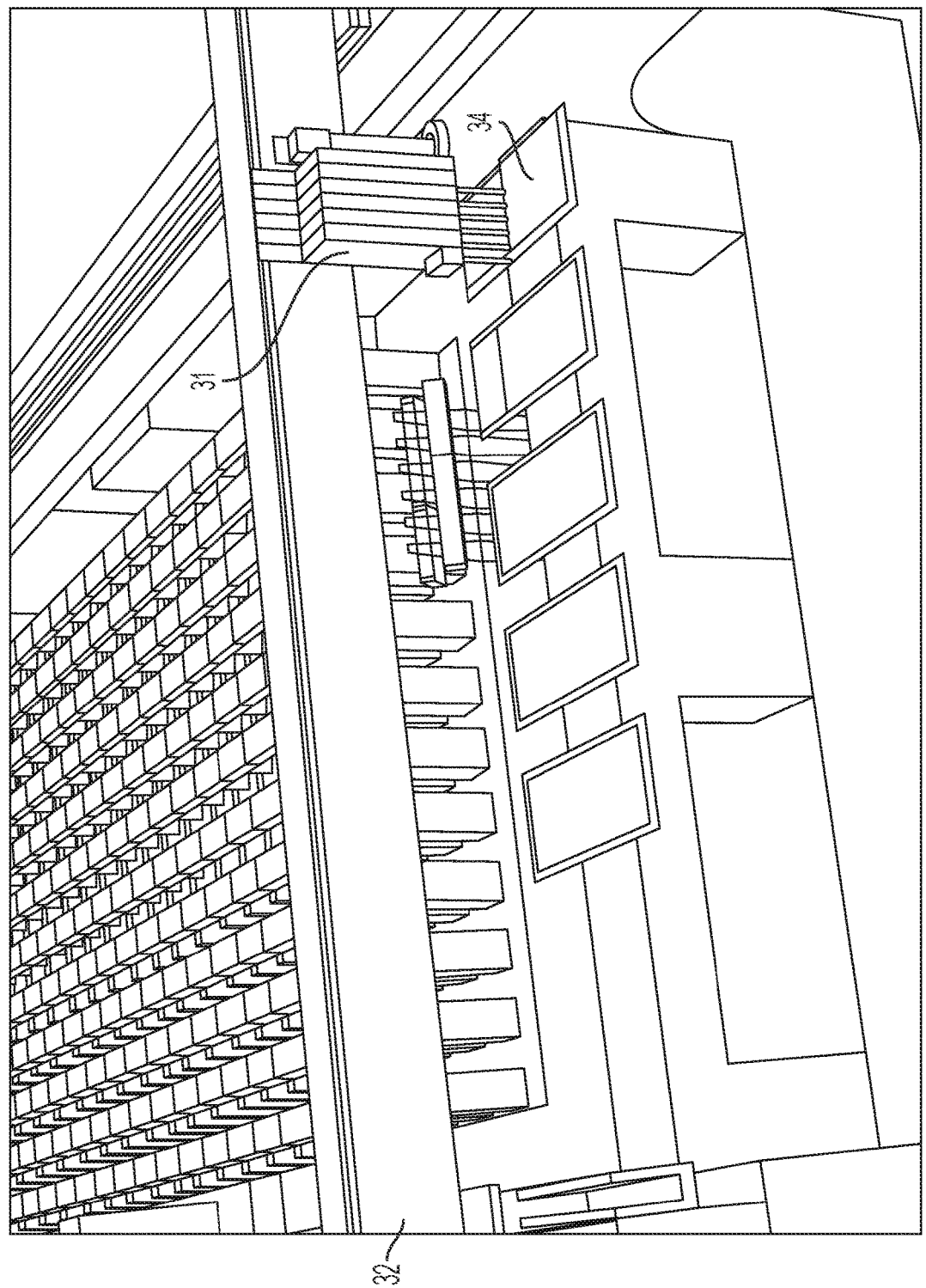
Figure 16:
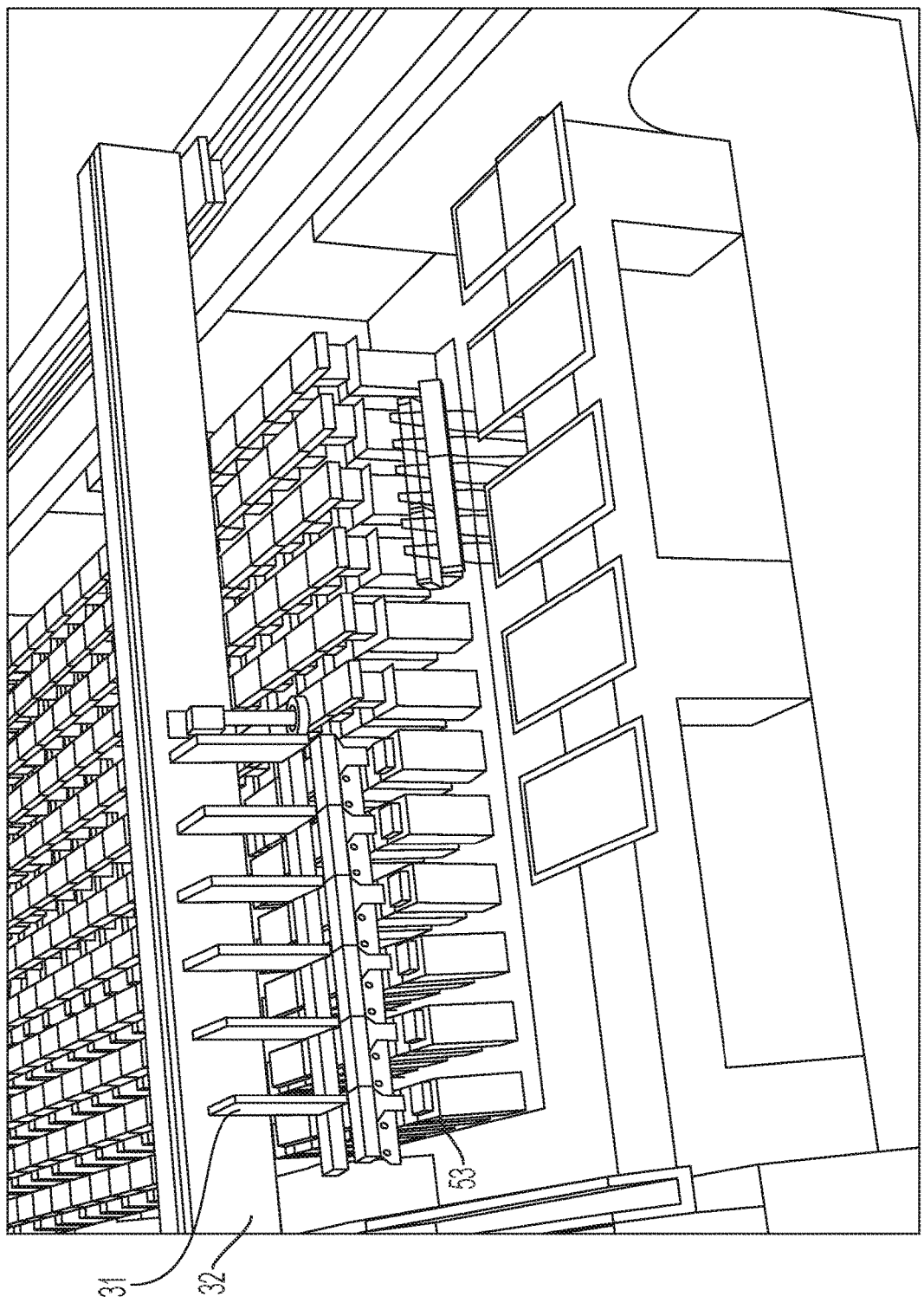

As shown in FIG. 14, pickers 31 are then controlled move from tray 45 to tray 34 in order to pick-up devices to be tested from tray 34 and to transport those devices to test sockets for testing. Specifically, pickers 31 are controlled to move linearly in the direction of arrow 56 and gantry beam 32 is controlled to move linearly in the direction of arrow 57 to pick up devices to be tested from tray 34. Pickers 31 are positioned as shown in FIG. 15 to pick up devices to be tested from tray 34. Then, both pickers 31 and gantry beam 32 are controlled to move to the position shown in FIG. 16 to place those devices from tray 34 into empty test sockets 53 (which were evacuated in the operations described with respect to FIG. 13). As shown, the lids of those empty test sockets have already been controlled to move to expose test sockets 53 and thereby allow pickers 31 to place the devices into the test sockets for testing.

Figure 17:
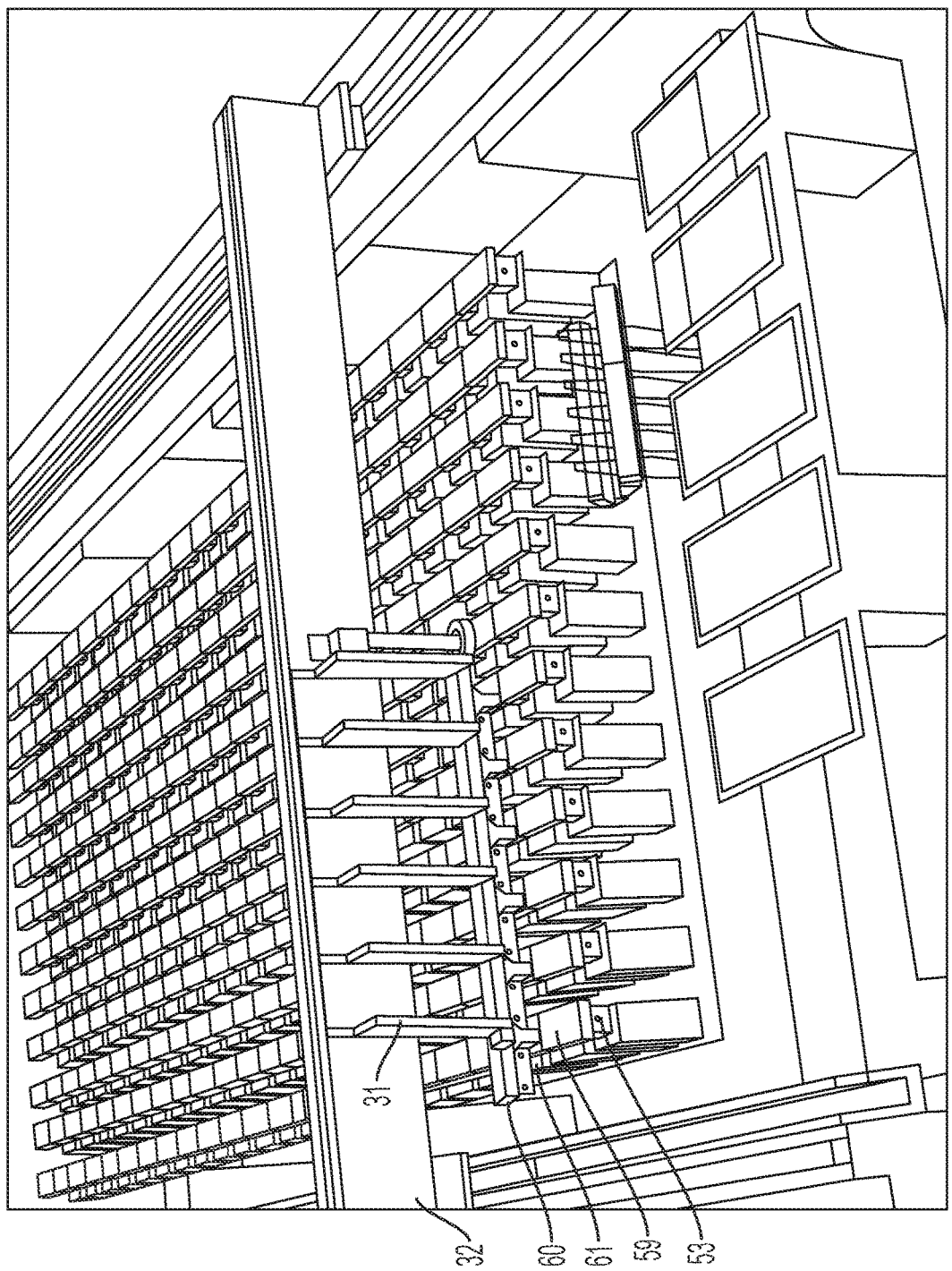

Next, in FIG. 17, lids 59 close automatically over devices in test sockets 53, while lids 60 over test sockets 61 are controlled to open automatically to allow pickers 31 to access, and to pick-up, devices that have been tested from those test sockets 61. The lids may be controlled to open and/or to close while the gantry and pickers are moving.

Figure 18:
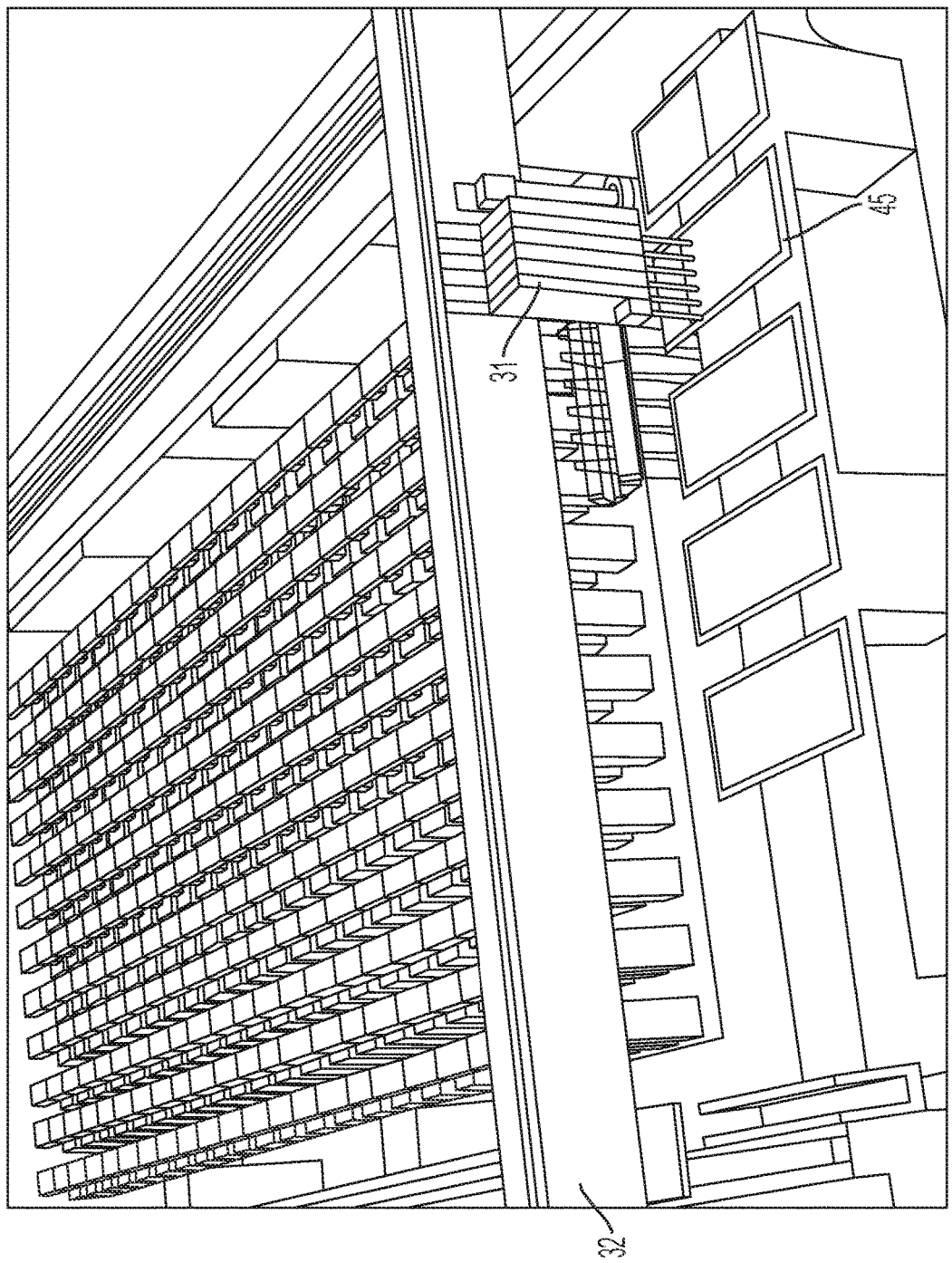
Figure 19:
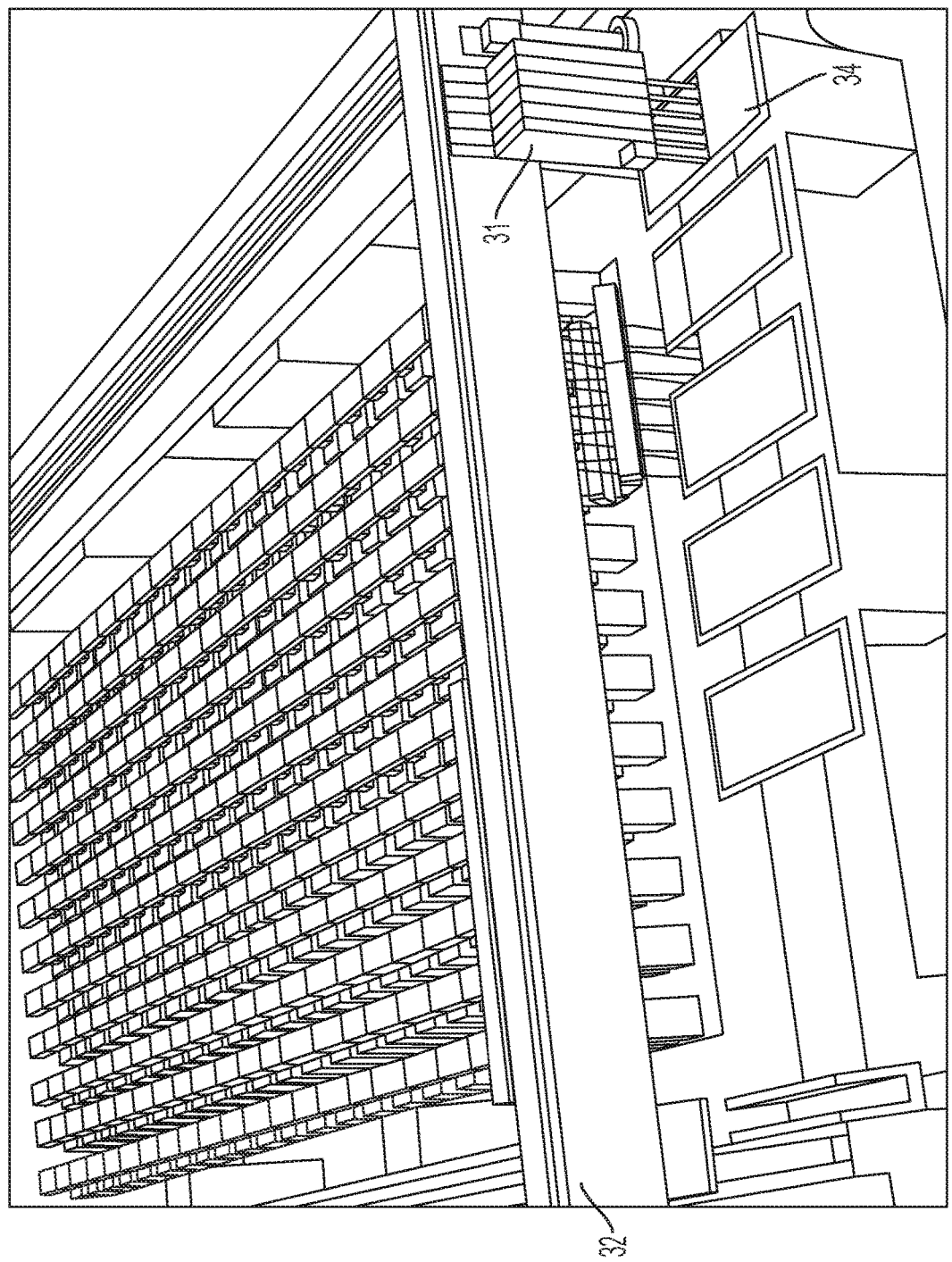
Figure 20:
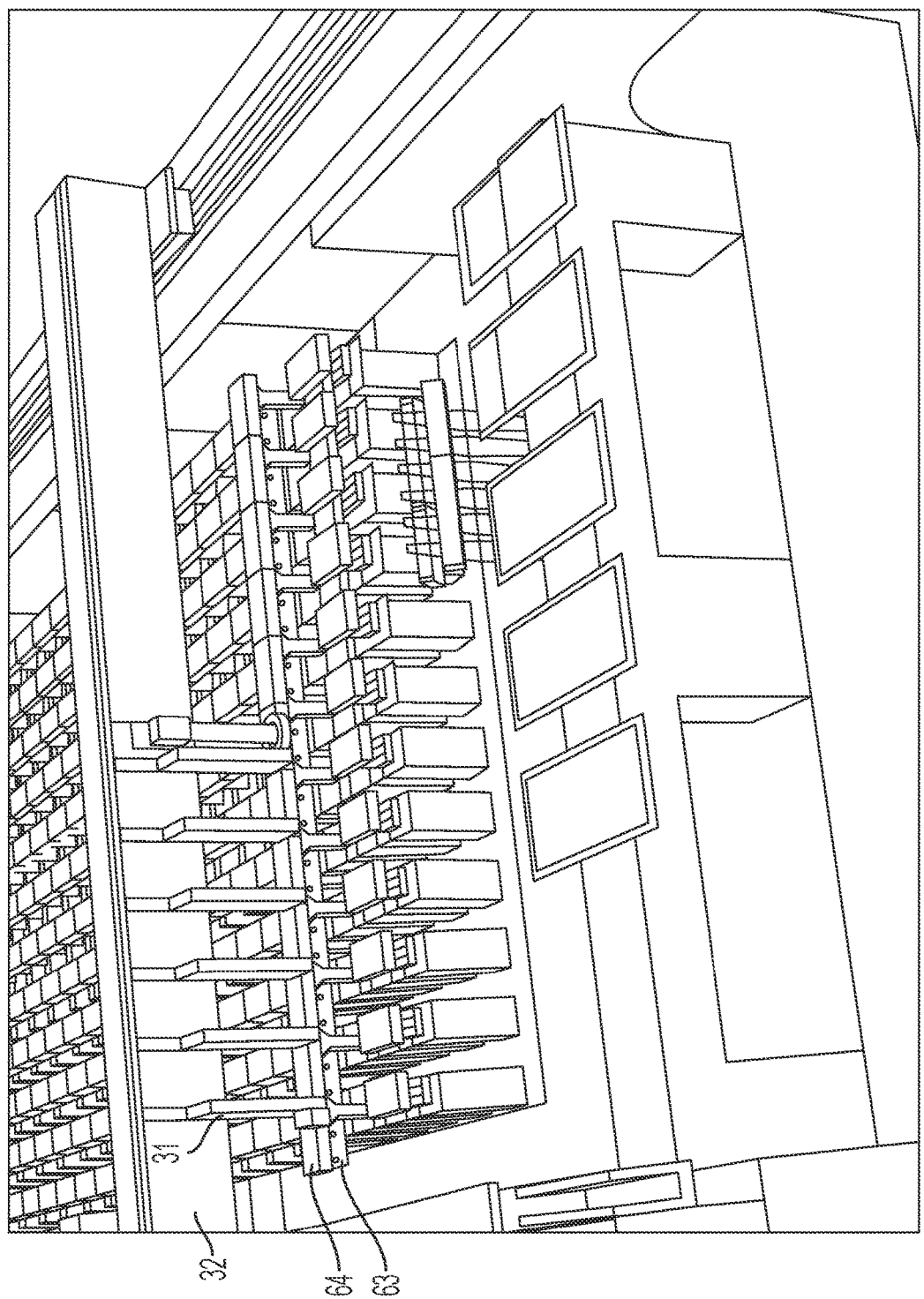
Figure 21:
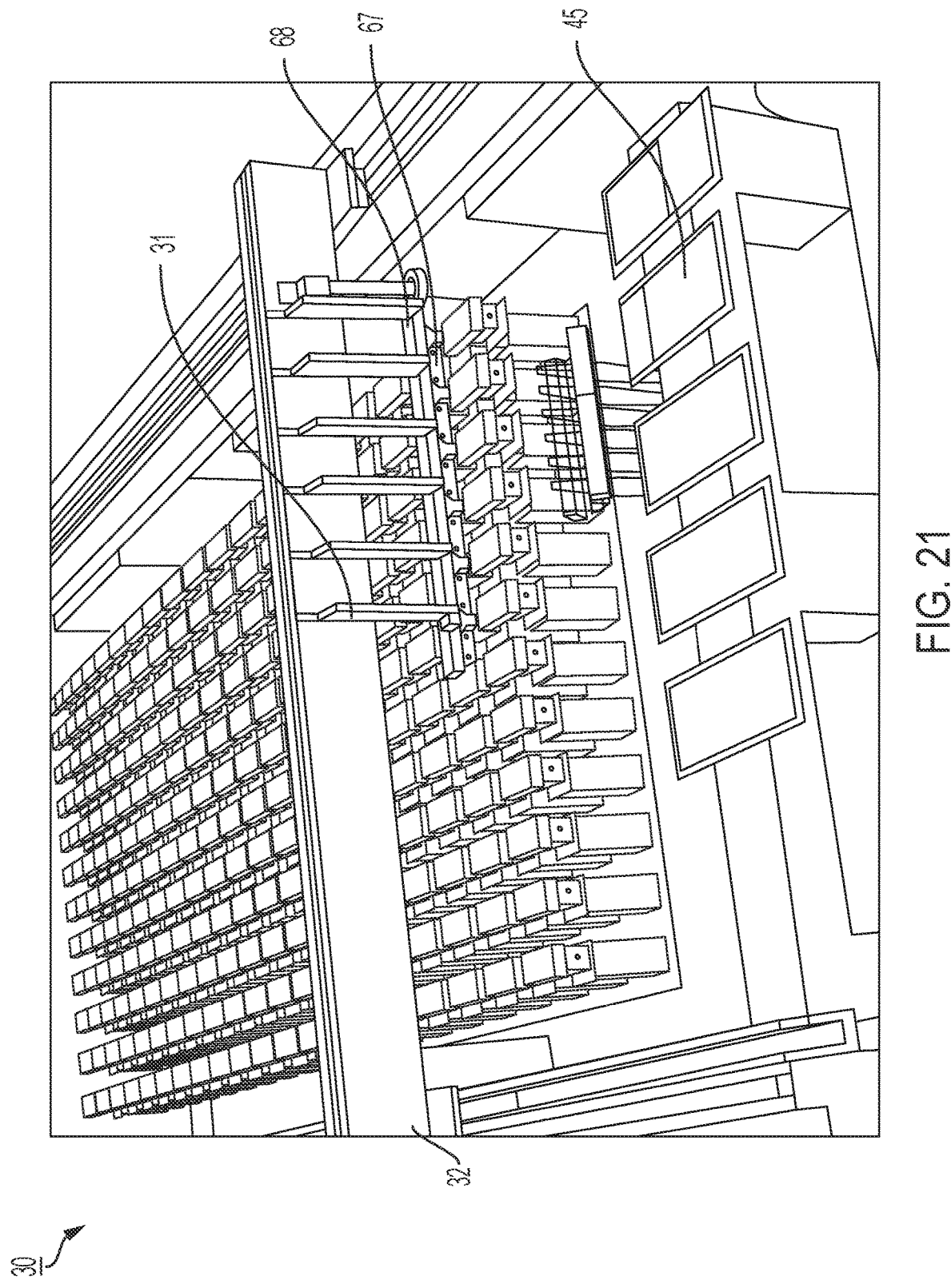
Figure 22:
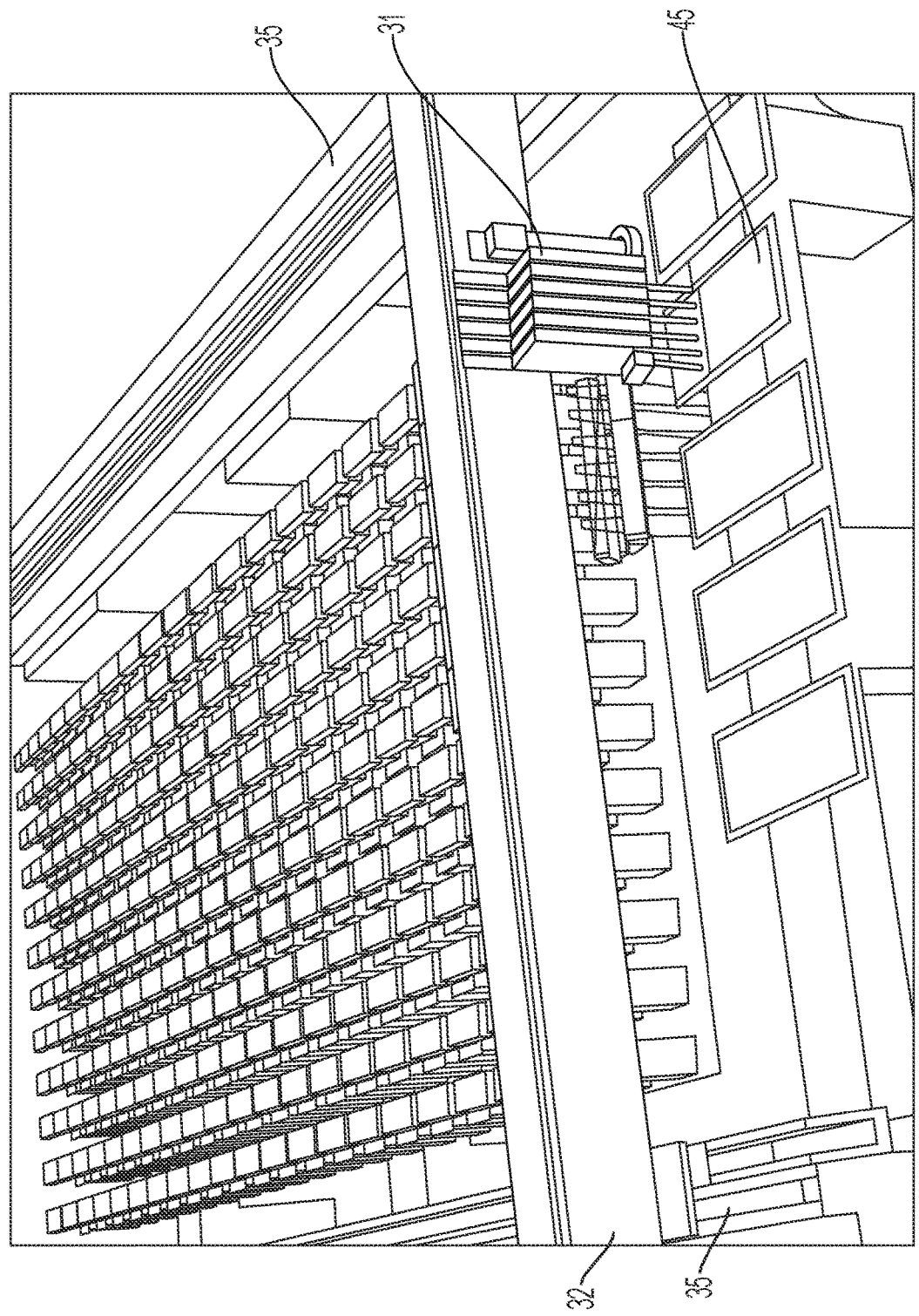
Figure 23:
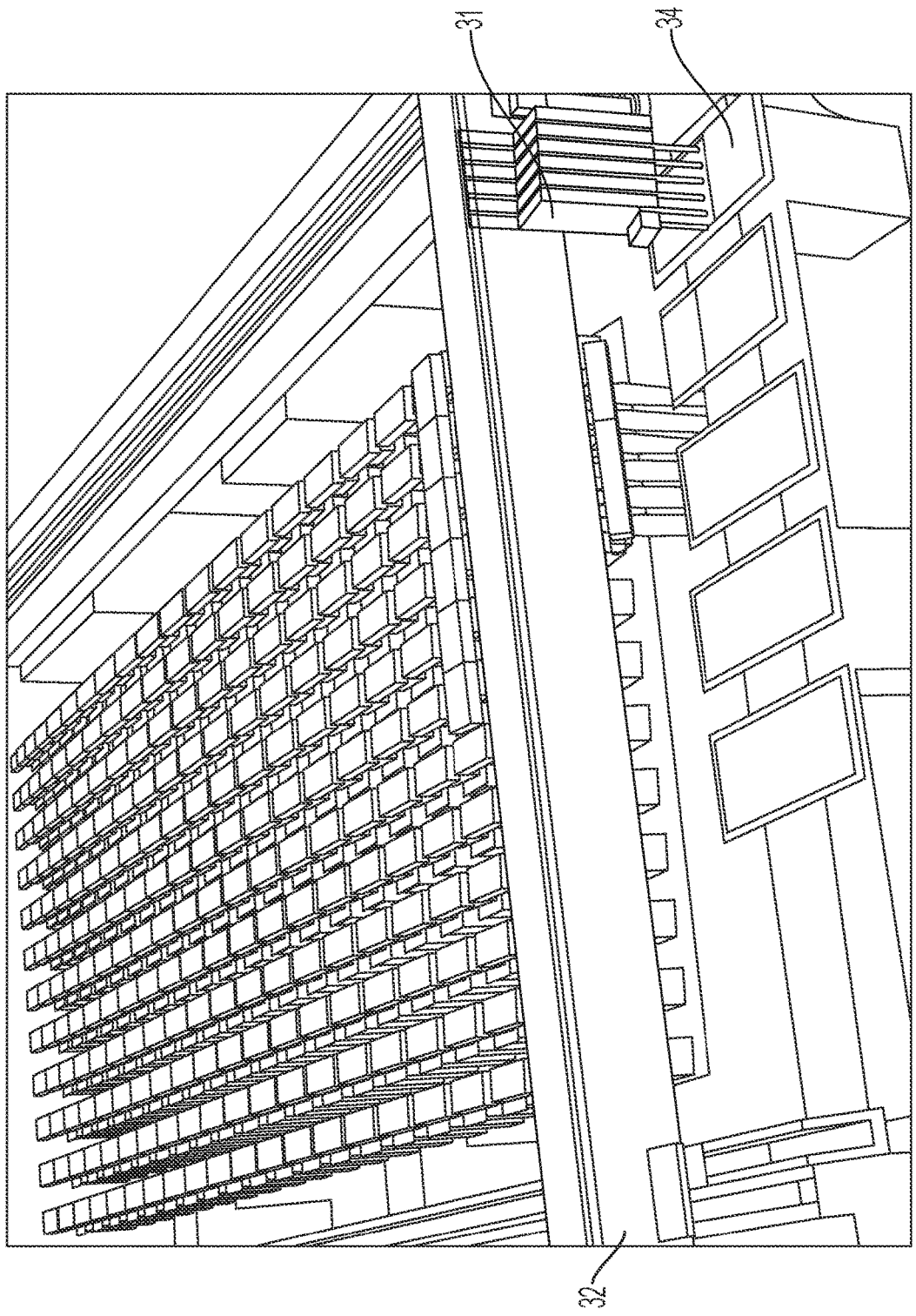
Figure 24:
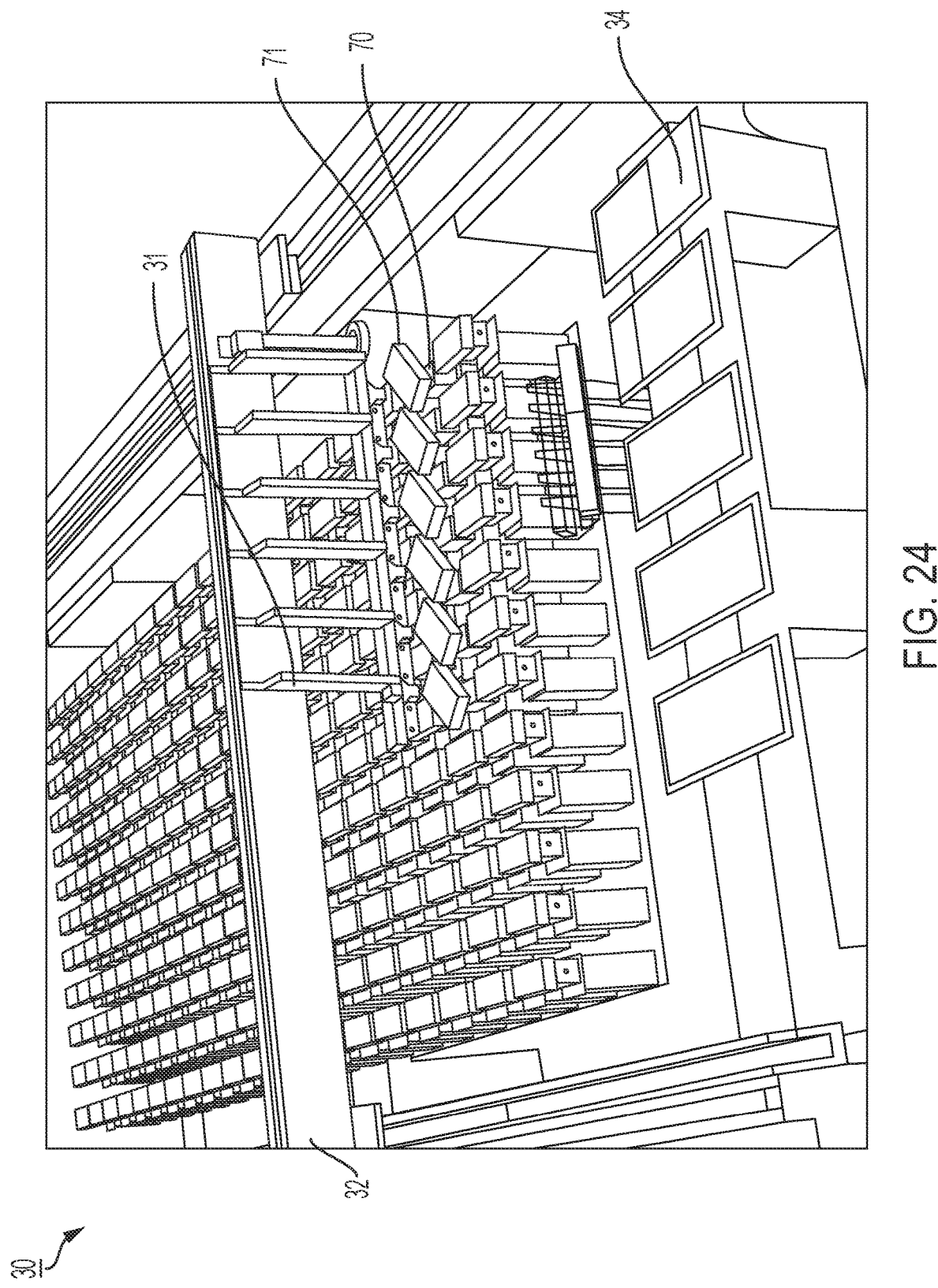

Devices that have been tested are removed from test sockets 61 and placed into tray 45 as shown in FIG. 18. Pickers 31 and gantry beam 32 are then controlled to move linearly to position pickers 31 as shown in FIG. 19 to pick up devices to be tested from tray 34. Pickers 31 and gantry beam 32 are then moved into position to place those devices to be tested into test sockets 63. As shown in FIG. 20, the lids 64 of test sockets 63 are moved to expose the test sockets 63 and to enable the pickers to place the devices into test sockets 63. The lid movement is implemented before the picker arrives at the test socket, as described herein. Next, as shown in FIG. 21, pickers 31 and gantry beam 32 are each controlled to move linearly to position pickers 31 to pick up devices that have been tested from test sockets 67 for transport to tray 45. As shown, in FIG. 21, the lids 68 of those test sockets 67 are controlled to open to expose the devices for pick-up by pickers 31 prior to pickers 31 arriving at the those test sockets. As shown in FIG. 22, the devices that have been tested are moved into tray 45 and placed there by pickers 31. Next, in FIG. 23, pickers 31 are moved to tray 34 to pick-up devices that have not been tested. That is, pickers 31 and gantry beam 32 are each controlled to move linearly to position pickers 31 as shown in FIG. 23 to pick up devices to be tested from tray 34. Referring next to FIG. 24, pickers 31 and gantry beam 32 are controlled to move to place those devices to be tested that were picked-up from tray 34 into test sockets 70 for testing. The lids of test sockets 70 are controlled to open during movement of the pickers and gantry beam so that the test sockets are open—for example, exposed—for placement of DUTs. Placement is not shown in FIG. 24.

Figure 25:
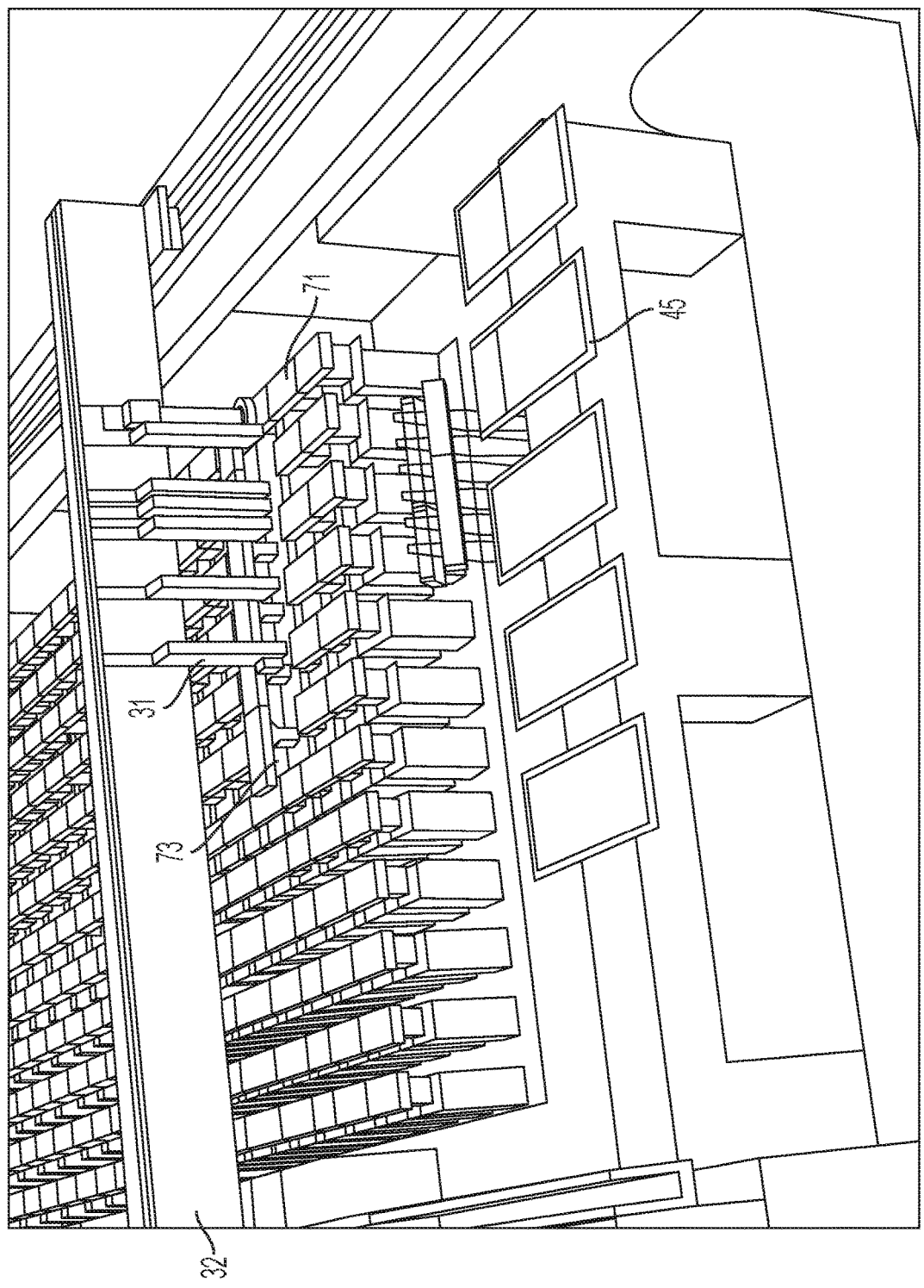
Figure 26:
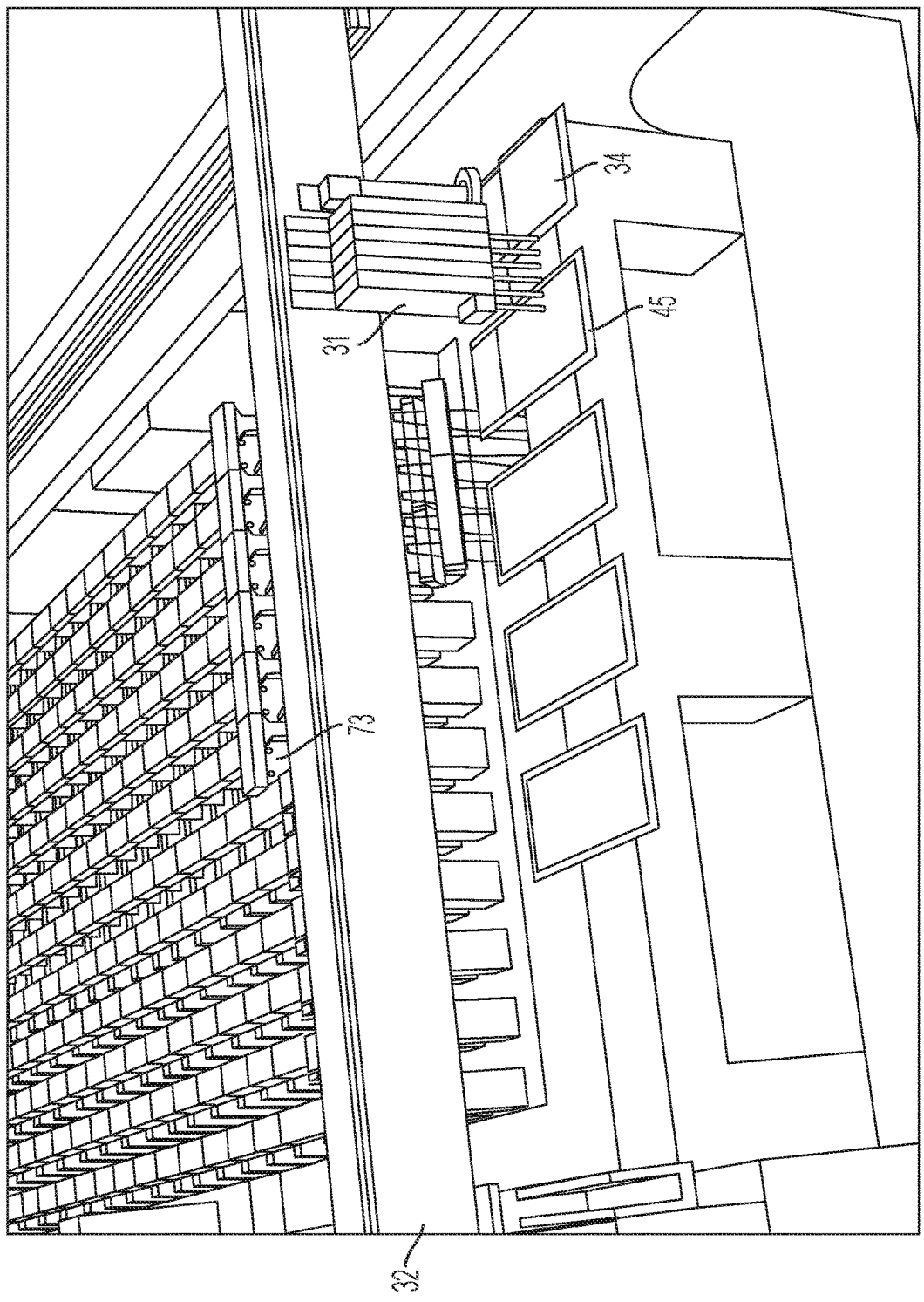
Figure 27:
Figure 28:
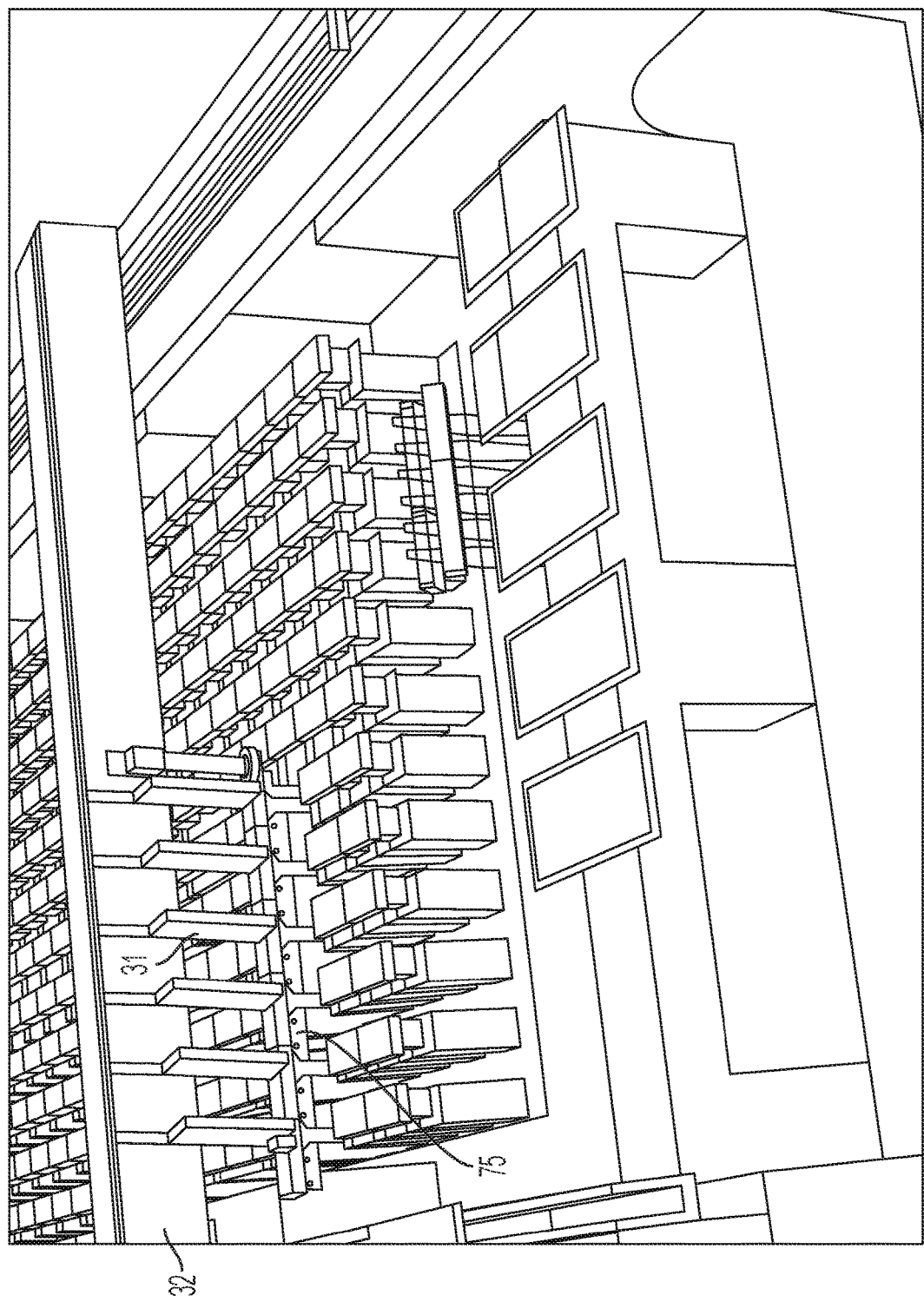

However, as partially depicted in FIG. 24, in this example lids 71 move in one way to allow pickers 31 to place devices to be tested into respective test sockets 70 and move in the opposite way to cover the devices after they have been placed, as shown in FIG. 25. Pickers 31 and gantry beam 32 are then controlled to move to a new row 73 to pick-up devices that have been tested from test sockets in that row and to transport those devices to tray 45. After that, as shown in FIG. 26, pickers 31 and gantry beam 32 are controlled to move the pickers from tray 45 to tray 34 to pick-up devices that have not been tested. As shown in FIG. 27, pickers 31 and gantry beam 32 are then controlled to move to place those untested devices into test sockets 73 which were previously evacuated as described with respect to FIG. 25. Then, pickers 31 and gantry beam 32 are controlled to move to pick-up devices that have been tested from test sockets 75, as shown in FIG. 28. Operation of the pick-and-place robotics shown in FIGS. 4 to 28 may continue in this manner until testing has completed.

In some implementations, a number (for example, six) DUTs to be picked-up (or locations where DUTs are to be placed) are not in the same row. As a result, the pickers would not pick or place the DUTs concurrently or in parallel. Instead, the pickers and the gantry are controlled by the control system to perform picking or placing using as many steps as needed. For example, the pickers and/or the gantry may be controlled to pick-up two DUTs in parallel on one tray row, then move to pick-up four more DUTS in parallel on a different tray row, then move to place three of those DUTs in parallel into sockets that are aligned in one row, and then move again to place the remaining three DUTs into a different set of sockets aligned in another row.

FIGS. 4 to 28 show rows of test sockets having the same pitch. However, as explained previously, the test system may test devices having different sizes, shapes, and/or form factors in parallel, contemporaneously, and/or concurrently. Accordingly, groups or arrays of the test sockets in the same or different packs may have different pitches but nevertheless share the same pick-and-place robotics and be tested by the system in parallel, synchronously, or asynchronously. The groups or arrays of the test sockets in the same or different packs may be tested using the pick-and-place robotics simultaneously contemporaneously, or concurrently.

In this regard, as explained with respect to FIGS. 1 and 2, test sockets are held on packs, such as packs 13a to 13d, that are movable into and out of frame 12 and housing 11 of test system 10. T summarize, the example test system incorporates a pack architecture and a modular base frame. The pick-and-place robotics supports various numbers and configurations of packs. The pick-and-place robotics is configured to service different configurations of the packs. For example, the pick-and-place robotics may be configured to move DUTs into and out of different types of packs that are installed in the test system at the same time. In other words, the same automation can be used on differently-configured packs. These different types of packs may have test sockets of different size, height, pitch, and so forth.

In the examples of FIGS. 3 to 28, the pick-and-place robotics are arranged on a horizontal plane in a modular increment within the pack architecture. The test sockets are installed on a horizontal plane and are arranged in a rectangular array as part of the pack architecture. The number of test sockets in a pack may be based on the size of a DUT to be tested. The number of test sites in a pack may be based on the size of a test board to be tested. In an example, each pack may contain anywhere from one test socket up to 24 test sockets depending on the size of the test board. However, in other implementations, different numbers of test sockets—for example, more than 24 test sockets or fewer than 24 test sockets—may be included per pack. For example, in some implementations, a pack may have up to six test sockets or test sites in a row; for example, in some implementations, a pack may have up to eight six test sockets or test sites in a row; for example, in some implementations, a pack may have up to ten test sockets or test sites in a row; for example, in some implementations, a pack may have up to twelve six test sockets or test sites in a row; and so forth.

The number of packs to be used may be based on DUT test time and the gantry cycle time to achieve greater tester socket utilization and/or automation gantry utilization. The pack can be fully removed from the frame, as shown with respect to FIGS. 2 and 31 to 33 described below. Each pack is removable from the frame and passes under the frame structure that supports the gantry. Each pack may be supported on its own internal wheels. When a pack is removed from the test system, the pack can thus be rolled across a factory floor. The packs may be mechanically aligned to the frame so that when they are removed and replaced, the sockets will line-up in order to allow the gantry can reach all packs in the same row at the same time.

Figure 29:
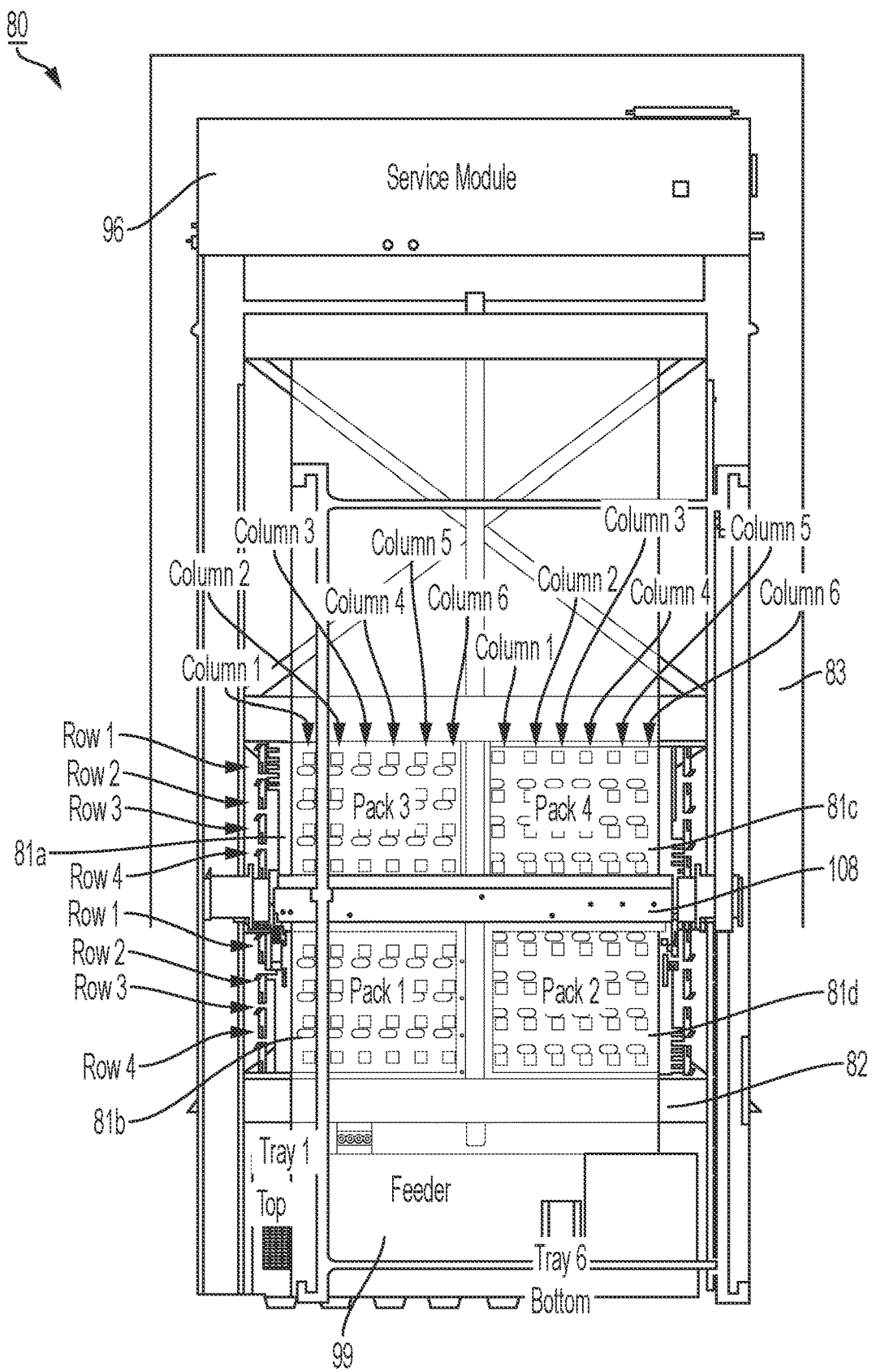
FIG. 29 is a top cut-away view of an example test system absent its housing showing internal components of the test system.
Figure 30:
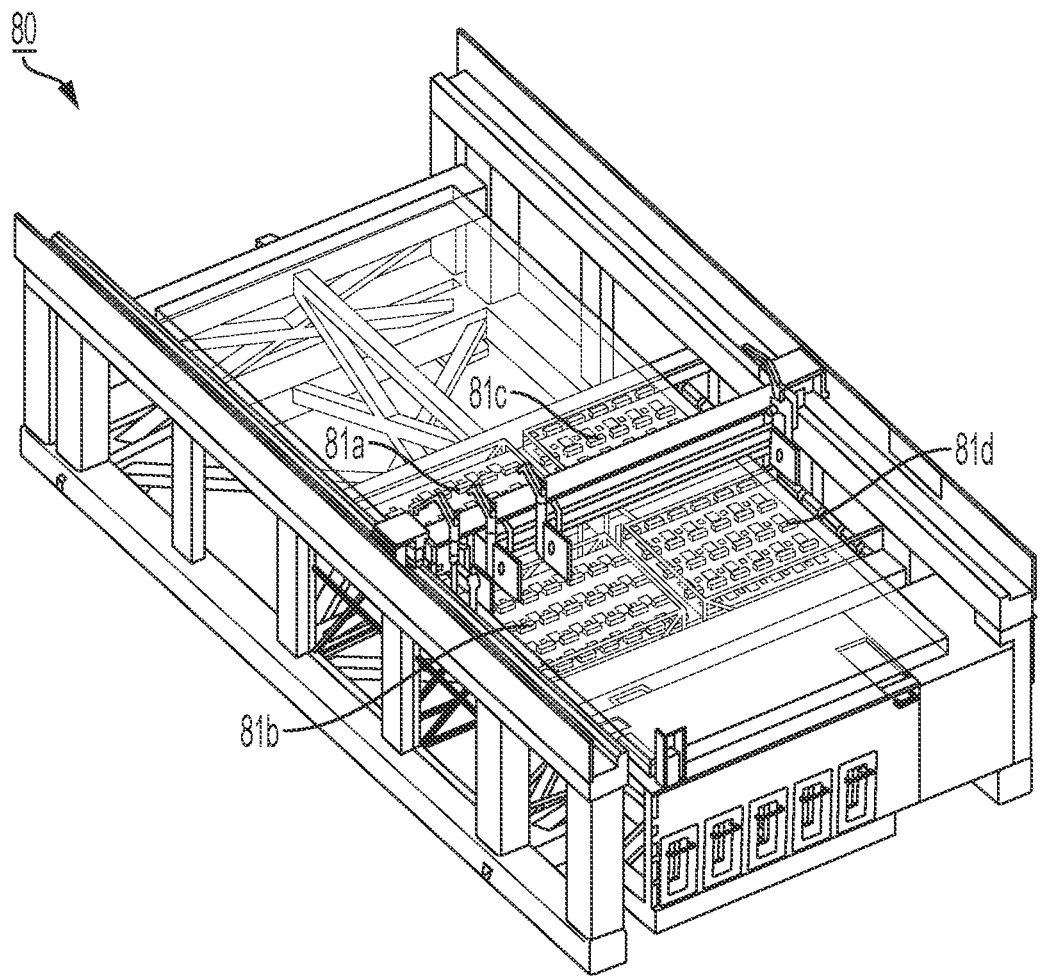
FIG. 30 is a perspective view of the example test system of FIG. 29 absent its housing to show internal components of the test system.
Figure 31:
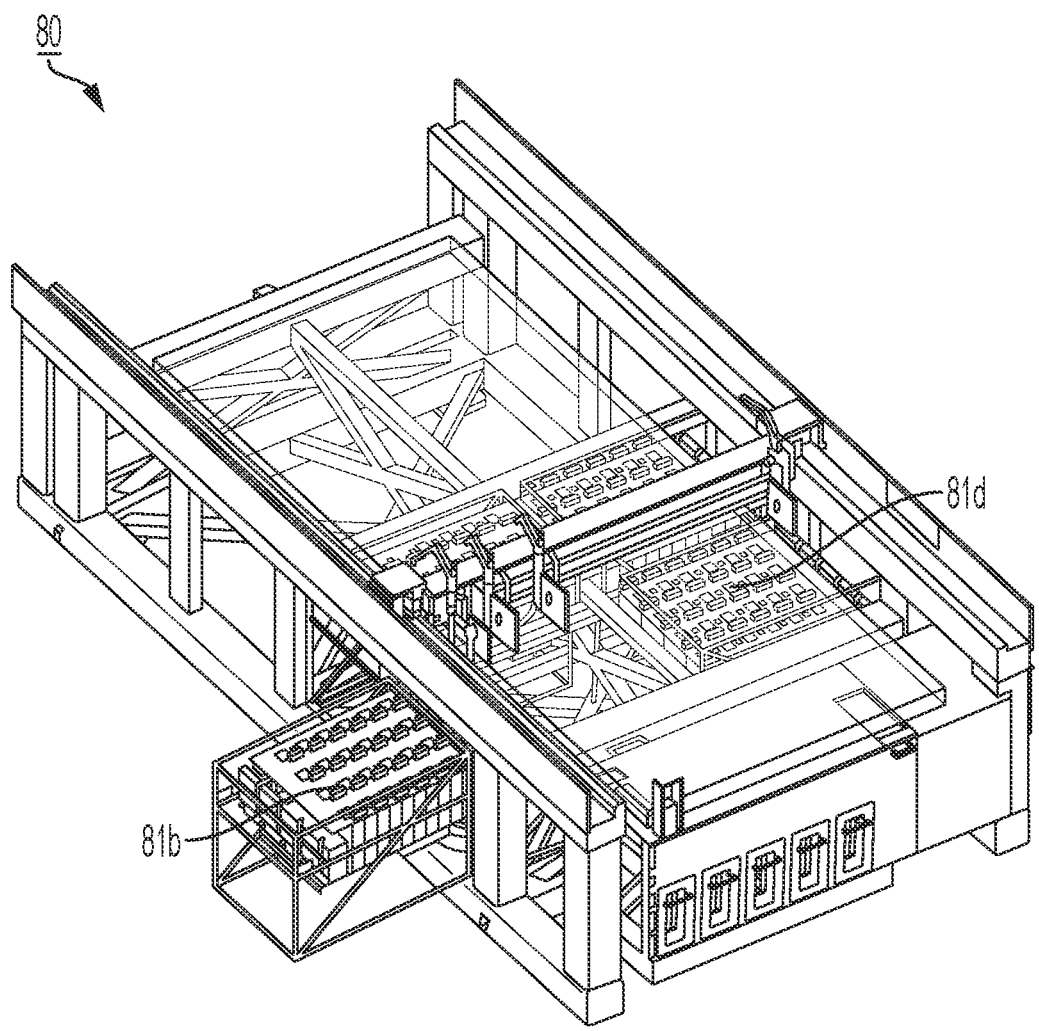
FIG. 31 is a perspective view of the example test system of FIG. 30 absent its housing to show movement of a pack into or out of the test system.
Figure 32:
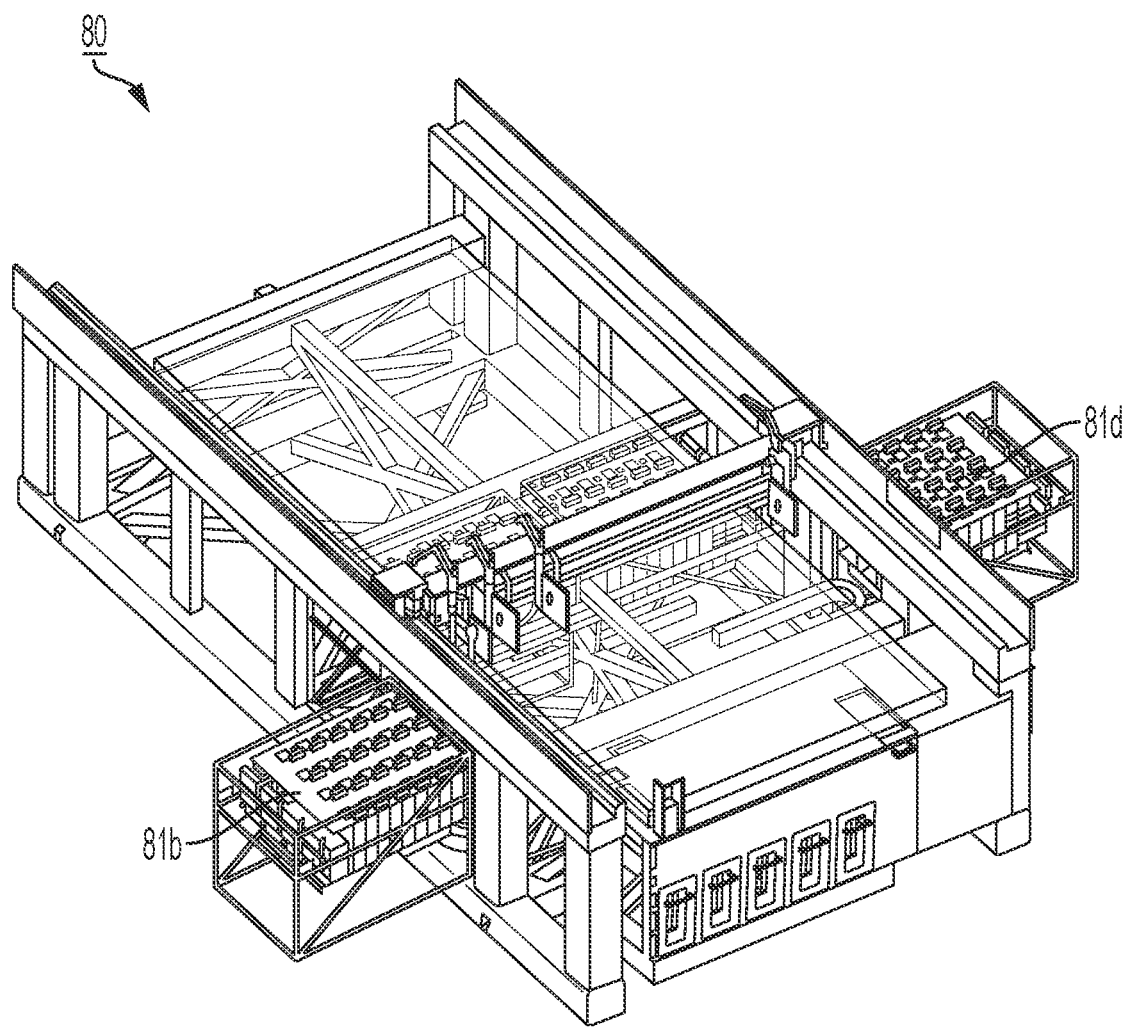
FIG. 32 is a perspective view of the example test system of FIG. 30 absent its housing to show movement of two opposing packs into or out of the test system.

FIG. 29 shows a top view of components of example test system 80, which may be of the type described respect to FIGS. 1 to 28. In this example, test system 80 contains four packs 81a to 81d held on rack 82 within housing 83. The sockets included in the packs are aligned in rows and columns. FIGS. 30 to 32 show perspective views of example test system 80. As shown in FIGS. 31 and 32, one or more individual packs such as packs 81b and 81d are removable from the test system. In this example, removable includes fully removable from the test system. Those packs are then replaceable with the same type of packs or with different packs. Test system 80 is therefore modular in the sense that a pack can be replaced in the test system in order to test different or the same types of devices in test sockets on the packs. In this regard, the test system is configured to operate with or without a full complement of packs. Packs may be replaced without reconfiguring software and/or hardware in the system. In some implementations, packs can be replaced during operation of the pick-and-place robotics in a so-called "hot swap". For example, testing on a pack 81a may be ongoing while pack 81b is being removed or replaced without interrupted testing on pack 81a.

Figure 33:
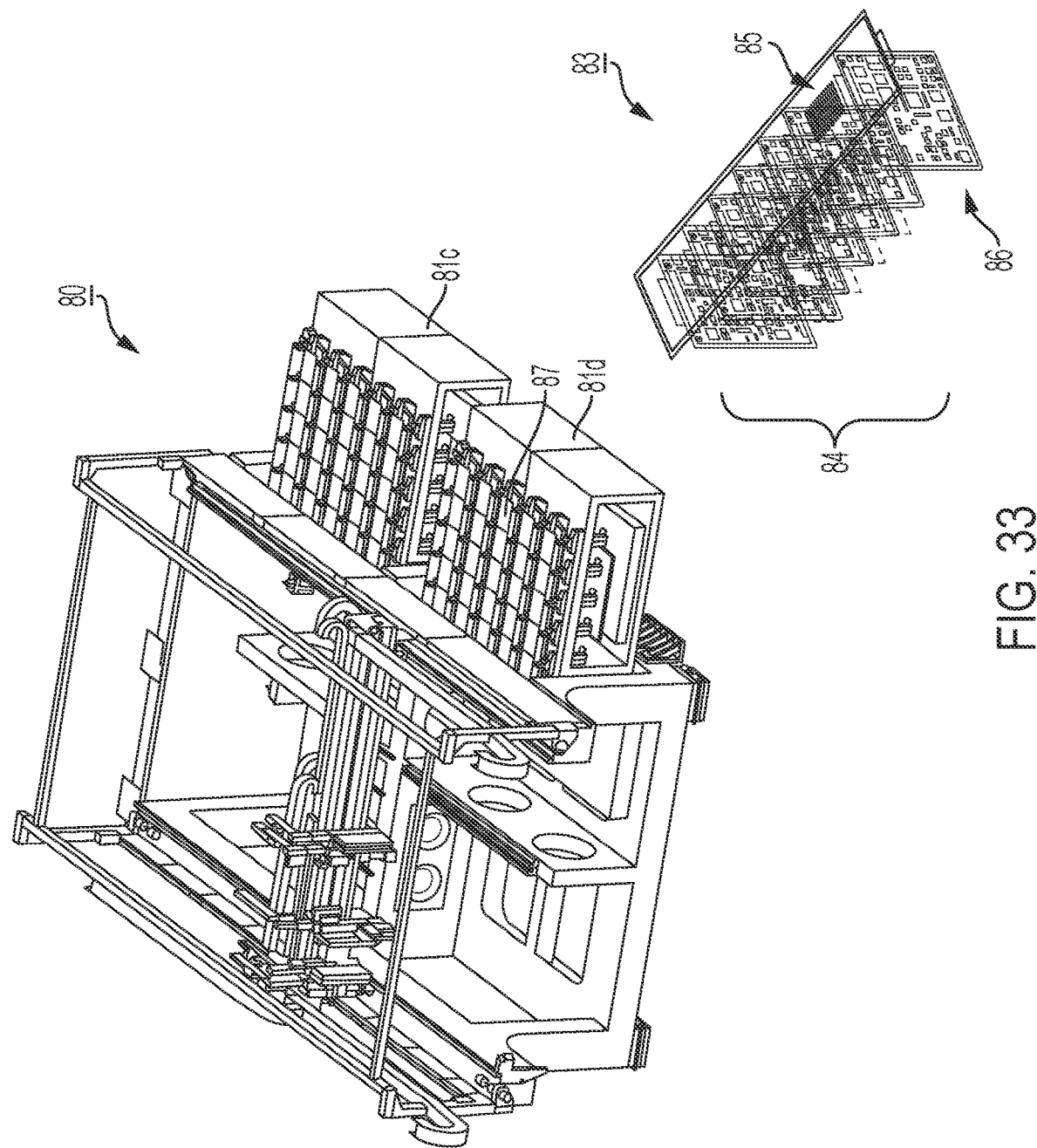
FIG. 33 includes a perspective view of the example test system of FIG. 30 absent its housing to show movement of two adjacent packs into or out of the test system, and also includes a perspective view of example pack electronics.

FIG. 33 also shows components of test system 80. In particular, FIG. 33 shows example electronics 83 that may reside in and/or on each pack, such as pack 81d. In this example, pack 81d contains test electronics 84, interface electronics 85, a controller board 86, and test sockets 87. Interface electronics 85 may include, but is not limited to, a midplane circuit board; standard, semi-custom, or custom customer interface circuitry; and standard board-to-board internal interface circuitry. Test electronics 84 may reside on one or more function boards that plug into the midplane. Controller board 86 may include a microprocessor, microcontroller, or other processing device(s) to control testing performed by the pack, to control actuators to open and close socket lids as described herein, and to communicate external to the pack.

As noted, the test sockets may be configured to hold devices that are to be tested. Different packs may be configured—for example, constructed, arranged, programmed, and/or controlled—to test different types of devices. Accordingly, the test sockets may have different configurations to accommodate different types and/or numbers of devices, to support different types of devices having different form factors, to support different types of devices having different electrical interfaces, to support different types of devices having different thermal requirements, to support different types of devices having different physical interfaces, to support different types of devices having different wireless functionalities, and/or to support different types of devices having electro-mechanical interfaces. In an example, different packs may include, but are not limited to, different numbers of test sockets arranged at different pitches. Furthermore, the test sockets on an individual pack may be configured and/or reconfigured to accommodate different types and/or numbers of devices, to support different types of devices having different form factors, to support different types of devices having different electrical interfaces, to support different types of devices having different thermal requirements, to support different types of devices having different physical interfaces, to support different types of devices having different wireless functionalities, and/or to support different types of devices having electro-mechanical interfaces. Accordingly, arrays or groups of test sockets may differ across different packs or across rows or other subsections of the same pack.

Figure 34:
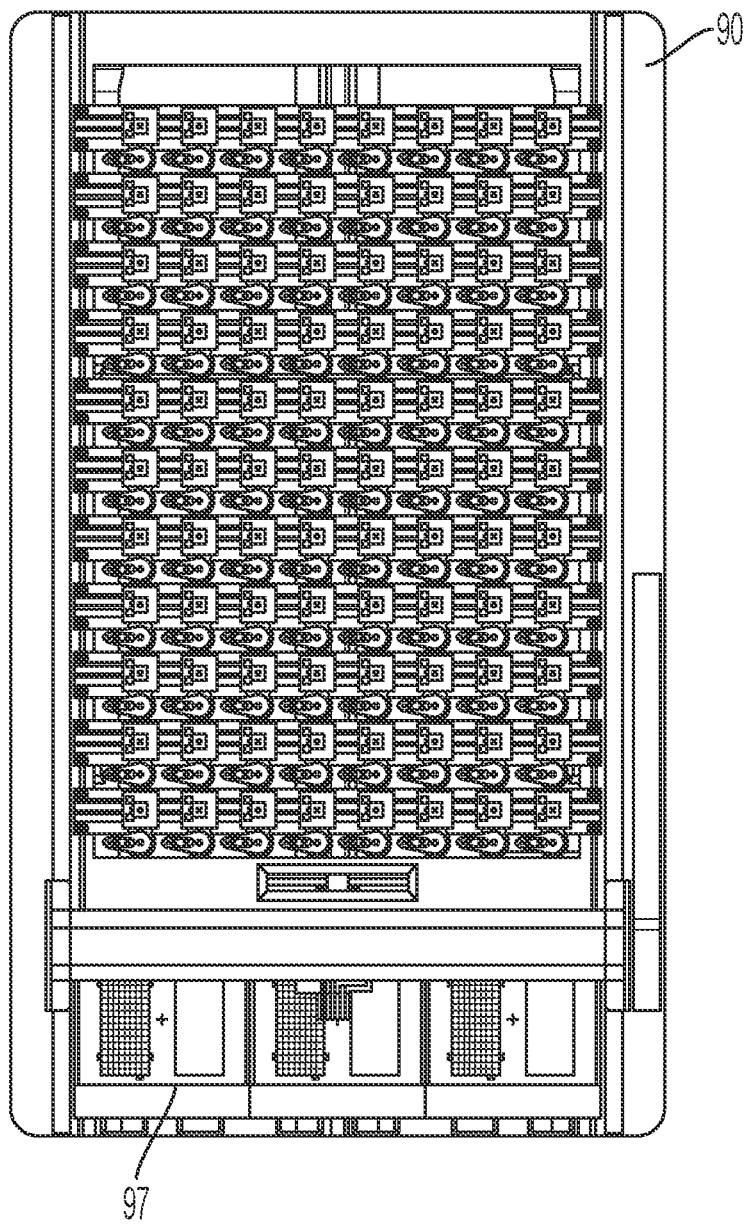
FIG. 34 is a top view of an example arrangement of test sockets on a pack.
Figure 35:
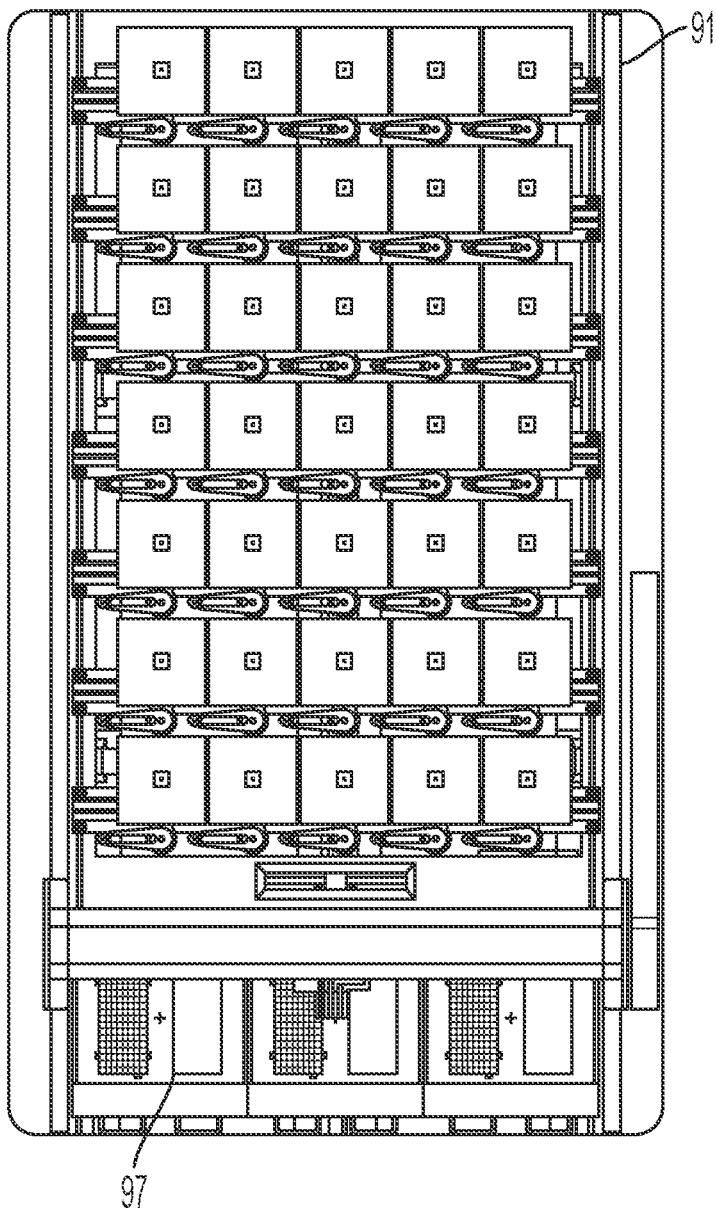
FIG. 35 is a top view of an example arrangement of test sockets on a pack.

By way of example, FIGS. 34 and 35 show test sockets in test packs configured and/or reconfigured to accommodate different sized devices for testing on the test system. In the example of FIG. 34, example test pack 90 is configured to hold test boards (DUTs) that are 130 mm×160 mm in size resulting in a total of 88 test sites containing 88 test sockets. In the example of FIG. 35, example test pack 91 is configured to hold test boards (DUTs) that are 200 mm×250 mm in size resulting in a total of 35 test sites containing 35 test sockets.

As noted, the test electronics on a pack may include, but are not limited to, pin electronics, parametric measurement unit(s), programmable logic, and/or a microcontroller or other processing device(s). The test electronics may execute, or be used to implement, one or more test routines on devices in test sockets contained on the pack. In this regard, in some implementations, the test electronics may be customizable or reconfigurable based on the DUTs to be tested by the pack.

The interface electronics enables connection between a pack and a backplane of the test system. This connection enables communication between the test system and test electronics on the packs. Example protocols that may be supported on the connections include, but are not limited to, Peripheral Component Interconnect Express (PCIe), Universal Serial Bus (USB), and the Joint Test Action Group (JTAG) standard.

Figure 36:
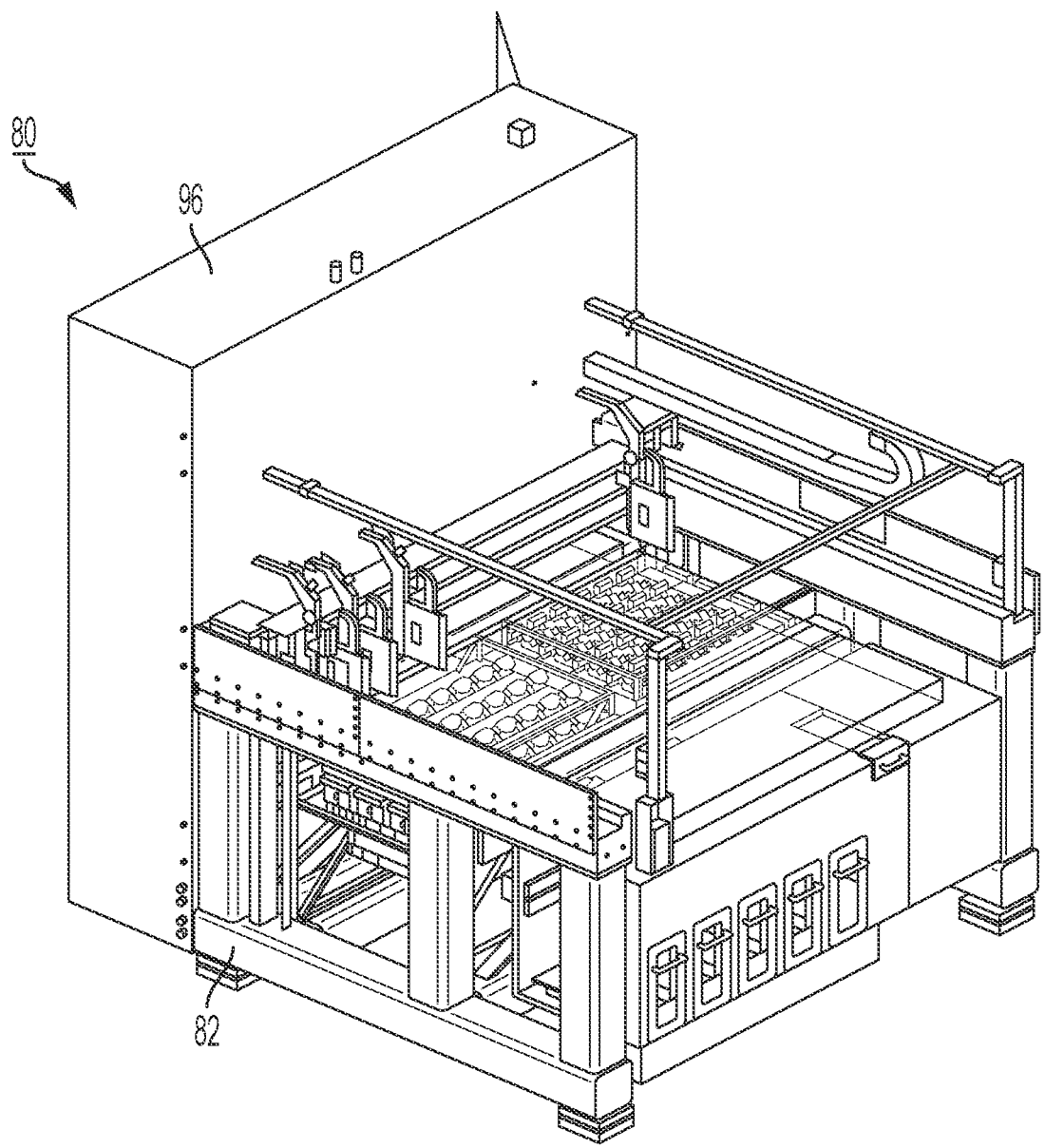
FIG. 36 is a front perspective view of the example test system of FIG. 29 absent its housing and in combination with a service module.
Figure 37:
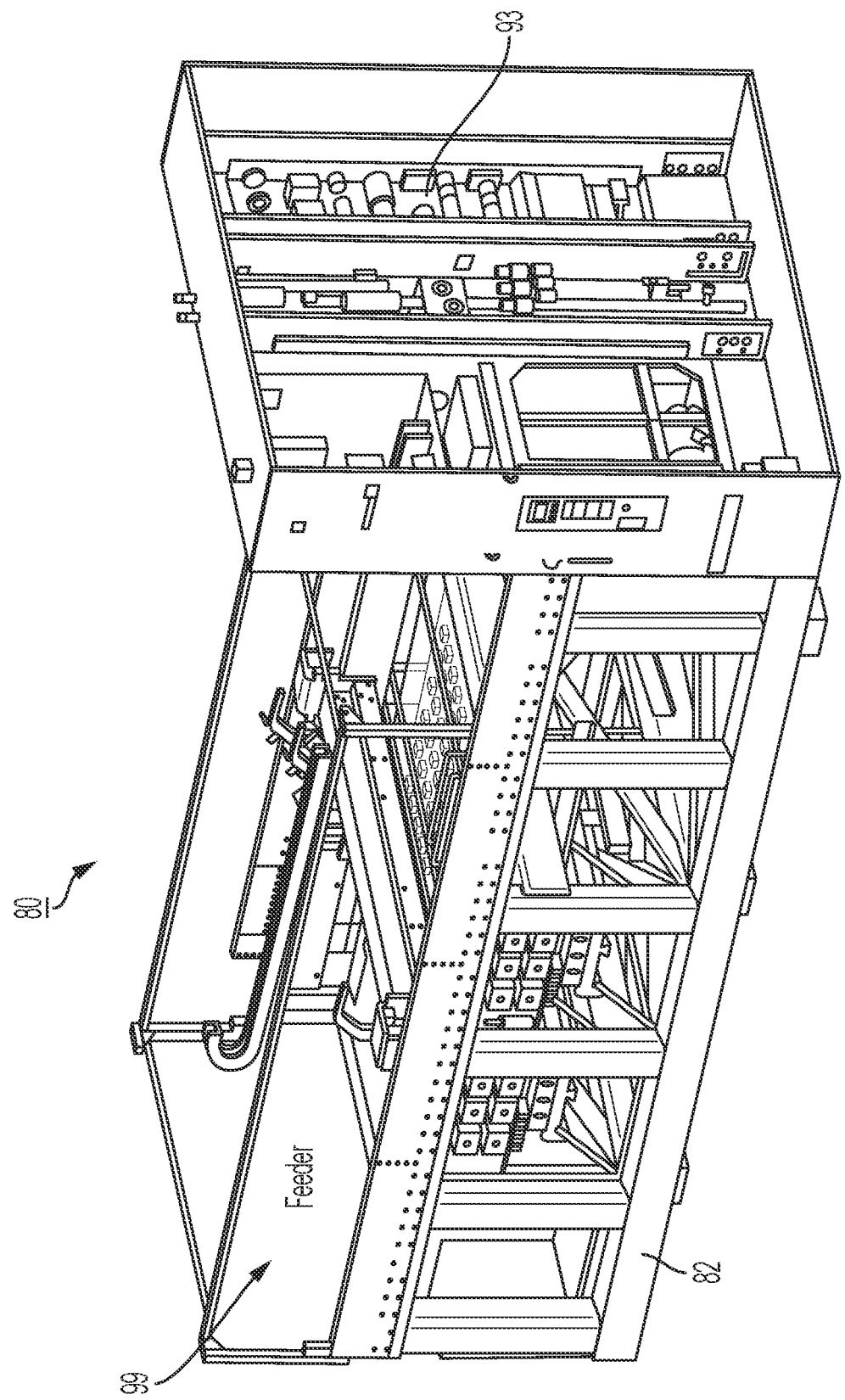
FIG. 37 is a back perspective view of the example test system of FIG. 37 absent its housing and with electronics in the service module exposed.

Referring to FIGS. 36 and 37, example test system 80 may include electronics 93 to enable communication between the packs and/or the DUTs and a control system, to provide power to the various packs, and to control servicing and other functionalities, such as LASER ("light amplification by the stimulated emission of radiation") scanning, image capture, and cleaning described below.

In this regard, test system 80 may include a control system. The control system may include circuitry and/or on-board electronics 93 to control operations of test-system 80. The circuitry or on-board electronics are "on-board" in the sense that they are located within the housing of the test system itself. The on-board electronics may include, for example, one or more microcontrollers, one or more microprocessors, programmable logic such as a field-programmable gate array (FPGA), one or application-specific integrated circuits (ASICs), solid state circuitry, or any appropriate combination of two or more of these types of circuitry or processing devices.

In some implementations, on-board components of the control system communicate with a remote computing system 95 (FIG. 1), which may be part of the control system. This computing system is remote in the sense that it is not located in the housing of the test system. For example, the control system can also include computing resources distributed to a remote location—for example, at a manufacturer's facility—at least a portion of which is not within the test system housing. Connection 94 between the test system on-board components and the remote computing system may be over a computer network, such as an Ethernet network or a wireless network. Commands provide by the remote computing system may be transferred for execution by the on-board electronics. In some implementations, the control system includes only on-board components. In some implementations, the control system includes a combination of on-board components and the remote computing system. In some implementations, the control system may be configured—for example programmed—to implement control functions based at least in part on input from a person. Test results and other information generated by the test system may be stored in computer memory within the housing or they may be transmitted to the remote computing system.

The control system may include a servo controller or servo control functionality to control the position and velocity of the gantry beam and/or the pickers. An example servo controller may operate to regulate the velocities and positions of motors controlling the gantry beam and pickers based on feedback signals. In general, a servo controller executes a servo loop to generate a command to minimize an error between a commanded value and feedback value, such as a commanded velocity and feedback velocity value. The servo controller may also implement position control in addition to velocity control. To implement position control, a position loop may be added in series with the velocity loop. In some implementations, a proportional-integral-derivative (PID) position provides position and velocity control absent a separate velocity loop.

In some implementations, the control system may be implemented in or be part of a service module 96, which is shown in FIGS. 29 and 36. In the example of FIGS. 29 and 36, the service module is connected physically to the frame 82 of test system 80; however, that is not a requirement. In some implementations, service module 96 may include test electronics of the type described herein for performing or assisting in tests performed on devices in the sockets. Service module 92 may also include electronics, such as one or more processing devices, for maintaining the test system. For example, a LASER-based cleaning system may be used to clean the test sockets. Electronics to operate this system may be part of the service module. All or part of the control system described herein may reside in the service module.

As explained previously, devices to be tested and devices that have been tested are stored in trays that are serviced by the pick-and-place robotics. Example trays that may be used include, but are not limited to, Joint Electron Device Engineering Council (JEDEC) trays. In the examples of FIGS. 29 and 37, a feeder 99 is configured to receive trays of tested devices, and to provide trays of untested devices to the test system. In an example, the feeder is configured to pass trays into a support window-frame that promotes tray flatness and to provide a repeatable Z-dimension position of the tray In the example of test system 10 (FIG. 1), there are six trays (see also trays 97 of FIGS. 34 and 35); however, the test systems described herein are not limited to use with six trays. In the example of test system 30 (FIGS. 4 to 28), there are five trays in use; however, the system is not limited to use with five trays. In a six-tray system, a first tray may contain untested devices having a first type and a second tray may contain tested devices having the first type. A third tray may contain untested devices having a second type and a fourth tray may contain tested devices having the second type. A fifth tray may contain untested devices having a third type and a sixth tray may contain tested devices having the third type. In this example, the first, second, and third types of devices are different in at least one respect and are tested using different packs inserted into the test system housing. In some implementations, different trays may be designated for devices that have passed testing and for devices that have failed testing. For example, rather than having a single tray for each type of tested device, there may be two trays for each type of tested device—one tray to hold devices that have passed testing and one tray to hold devices that have failed testing, along with one tray for holding devices of the type that have not yet been tested. In some implementations, there may be more than one feeder to move trays into and out of the system and the number of trays may be different. The feeders may be loaded and unloaded manually or using automation (not shown) that connects to the test system.

The pickers described herein, such as pickers 31, may include linear magnetic motors that allow their arms to extend or to retract relative to a test socket. Each picker may include a picker nozzle that is configured to hold a device to be tested or a device that has been tested for transport between the trays and the sockets. In an example, there are six pickers configured to pick-up from one to six devices concurrently from a tray or a socket array. In other examples, however, there may be more than six pickers or fewer than six pickers. The number of pickers in the test system is scalable—for example, one or more pickers may be added to, or removed from, the test system. For example, the number of pickers may be scalable based on characteristics of the packs and on characteristics of the test sockets in the packs. For example, if a pack contains 12 test sockets in a row, the number of pickers may be a factor of 12. In this regard, the pick-and-place automation, such as the number of pickers, can be configured differently depending on DUT test time—different DUT types can take different time to test. Automation configuration does affect maximum throughput in some implementations. For example, if the automation is configured with more pickers, a maximum number of DUTs that can move through the test system per hour will be greater.

Figure 38:
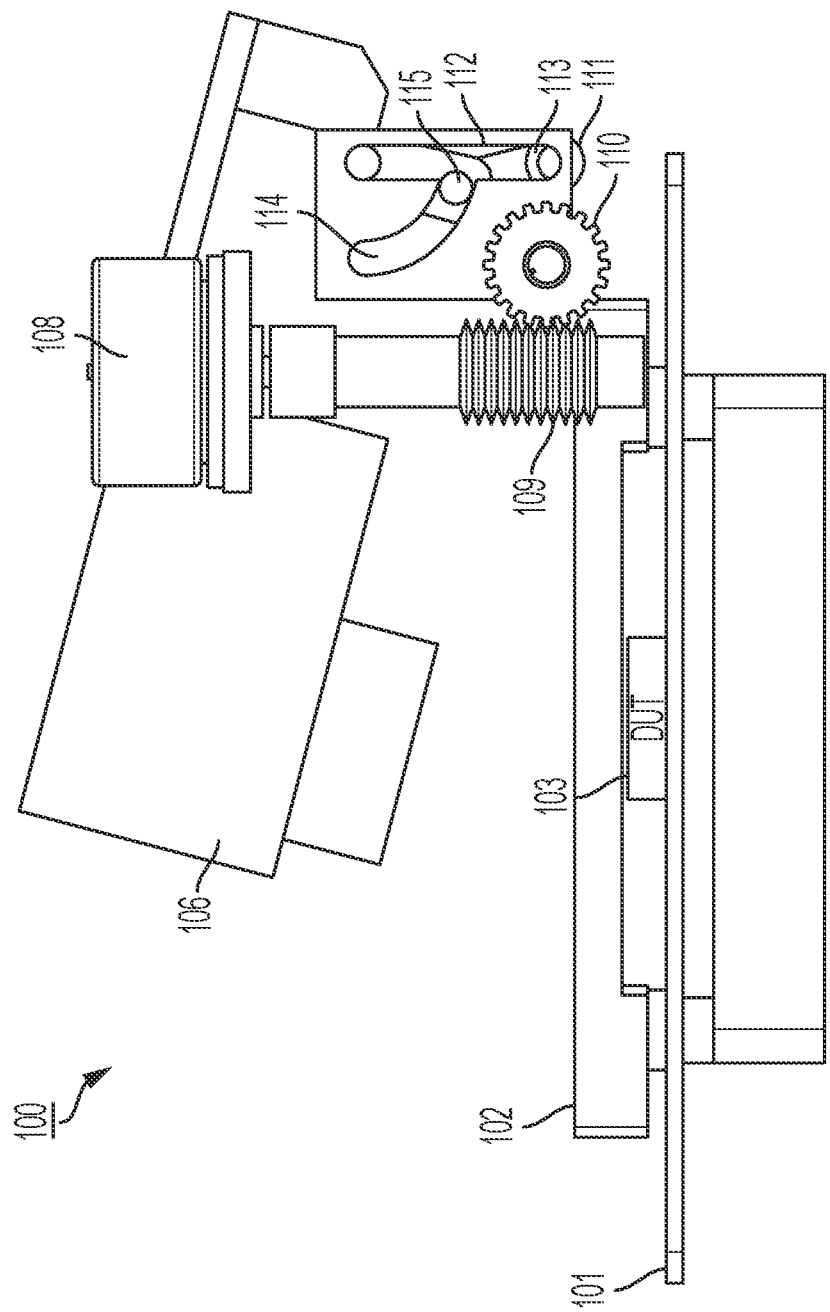
FIG. 38 is a side view of an example test socket having an automated lid.
Figure 39:
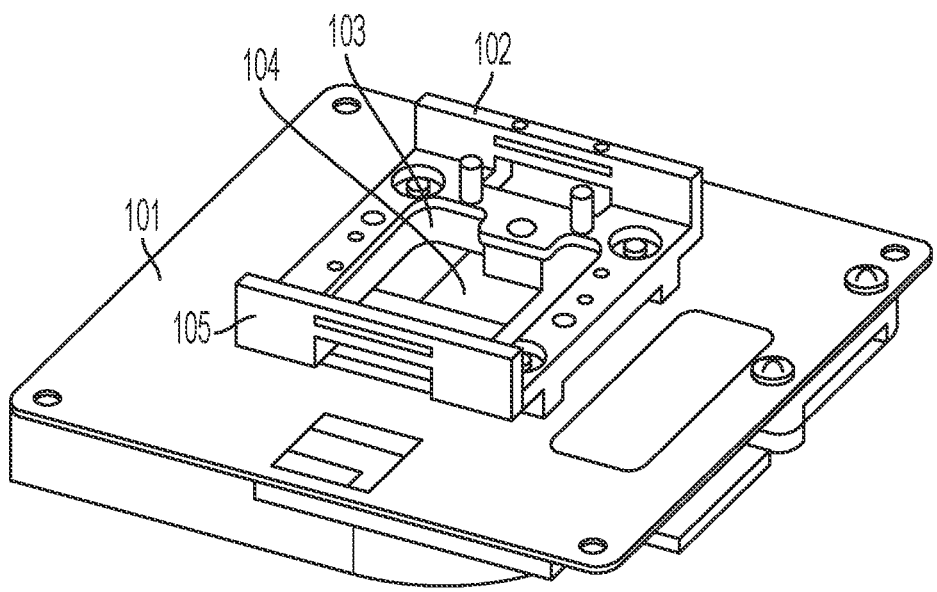
FIG. 39 is a perspective view of a receptacle in an example test socket.
Figure 40:
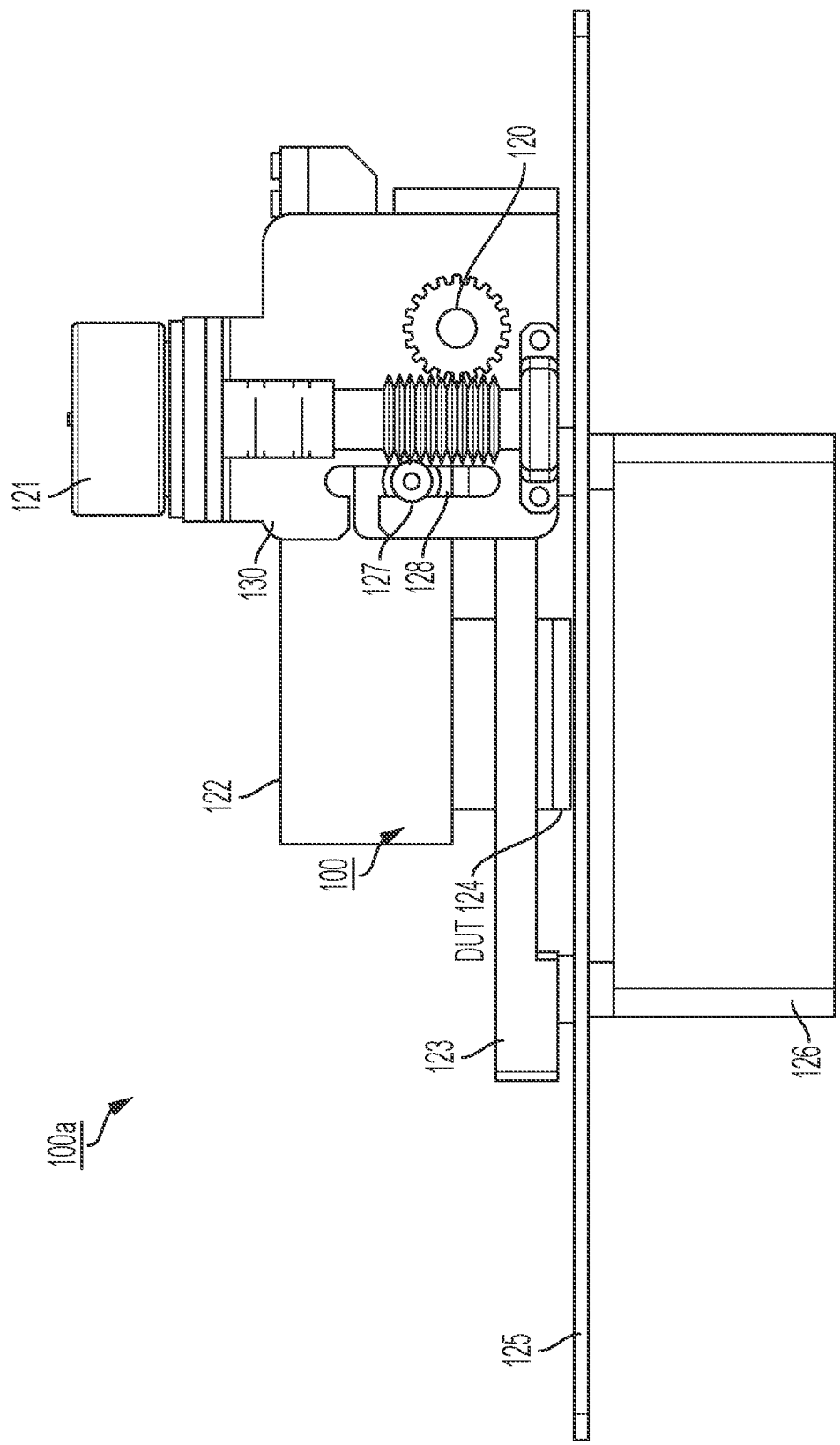
FIGS. 40 to 48 are side views showing operation of an example test socket having an automated lid.

FIG. 38 shows an example implementation of a test socket 101 ("socket") and components thereof that is configured to open automatically while a picker moves towards the test socket—for example to place an untested DUT in the test socket or to retrieve a tested DUT from the test socket—and to close automatically following placement of a DUT the test socket. Example socket 100 includes a receptacle 102 to make electrical and mechanical connections to a DUT. In this example, the receptacle mounted on a printed circuit board (PCB) 101. As shown in FIG. 39, a receptacle 102 containing electrical and mechanical connections is mounted on PCB 101 which, in turn, is mounted on a corresponding pack. Receptacle 102 may have a dual frame structure, with a first frame 103 containing an array 104 of electrical contacts that the DUT mates to electrically and a second frame 105 to mount the first frame 103 on PCB 101.

Referring back to FIG. 38, a DUT 103 is inserted into receptacle 102 during testing as descried herein. Socket 100 includes a lid 106 that is controllable to open or to close automatically based on movement of the gantry and pickers. Lid 106 is controllable to open automatically to enable receipt of DUT 103 in the receptacle and, following receipt of the DUT, to close automatically to cover DUT 103 in the receptacle, as described herein. As also described herein, closing the lid 106 includes applying clamping force to the DUT to complete the electrical and mechanical connections between the test socket and the DUT. In this regard, as explained with respect to FIGS. 40 to 48, the lid is controlled to automatically move perpendicularly to the receptacle for a distance (FIG. 41) and to automatically pivot relative to the receptacle above that distance (FIG. 42). The perpendicular, or vertical, movement in this example is implemented in order to apply relatively even downward pressure or clamping force from lid 106 across the top of the DUT when making the mechanical and electrical connections between the receptacle and the DUT. The pivoting movement is implemented in order to move lid away from the receptacle—for example, out of the way of the pickers—so that the receptacle is exposed and accessible to the pickers. That way, a picker can insert an untested DUT into the receptacle or retrieve a tested DUT from the receptacle without the lid blocking the picker's access to the receptacle.

As shown in FIG. 38, socket 100 includes an actuator 108. Actuator 108 is controllable to open and close the lid; for example, to move the lid perpendicularly to the receptacle or DUT and to pivot the lid relative to the receptacle or DUT as described previously. Examples of actuators that may be used include, but are not limited to, a hydraulic actuator or a pneumatic actuator The actuator may be or include a motor (not shown) and helical worm screw 109. A gear 110 is connected to the actuator, in this example to helical worm screw 109. A plate 111 is connected to the gear. Plate 111 includes a track 112 having a first branch 113 that extends perpendicularly to the receptacle 102 (and DUT 103 in this example) and a second branch 114 that extends obliquely relative to the receptacle (and DUT 103 in this example). Lid 106 also includes a roller 115. Actuator 108 is controllable to move the roller along first branch 113 to move lid 106 perpendicularly to the receptacle (and DUT 103 in this example) and to move roller 115 along second branch 114 to pivot lid 106 relative to the receptacle (and DUT 103 in this example).

In an example operation, the actuator controls the gear to rotate and move along helical worm screw 109 in order to implement the perpendicular motion up to a distance above the receptacle, which distance may be measured in single-digit millimeters or low-single-digit centimeters in some examples. During this motion roller 115 moves along first branch 113 of plate 111. Once the appropriate distance above the receptacle is reached as shown in FIG. 38, the actuator controls lid 106 to pivot relative to the receptacle. For example, lid 106 may be pivot along roller 115, which may act as a hinge for lid 106. The pivoting movement causes the lid to move angularly outwards away from the receptacle, leaving the receptacle and, in this example DUT 103, exposed for access by a picker. During this pivoting movement, in this example, roller 115 travels along second branch 114.

Reverse operations are performed in order to force the lid onto the socket—for example, to create the mechanical and electrical connections between the DUT and the socket. As explained previously, the perpendicular motion downward toward the socket is made to apply clamping force evenly to the lid to make the create the mechanical and electrical connections between the DUT and the socket. During testing, the lid is kept on the socket with appropriate force to maintain the mechanical and electrical connections between the DUT and the socket. The lid is removed after testing or at other times in some cases, for example, if testing is interrupted and ends.

Figure 41:
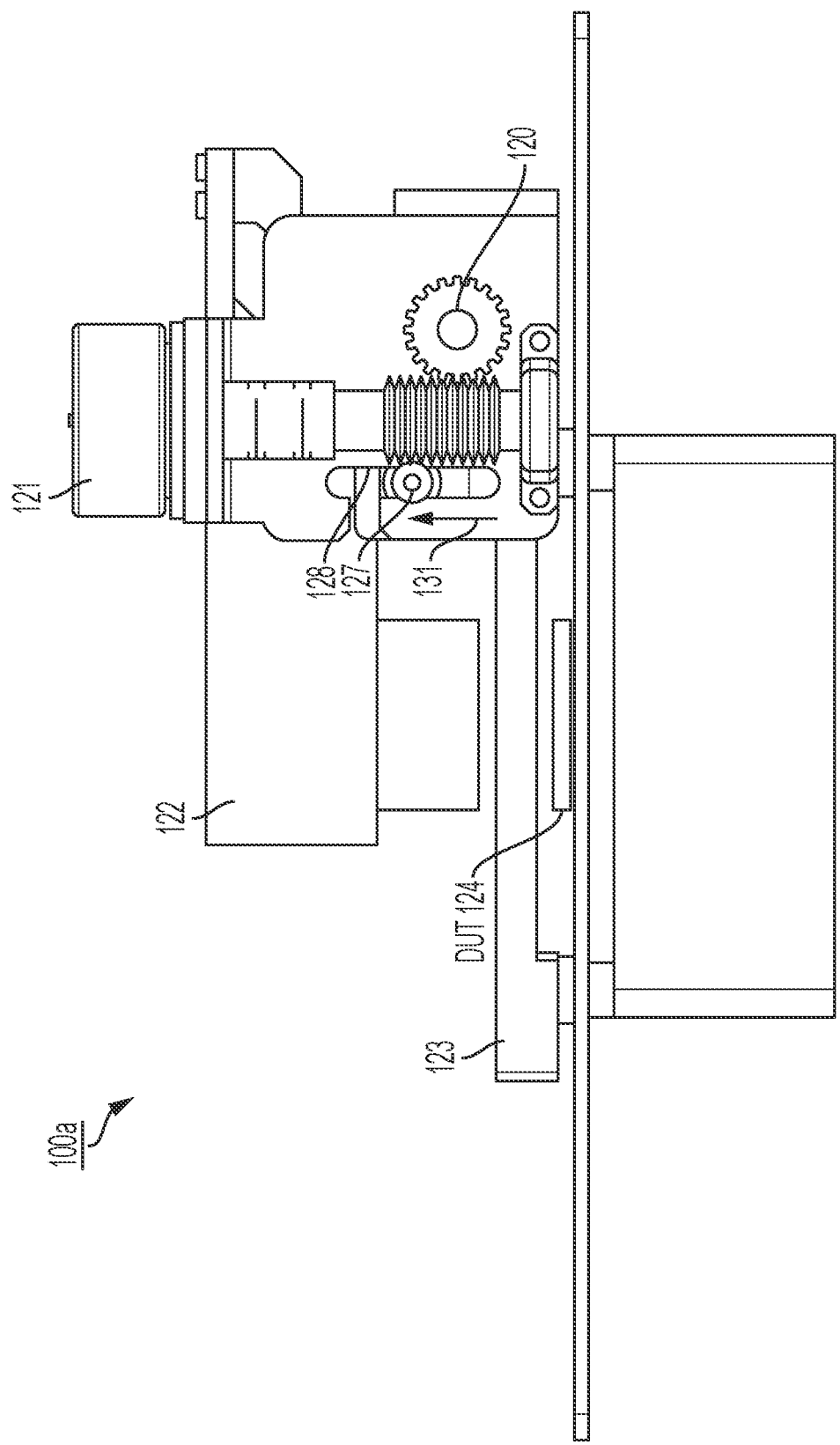
Figure 42:
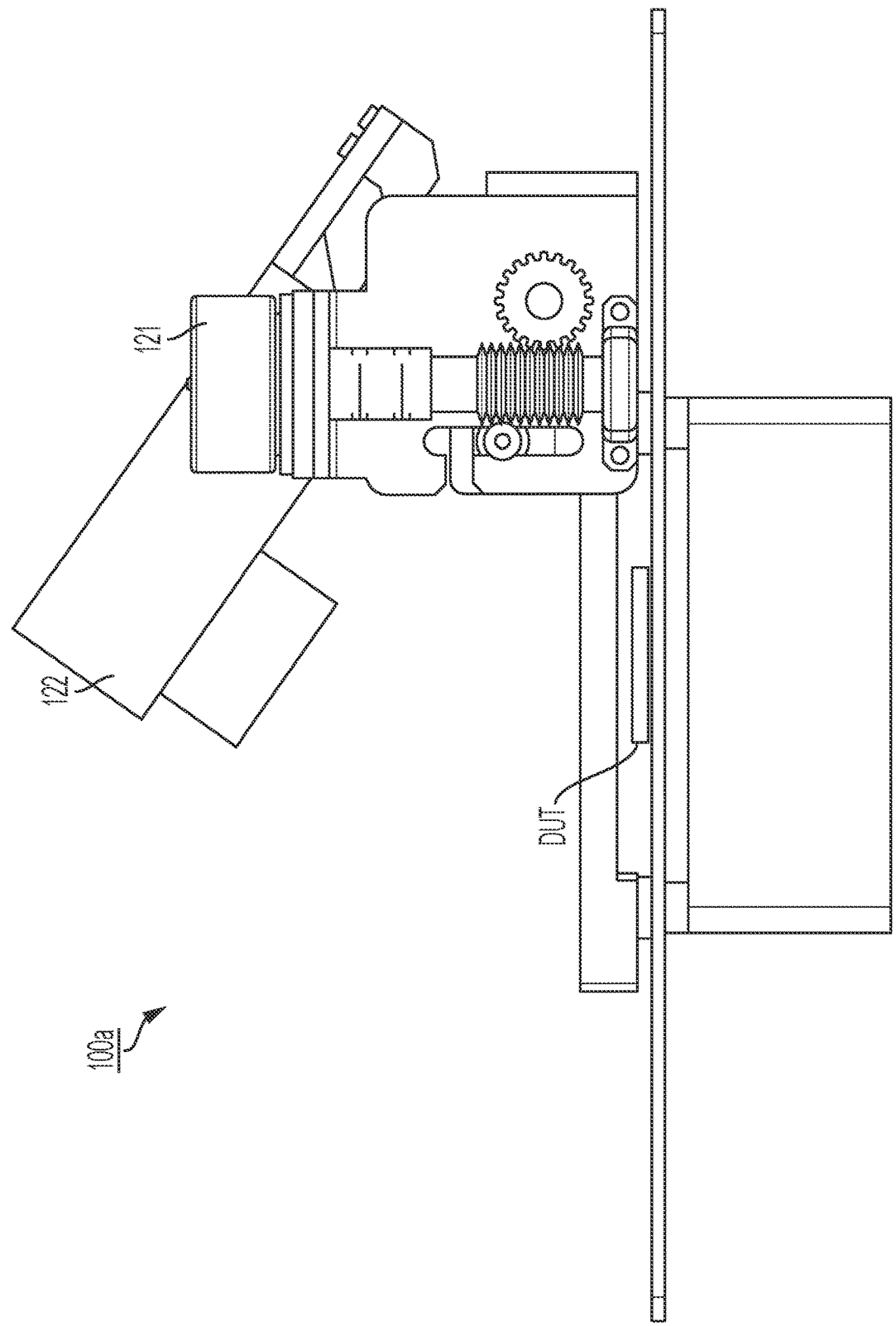
Figure 43:
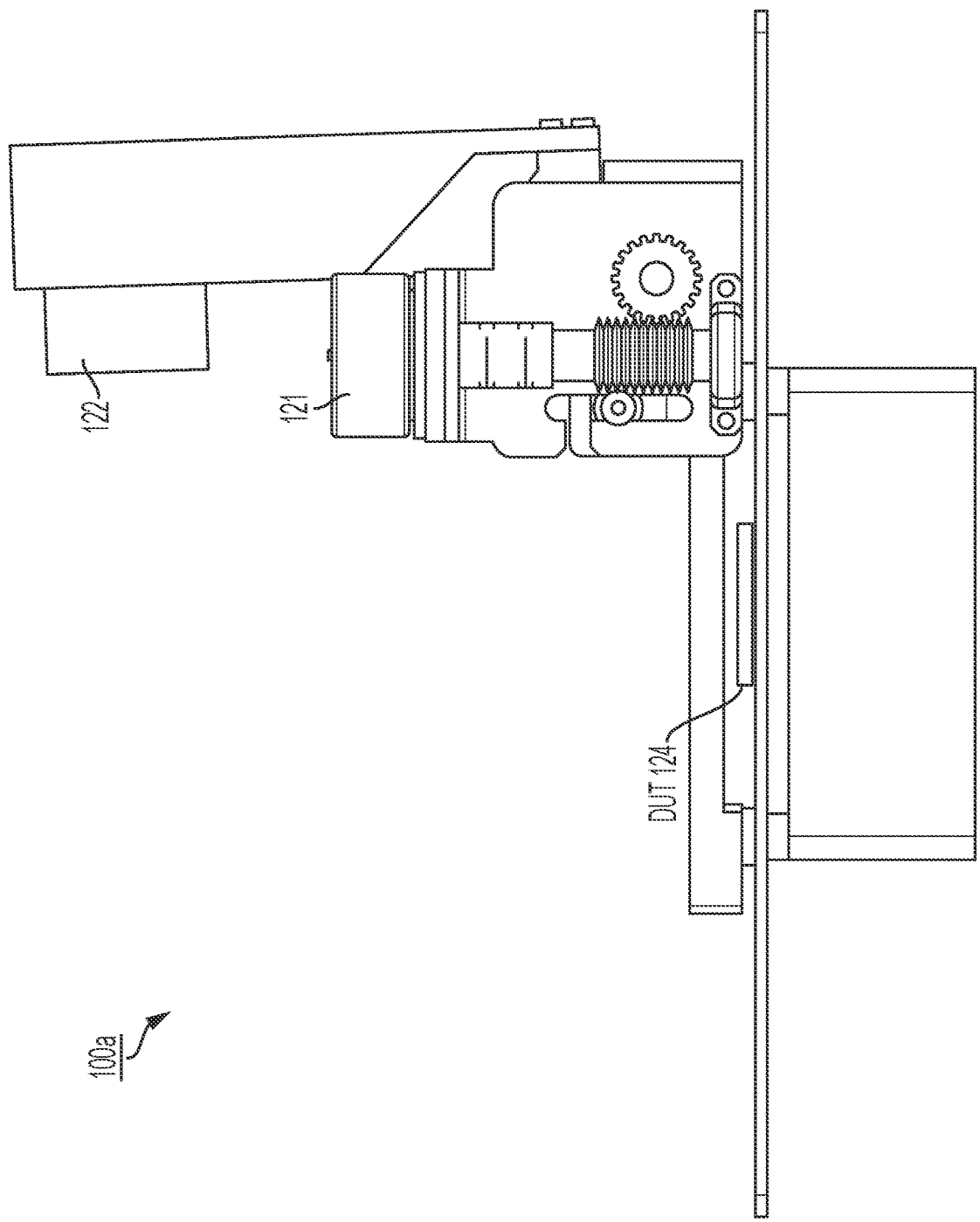

FIGS. 40 to 48 show example operations of a variant 100a of socket 100 of FIG. 38. In the example of 40, gear 120 is controllable by actuator 121 to move lid 122 perpendicularly—or vertically relative to—a receptacle 123 containing DUT 124 and then to pivot relative to the receptacle. Receptacle 123 is mounted to PCB 124, which itself is mounted on part 126 of a pack As was the case in FIG. 38, a roller 127 connected to lid 122 moves along track 128 in plate 130 to implement the perpendicular motion. In this example, in FIG. 40, testing has completed, so lid 123 is moved up and away from DUT 124. In FIG. 41, lid 122 is move perpendicularly or vertically relative to DUT 124 and receptacle 123. Both gear 120 and roller 127 are connected to lid 122. Accordingly, actuator 121 causes gear 120 to turn counterclockwise, which cause roller 127, and thus lid 122 to move upwards in the direction of arrow 131 along track 128. This upward motion continues for predefined distance, which distance may be measured in single-digit millimeters or low-single-digit centimeters as noted. At some point, actuator 121 controls lid 122 to pivot, as shown in FIG. 42. In this example, lid 122 may pivot along a hinge or other structure not shown in FIG. 42. Actuator 121 controls lid 122 to pivot further as shown in FIG. 43 so that DUT 103 is fully exposed.

Figure 44:
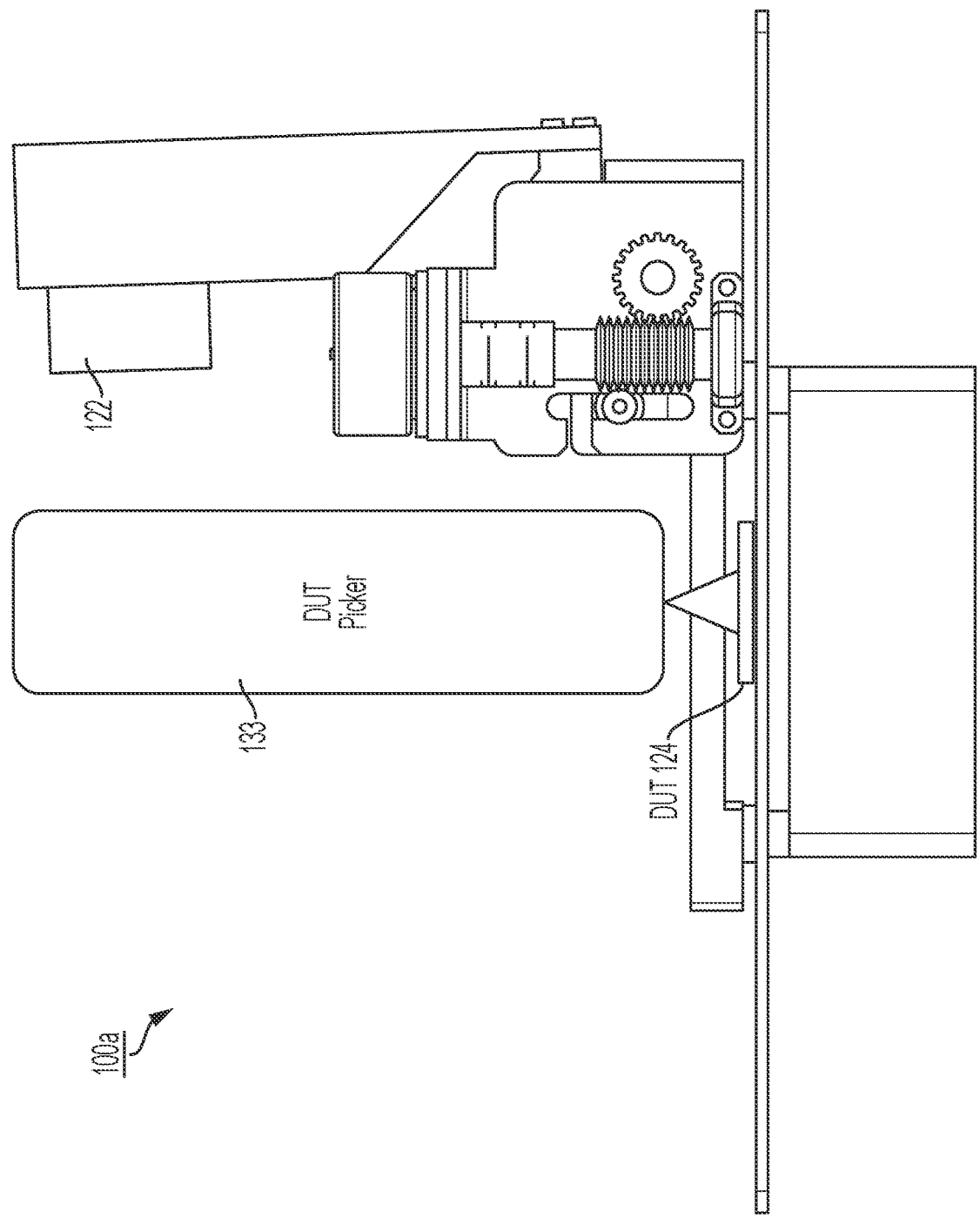
Figure 45:
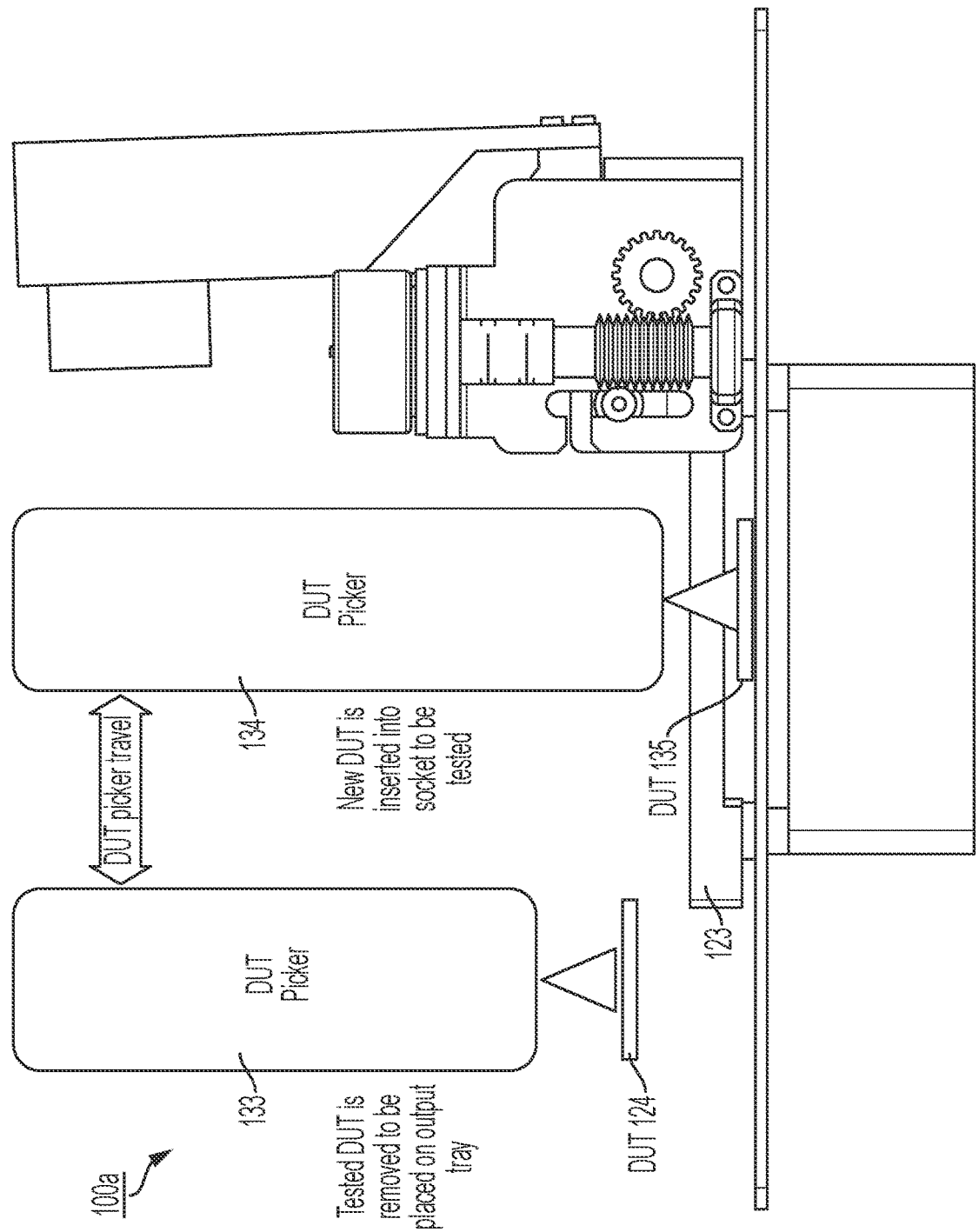
Figure 46:
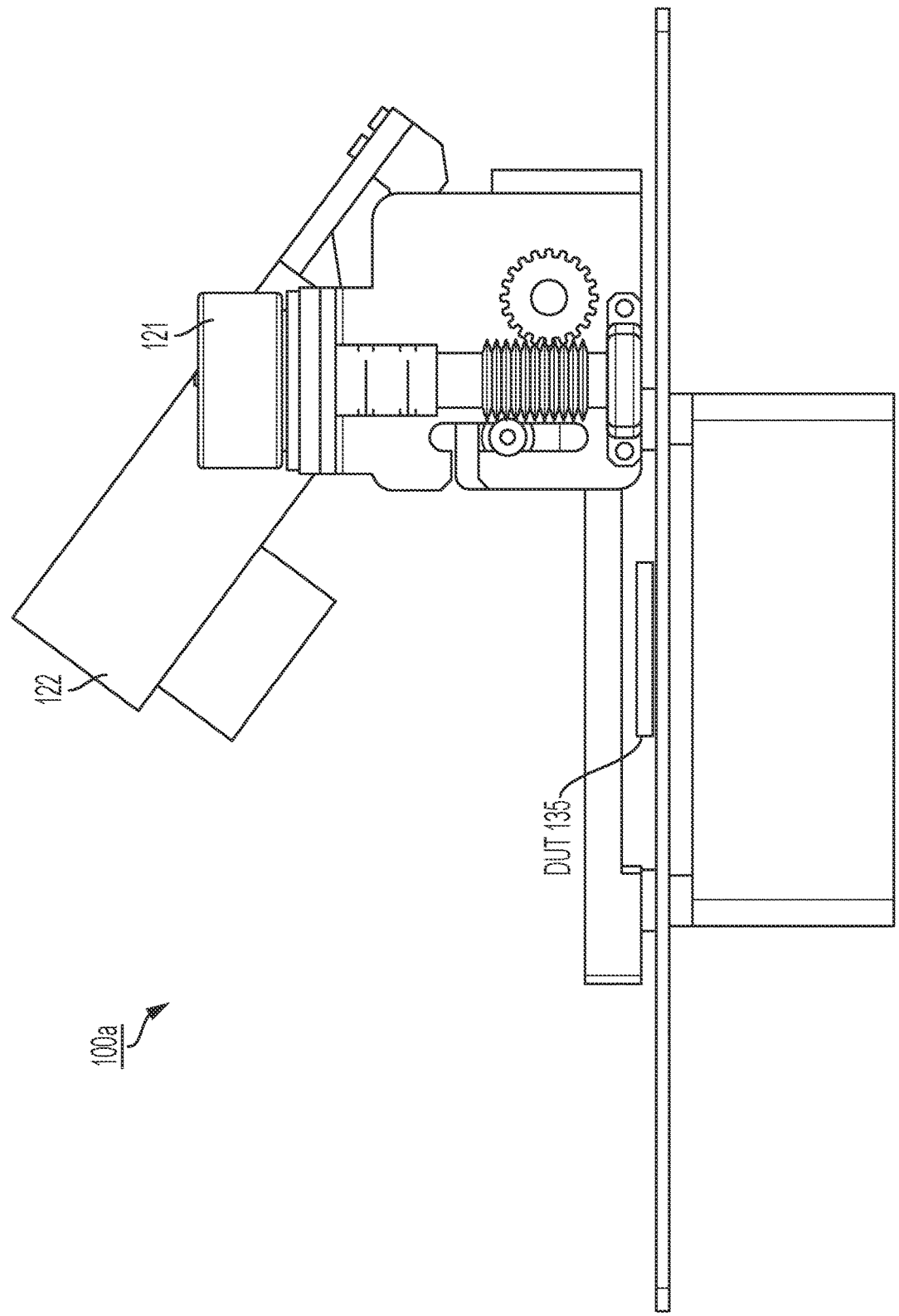
Figure 47:
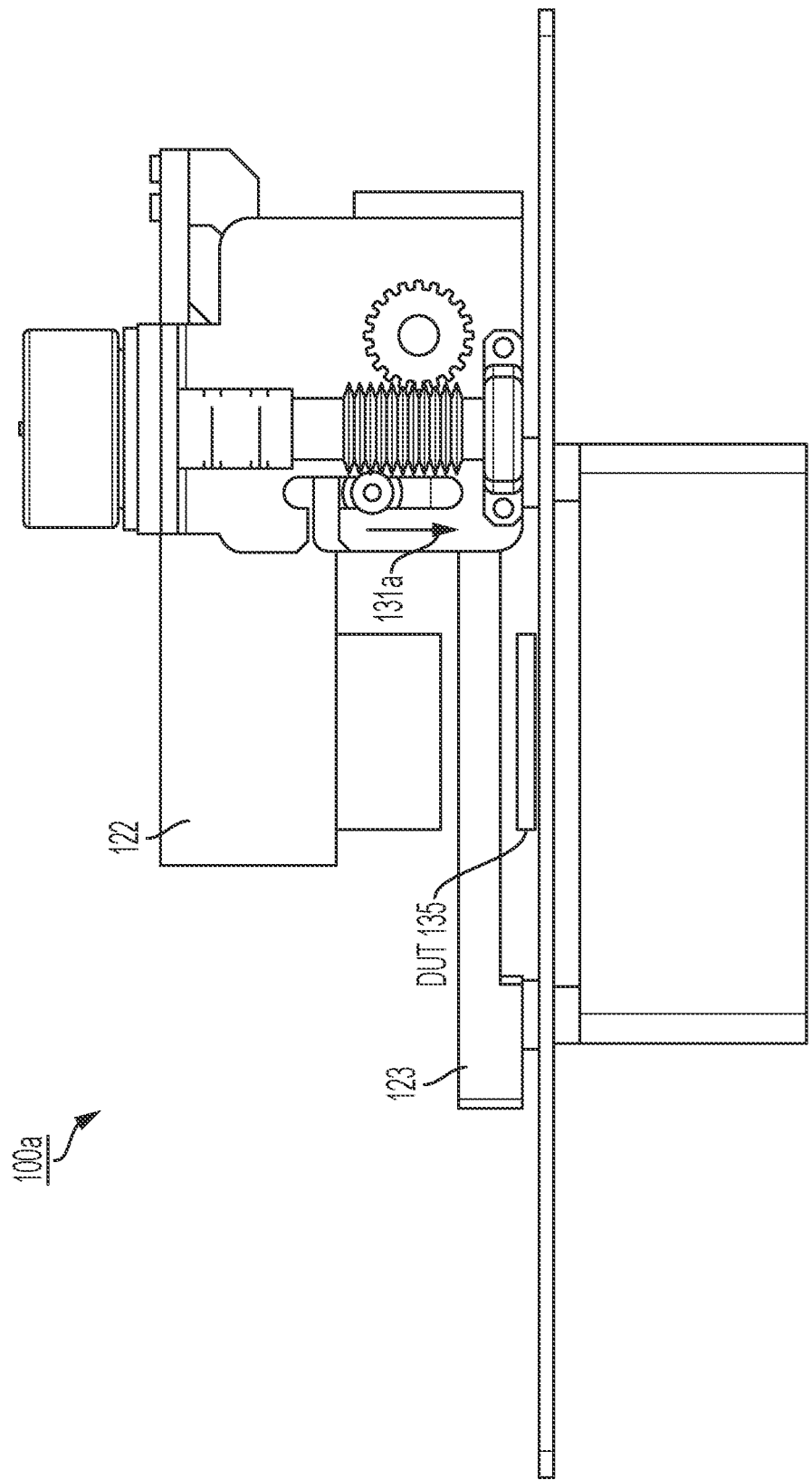
Figure 48:
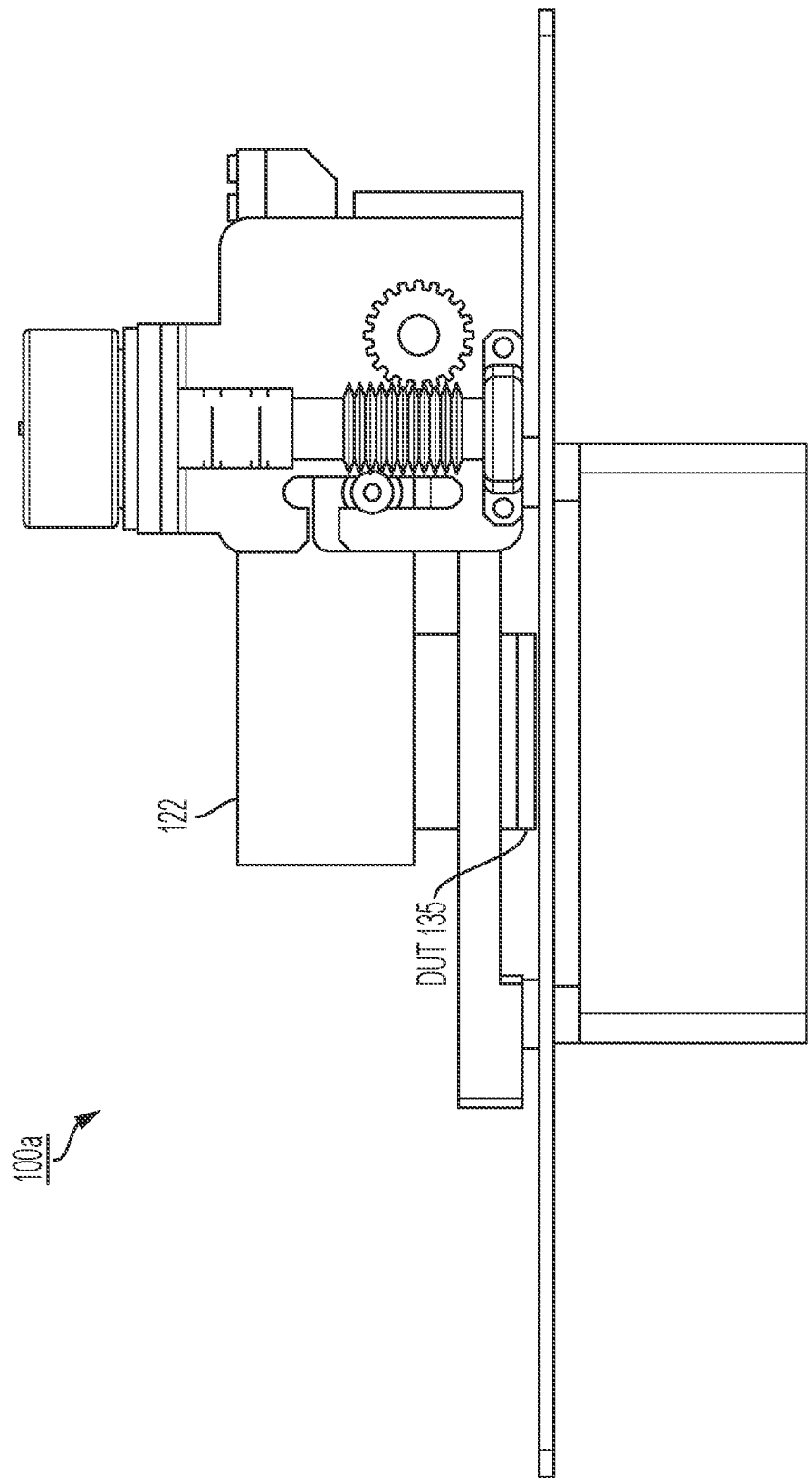

In this example sequence of operations, DUT 124 is a tested DUT that is to be retrieved by a picker and replaced with an untested DUT in the test socket. As described previously, movements of the lid and pickers are coordinated so that the lid is opened when the picker arrives at the receptacle. Accordingly, as shown in FIG. 44, in this example picker 133 moves into place to retrieve DUT 124 following its testing. In FIG. 45 picker 133 moves DUT 124 from receptacle 123 in test socket 100a and picker 134 places an untested DUT 135 in receptacle 123. Thereafter, both pickers 133 and 134 move away from the test socket, as shown in FIG. 46. During this movement away by pickers 133 and 134, actuator 121 controls lid 122 to move into place over untested DUT 135. In FIG. 46, actuator 121 pivots lid over the location of the DUT. In FIG. 47, after the pivoting motion, lid 122 is moved perpendicularly to DUT 135 and receptacle 123 in the direction of arrow 131a so as to apply even or relatively even clamping force to the DUT for testing. This movement is as described previously. In FIG. 48, lid 122 is in place for testing. Lid 122 may remain in that configuration until DUT 135 is tested.

Figure 49:
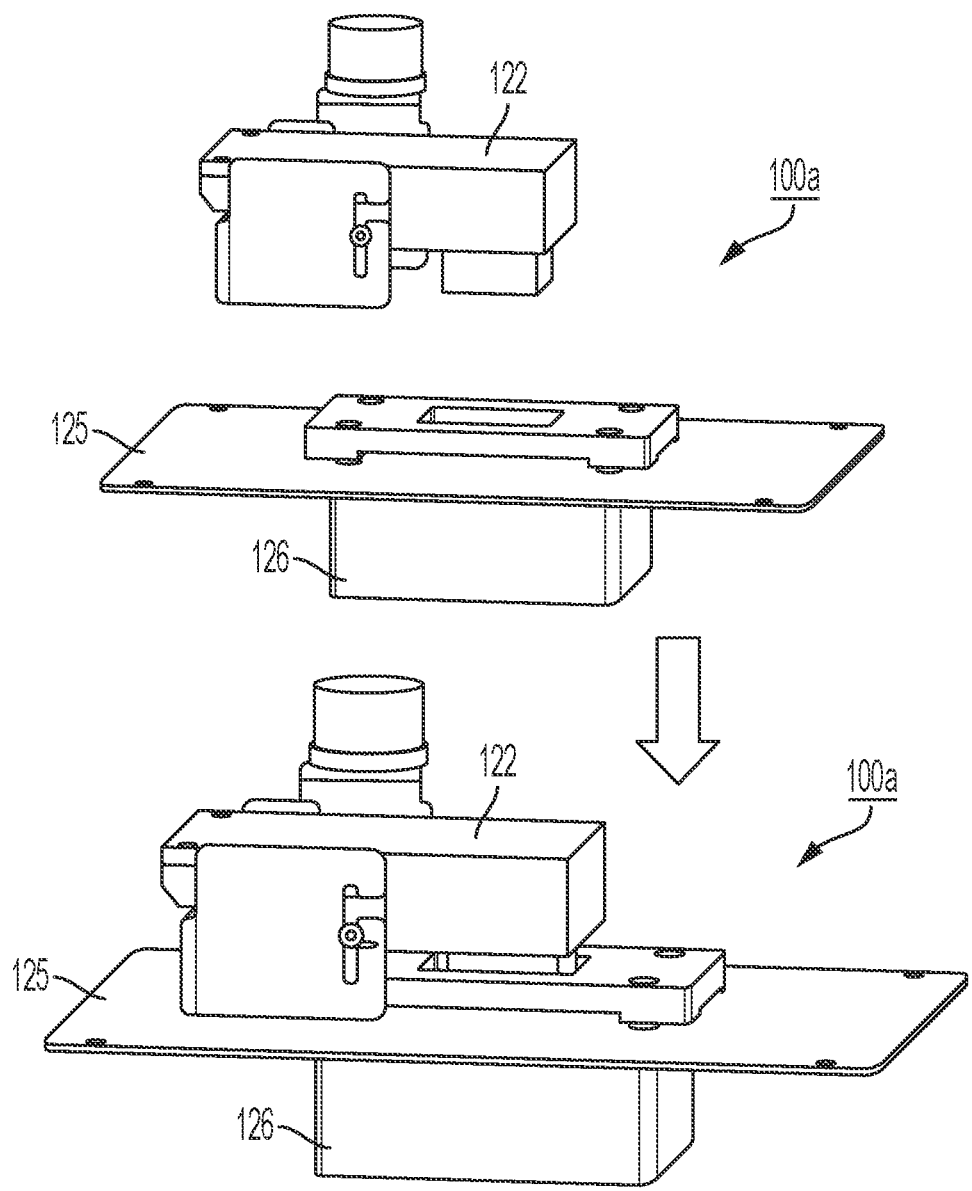
FIGS. 49 and 50 are perspective views showing the example test socket of FIGS. 40 to 48 mounted in different orientations on a printed circuit board.
Figure 50:
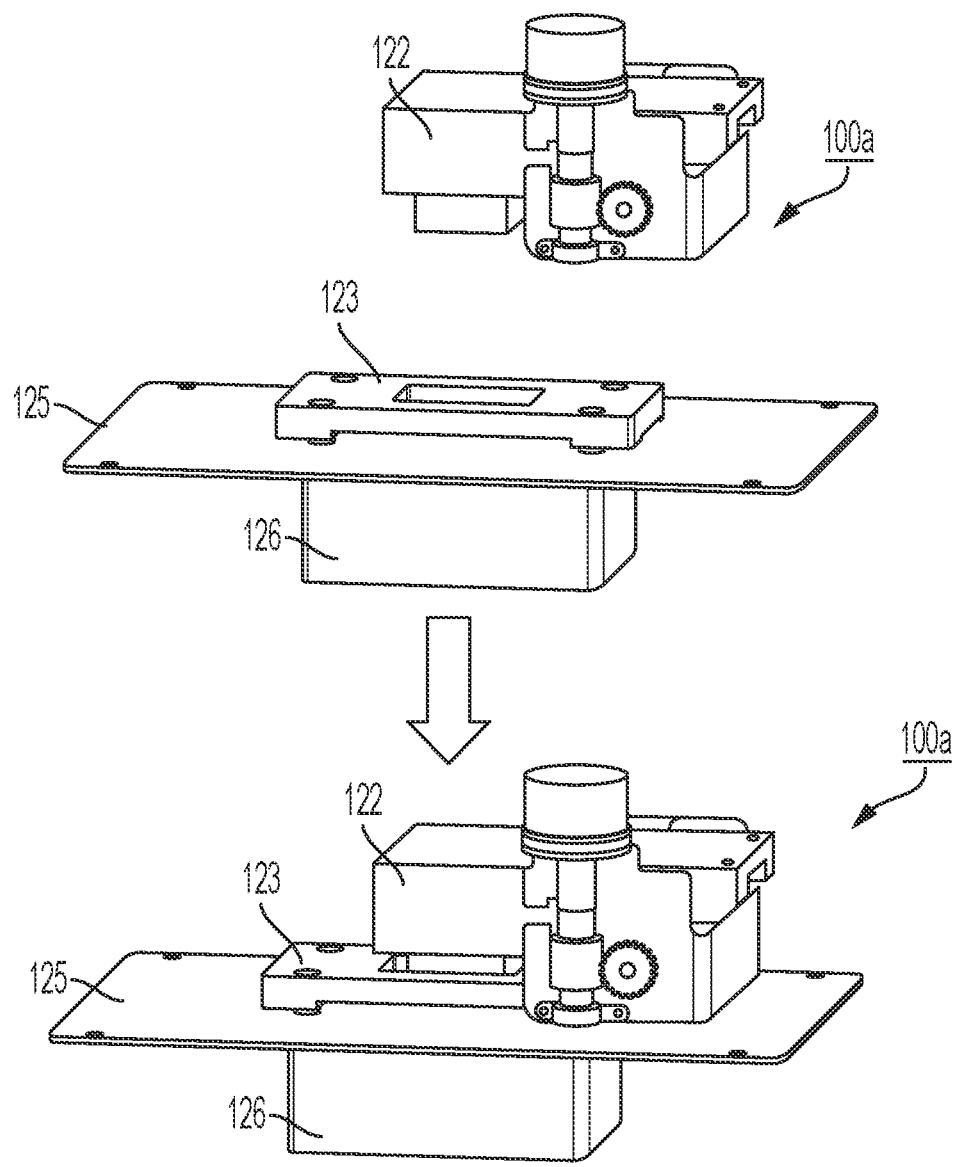

FIG. 49 shows an orientation of lid 122 and associated components of socket 100a arranged relative to receptacle 123 on PCB 125 mounted on a part 126 of a pack. FIG. 50 shows a different orientation than FIG. 49 of lid 122 and associated components of socket 100a arranged relative to receptacle 123 on PCB 125 mounted on a part 126 of a pack. Thus, lid 122 and its associated control components may be mounted at any appropriate orientation, including orientations not described herein.

FIGS. 51 to 57 show another example implementation of a test socket 100b having a lid that opens and closes automatically in coordination with operation of the gantry and pickers described previously. Some components of these figures are shown as transparent for illustration, but are may not be transparent in actual operation.

Figure 51:
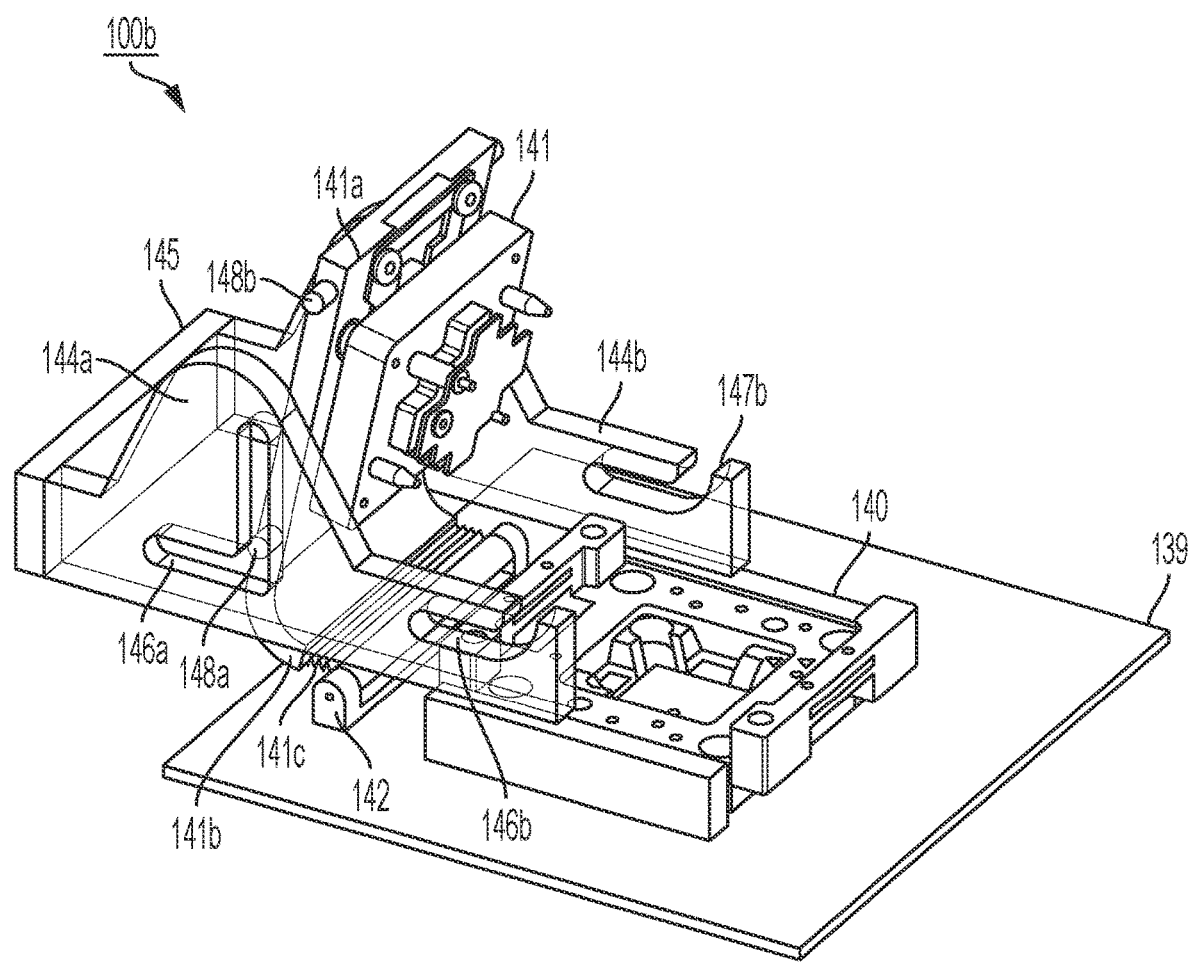
FIGS. 51 to 56 are perspective views showing operation of another example test socket having an automated lid.

Referring to FIG. 51, socket 100b is mounted on PCB 139 and includes a receptacle 140 and a lid 141. Lid 141 is mounted on a hinge 142 that enables lid 141 to pivot at oblique angles relative to receptacle 140. Lid 141 may be made of metal or other appropriate material and has a top 141a that covers the DUT and an arm 141b that connects to hinge 142. Arm 141b includes a metal bellows 141c or other appropriate accordion-like structure that is configured to compress in response to applied force and to expand absent applied force as described below.

Socket 100b also includes a single first plate 144a on a first side of lid 141 and a single second plate 144b on a second side—for example, an opposite side—of the lid. These first and second plates may be identical in construction and function. The plates are physically connected at one end of each plate to panel 145. First plate 144a includes first tracks 146a and 146b and second plate 144b includes second tracks 147a and 147b. Track 146a on plate 144a, and its corresponding track 147a (partially visible in FIG. 52) on plate 144b each includes an angular bend—for example, to create a right-angled track 146a, 147a— to enable vertical and pivoting movement of lid 141. Track 146b and its corresponding track 147b each includes an angular bend to enable movement of the lid, as described below. Lid 141 includes two sets of identical rollers on each of its sides—only rollers 148a and 148b on the plate 146a side of lid 141 are visible in the figures. Roller 148a moves along track 146a and roller 148b moves along track 146b as described below in the following figures. Corresponding rollers on the opposite side of lid 141 move their corresponding tracks.

Figure 56:
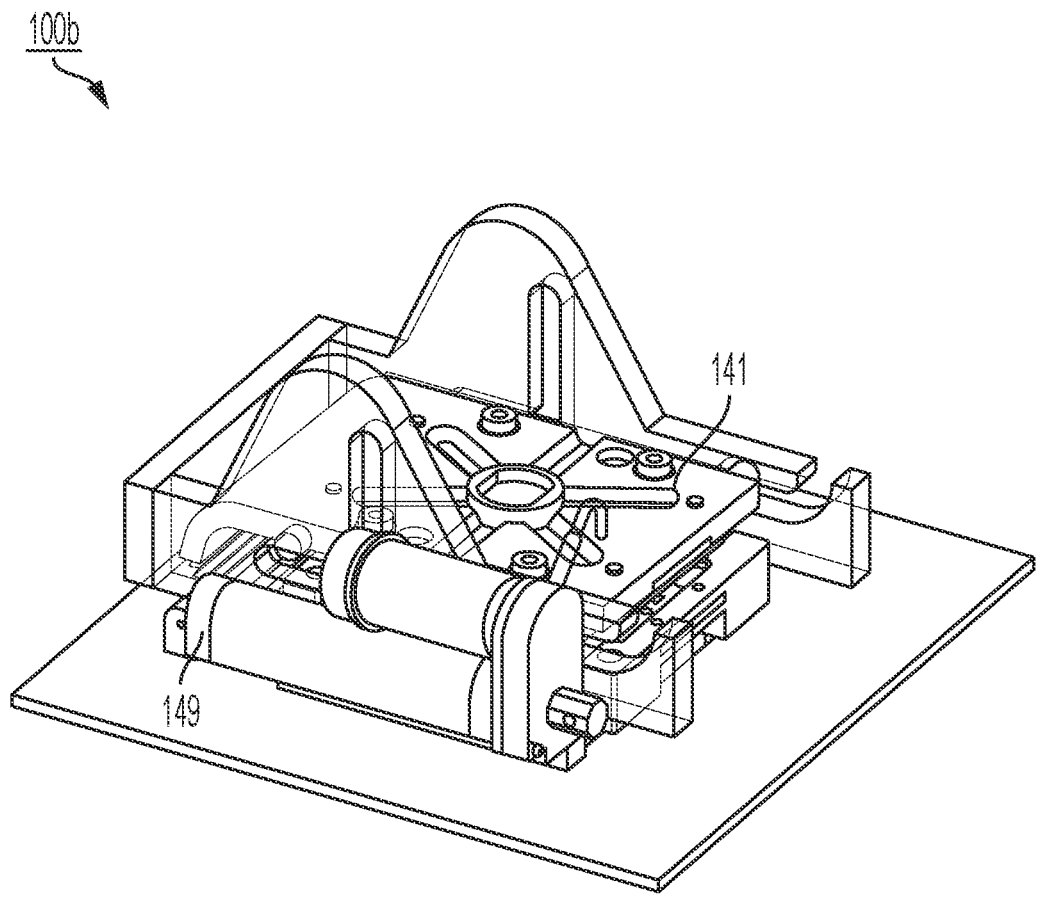

FIGS. 51 to 55 show operation of test socket 100b. In this example, no DUT is shown; however, in this sequence of operations, movements of the lid and pickers are coordinated so that the lid is opened when the picker arrives at the receptacle and so that the lid closes when the picker moves away. The movements described with respect to FIGS. 51 to 55 may be implemented using one or more actuators of the type described herein and/or one or more motors. An example of an actuator or motor 149 that may be used is shown in FIG. 56. Although only one actuator or motor, in some implementations there is one such actuator or motor on each side of the test socket. The actuator or motor is left out of FIGS. 51 to 55 to illustrate lid operations.

Figure 52:
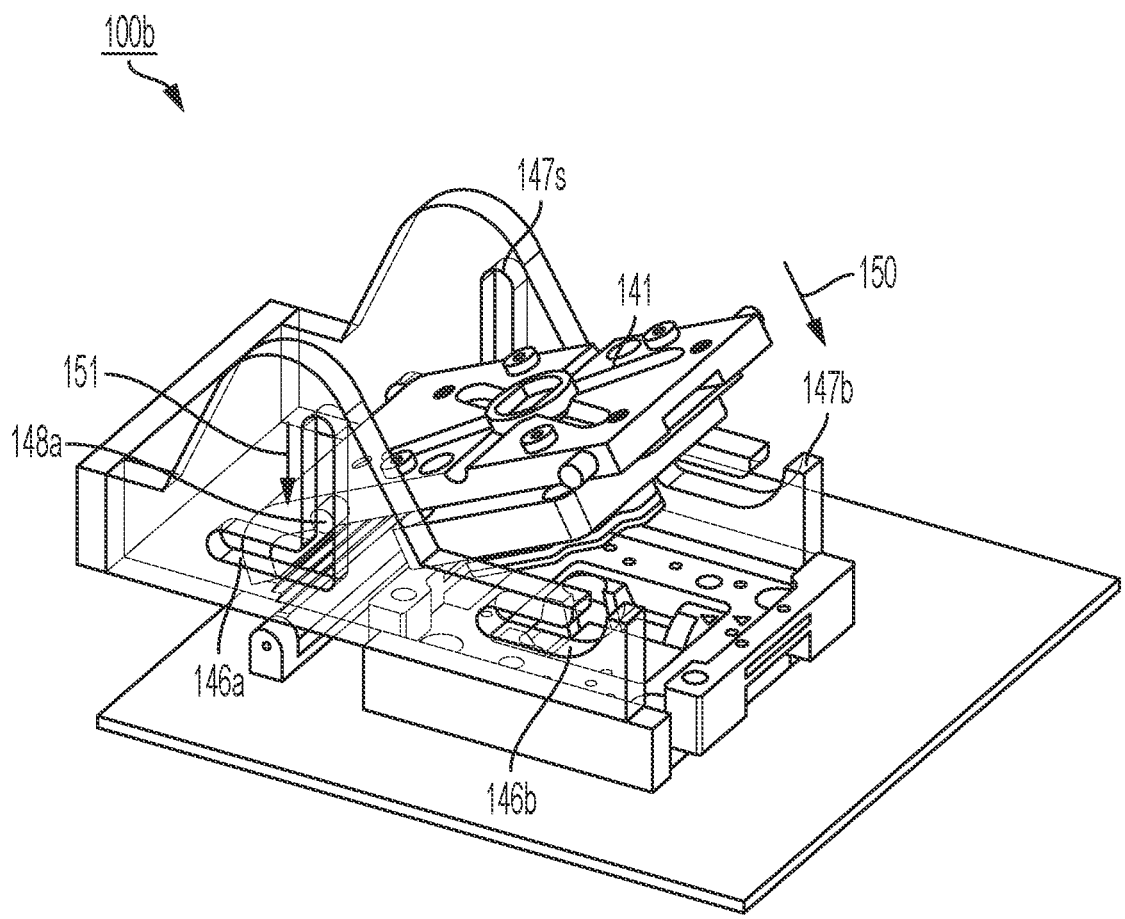
Figure 53:
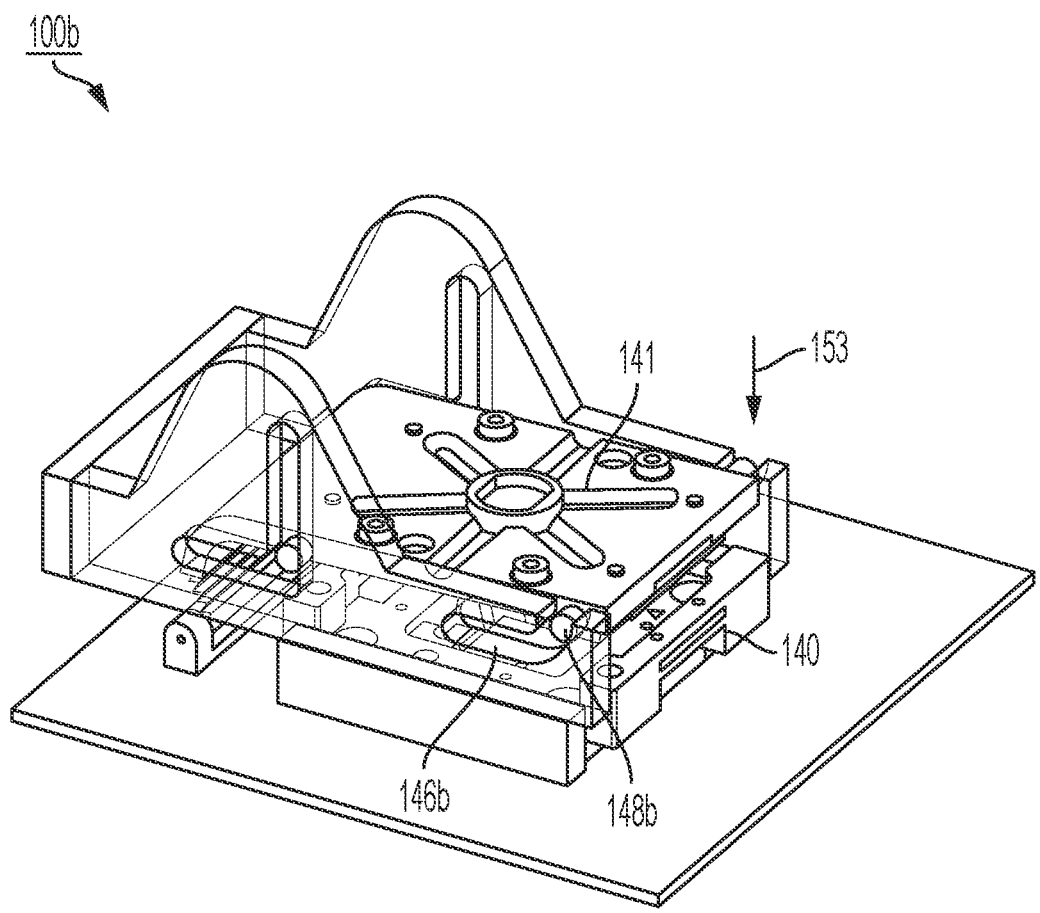
Figure 54:
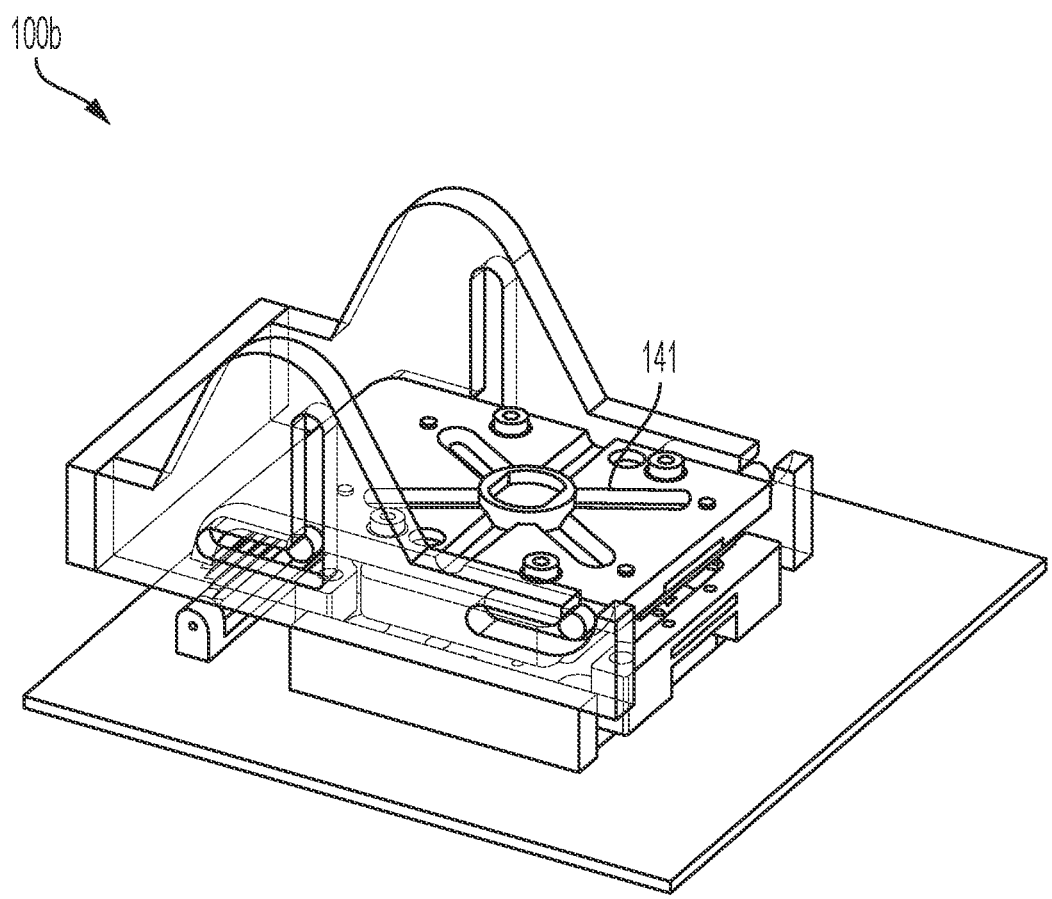
Figure 55:
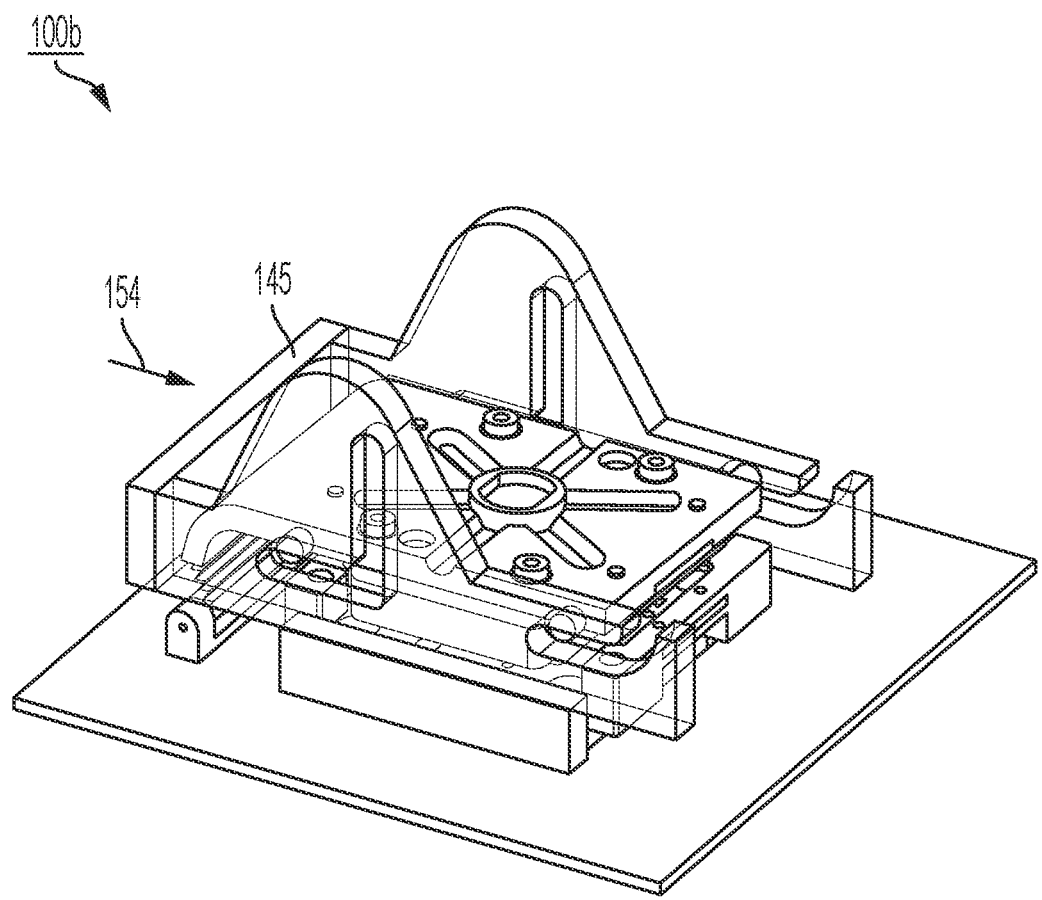

In the configuration of FIG. 51, lid 141 is pivoted up and away from receptacle 140 to expose receptacle 140 to a picker as described herein. FIG. 51 shows part of the operation for closing lid 141 over the receptacle—which may contain a DUT but does not in this illustration. In FIG. 52, lid 141 pivots downwardly in the direction of arrow 150 toward receptacle 140. During this movement, roller 148a moves downward along track 146a in the direction of arrow 151. In FIG. 53, lid 141 has moved into a position that parallel to receptacle 140 and roller 148b has engaged track 146b— the same operations occur on the opposite of socket 100b. Lid 141, however, is still above the receptacle. Accordingly, in FIG. 53, lid 141 begins to move downward perpendicularly to the receptacle in the direction of arrow 153 to provide the relatively even clamping force to a DUT in the receptacle. During this motion, the metal bellows or accordion-like structure 141c compresses. In FIG. 54, the perpendicular downward movement of lid 141 has continues and is completed in FIG. 55. There, panel 155 moves/has moved in the direction of arrow 154 to lock lid 141 in place over the receptacle during testing. The reverse operations are performed to open the lid of the test socket.

FIGS. 57 to 66 show another example implementation of a test socket 100c having a lid that opens and closes automatically in coordination with operation of the gantry and pickers described previously. Some components of these figures are shown as transparent for illustration, but are may not be transparent in actual operation.

Figure 57:
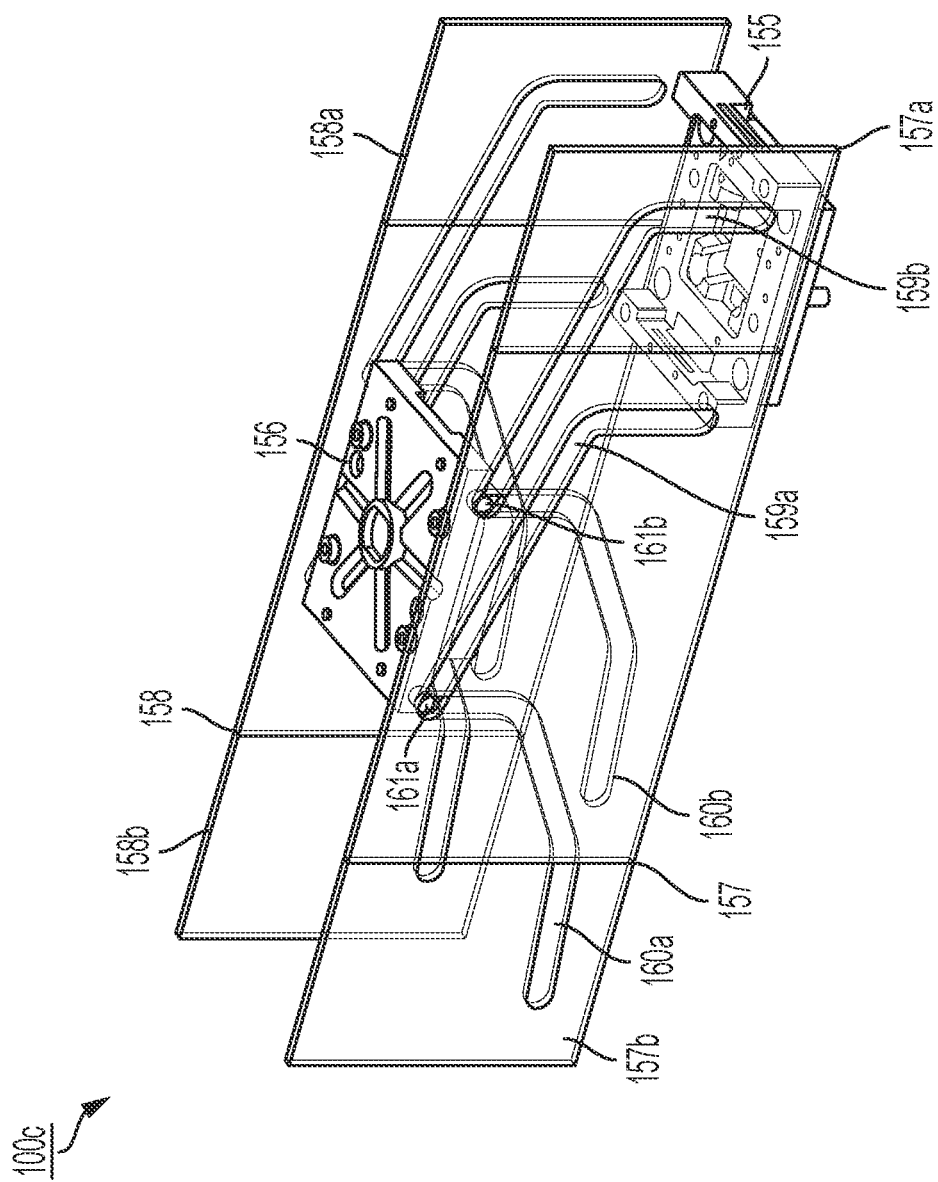
FIGS. 57 to 66 include alternating perspective and side views showing operation of another example test socket having an automated lid.

Referring to FIG. 57, socket 100c may be mounted on PCB (not shown) and includes receptacle 155 and lid 156. Socket 100b also includes a set of first plates 157 on a first side of the lid and a set of second plates 158 on a second side—for example, an opposite side—of the lid. These first and second sets of plates may be identical in construction and function. To summarize, in the example configuration of FIGS. 57 to 66, there are two sets of plates, with one mobile plate on each side of the lid and one stationary plate on each side of the lid. Each plate—both mobile and stationary—includes two sets of tracks, making for a total of eight tracks in this example. There are two sets of rollers on the lid—one set on each side—with each roller being configured to fit into and move along an intersection of tracks on parallel stationary and mobile plates. Since each side has an identical plate and roller configuration, the plate and roller configuration on only one side of the lid is described starting with FIG. 57.

Plates 157 include a stationary plate 157a that remains at a fixed location relative to receptacle 155 and a mobile plate 157b that is movable relative to the stationary pate, the receptacle, and a DUT in the receptacle. Also, although not described in detail, plates 158 include a stationary plate 158a that remains at a fixed location relative to receptacle 155 and a mobile plate 158b that is movable relative to the stationary pate, the receptacle, and a DUT in the receptacle. Stationary plate 157a and mobile plate 157b each includes a set of angled tracks. Tracks 159a, 159b on stationary plate 157a may be identical in structure, spaced apart, and each contain a single bend in this example. Tracks 160a, 160b on mobile plate 157b may be identical in structure, spaced apart, and each contain a two bends in this example. Plate configurations and track configurations other than those shown in the figures may be used.

Mobile plate 157b and stationary plate 157a are configured and arranged in parallel such that their respective pairs of track each align at least at a single location and such that this single location changes as mobile plate 157b moves relative to stationary plate 157a, relative to receptacle 155, and relative to the DUT in receptacle 155. Each side of lid 156 contains two sets of rollers that may have identical locations on their respective sides and be identical in structure and function. Accordingly, only rollers 161a and 161b are described. As shown in FIGS. 57 to 66, roller 161a is at the intersection of track 159a of stationary plate 157a and track 160a of mobile plate 157b. Roller 161b is at the intersection of track 159b of stationary plate 157a and track 160b of mobile plate 157b. As such, lid 156 is mounted between the first and second sets of plates 157, 158, as shown in FIG. 57. During movement of mobile plate 157b, rollers 161a, 161b and their counterparts on second set of plates 158 move along the track intersections, thereby bringing the lid into contact with the receptable or a DUT in the receptacle. Example operations illustrating lid movement in perspective view are shown in FIGS. 57 to 66 with corresponding side views.

Figure 64:
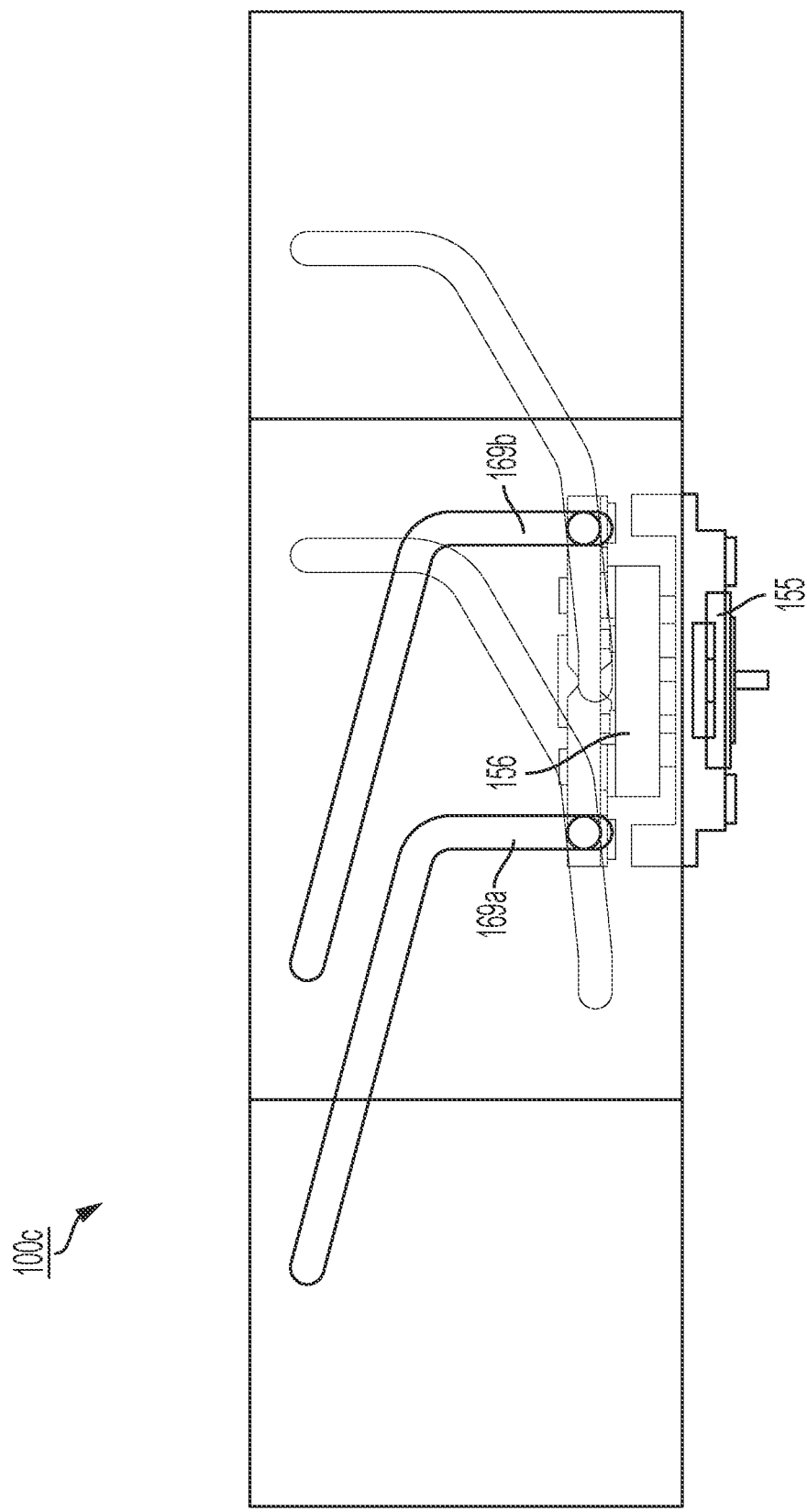
Figure 65:
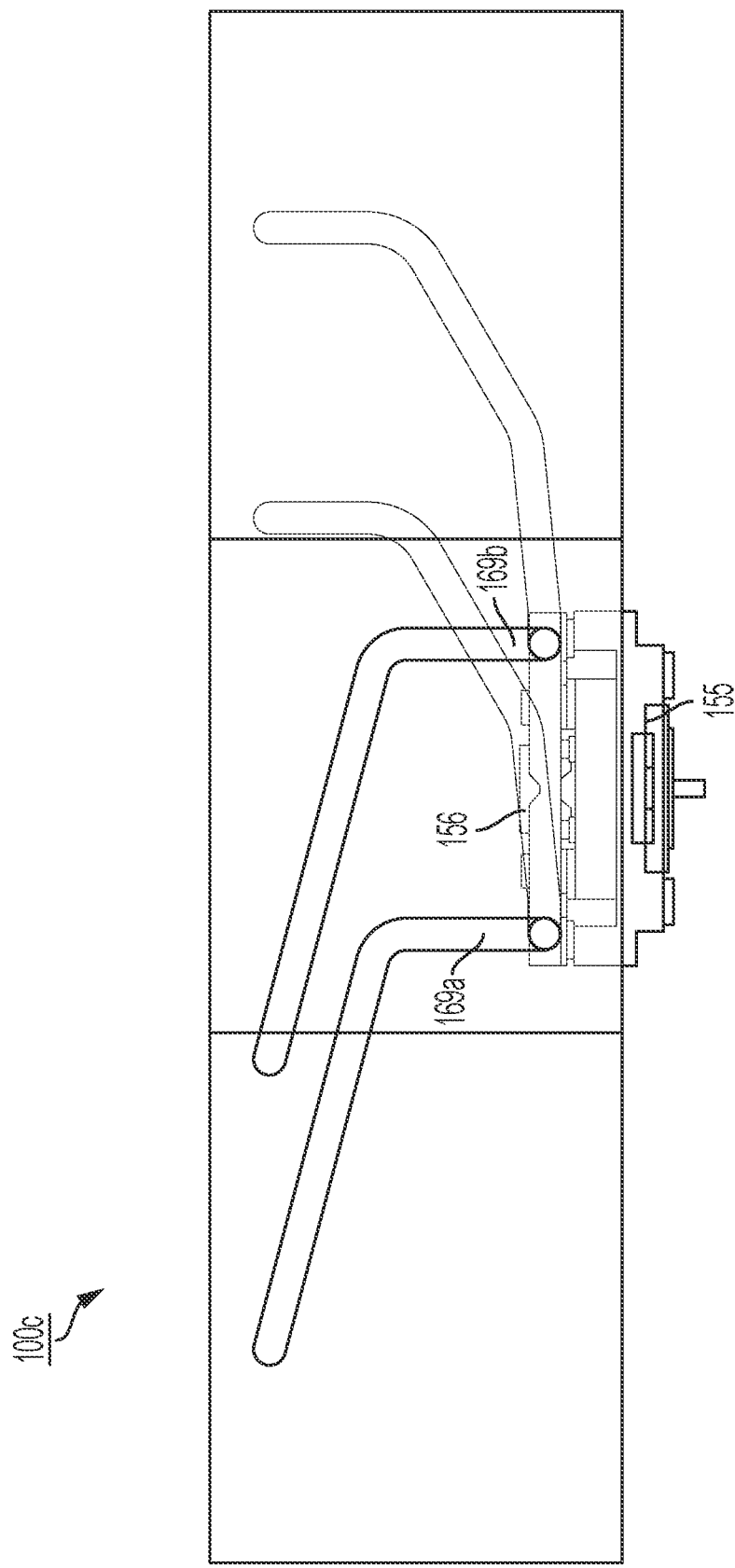
Figure 66:
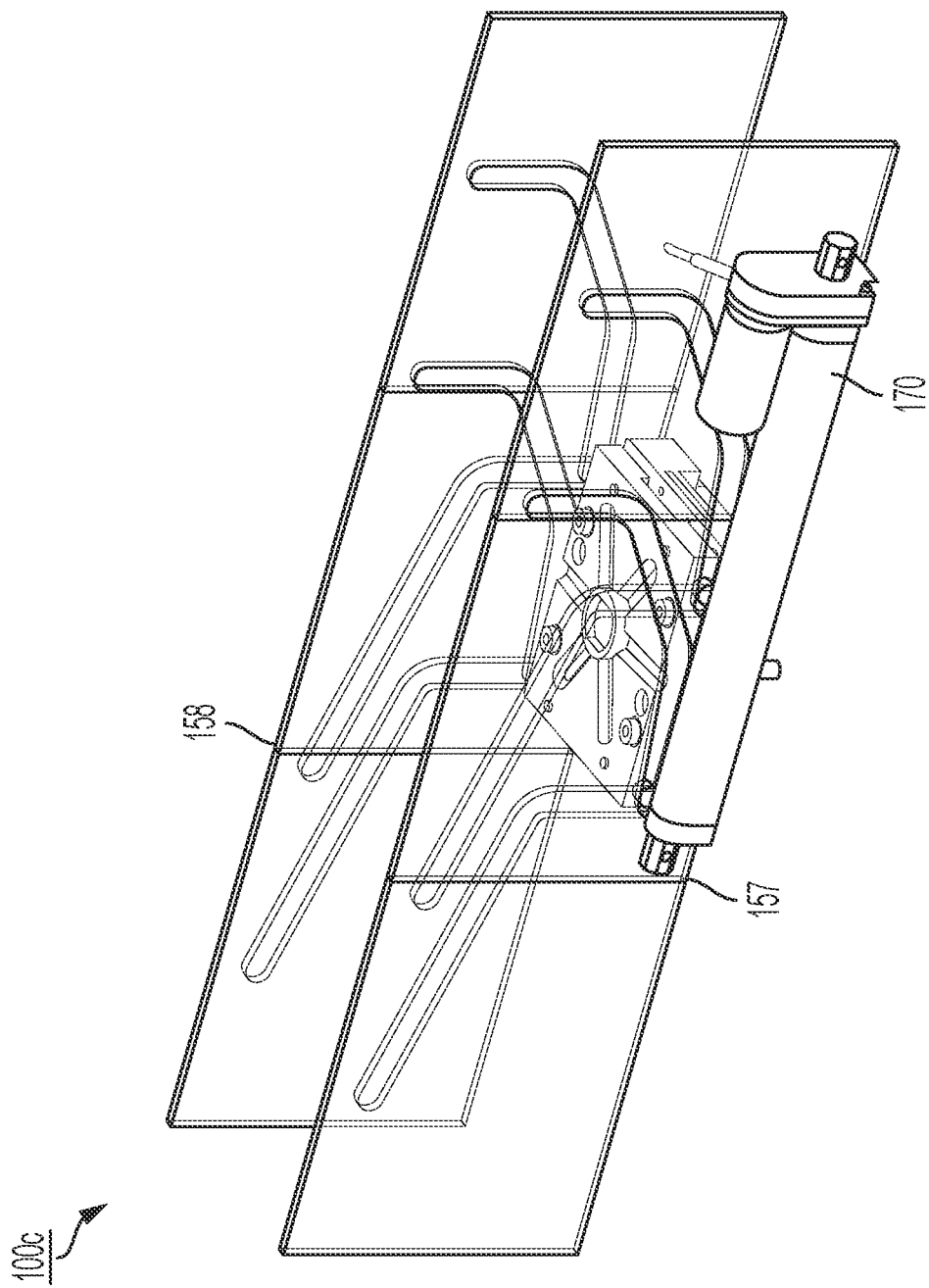

FIGS. 57 to 66 show operation of test socket 100b. In this example, no DUT is shown; however, in this sequence of operations, movements of the lid and pickers are coordinated so that the lid is opened when the picker arrives at the receptacle and so that the lid closes when the picker moves away. The movements described with respect to FIGS. 57 to 66 may be implemented using one or more actuators of the type described herein and/or one or more motors. An example of an actuator or motor 170 that may be used is shown in FIG. 66. Although only one actuator or motor is shown, in some implementations there is one such actuator or motor on each side of the test socket. The actuator or motor is left out of other figures to illustrate lid operations.

Figure 58:
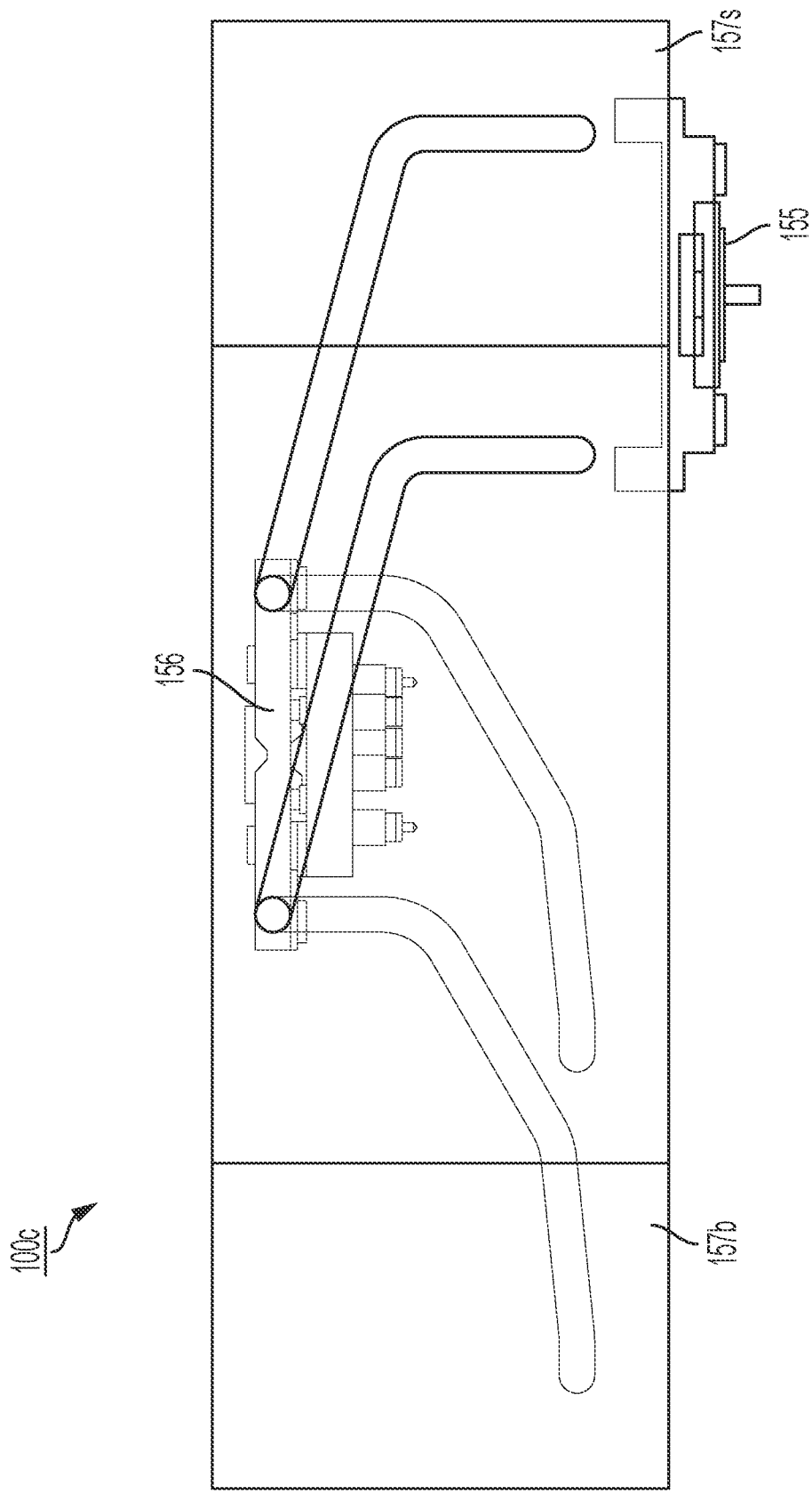
Figure 59:
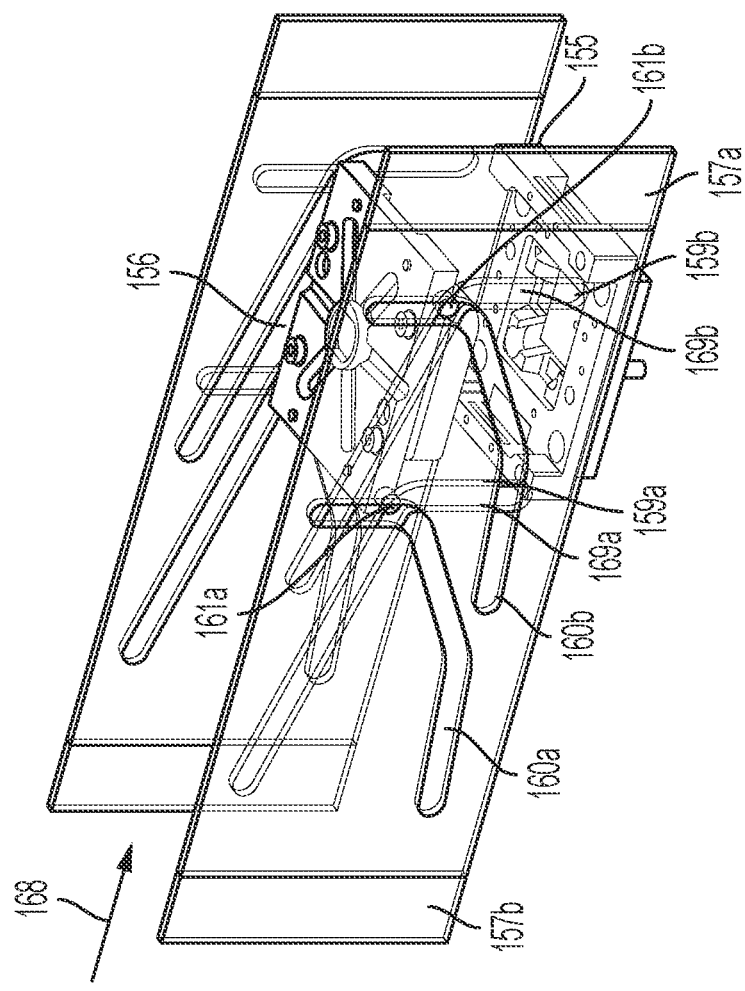
Figure 60:
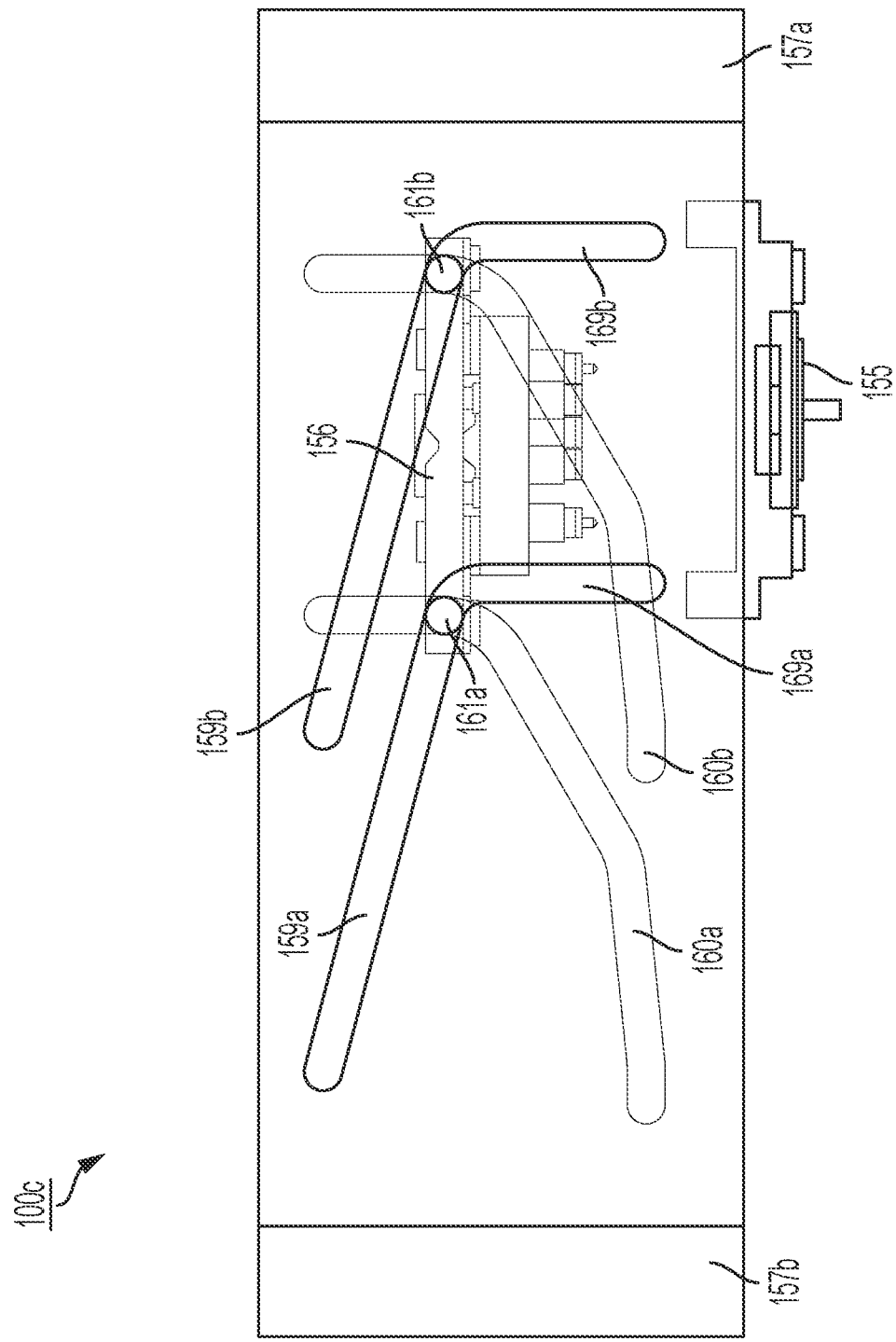
Figure 61:
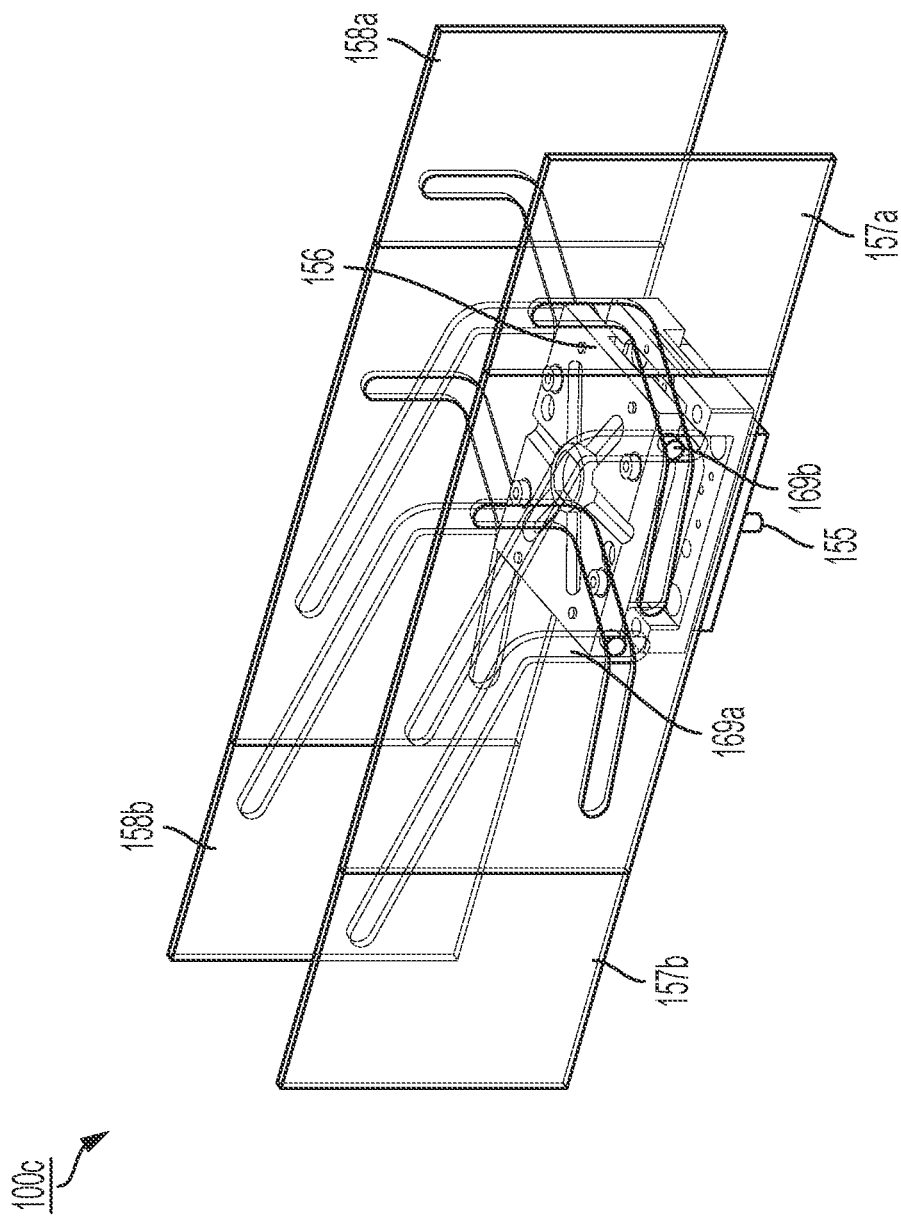
Figure 62:
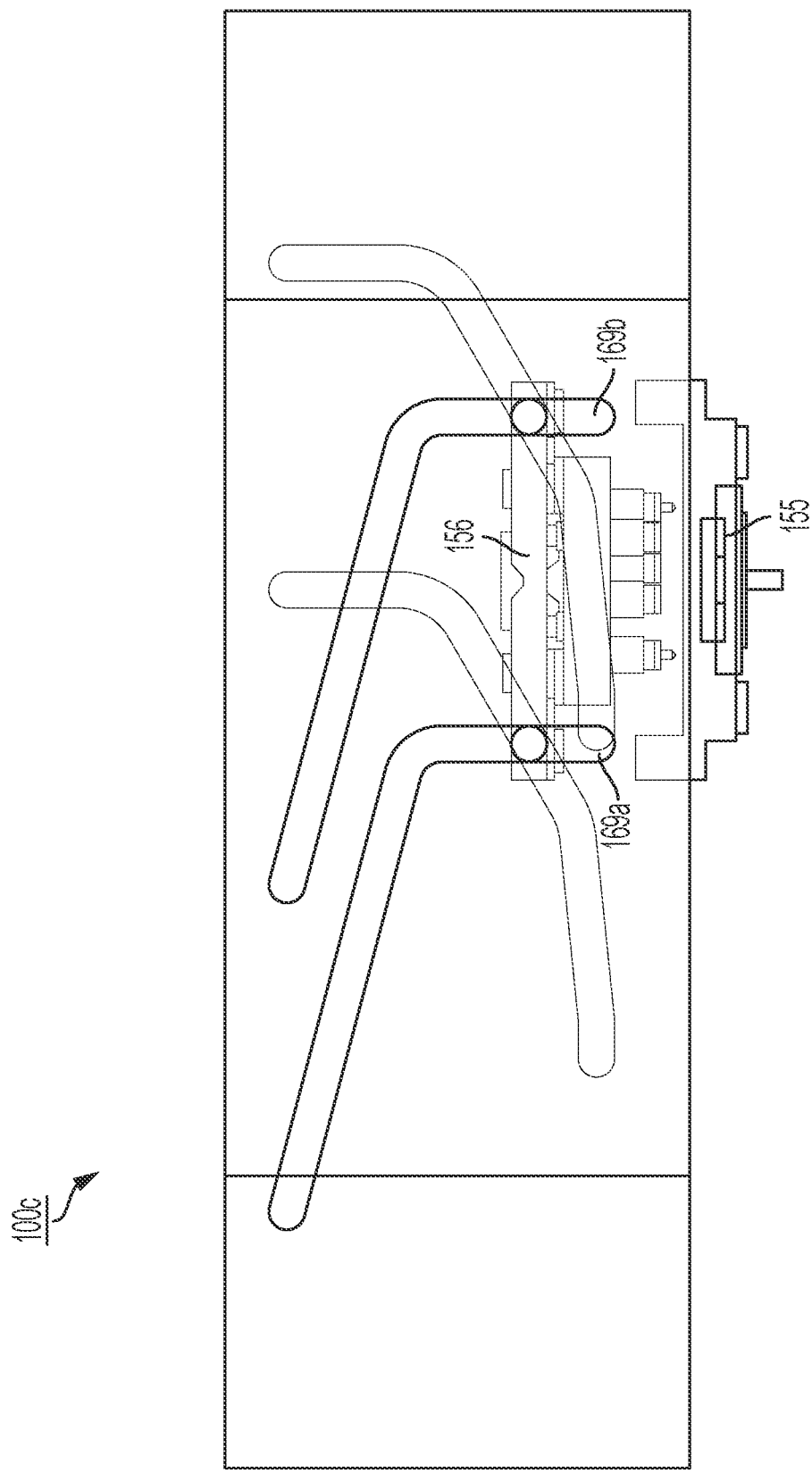
Figure 63:
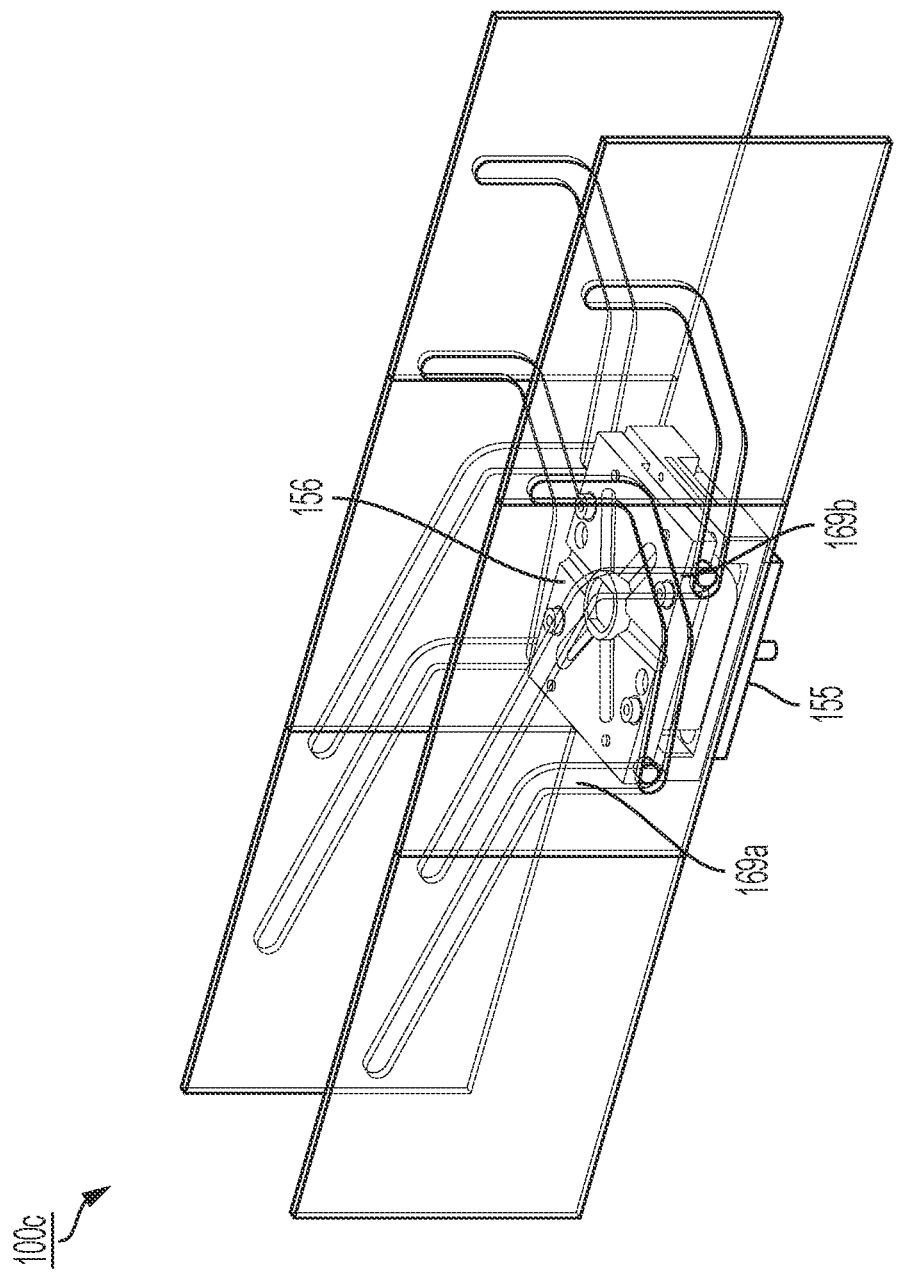

In the configuration of FIG. 57, lid 156 is moved up and away from receptacle 155 to expose receptacle 155 to a picker as described herein. FIG. 57 shows part of the operation for closing lid 156 over the receptacle—which may contain a DUT but does not in this illustration. FIG. 58 shows the same configuration as FIG. 57 in side view. In FIG. 59, mobile plate 157b moves in the direction of arrow 168, causing rollers 161a, 161b to move lid 156 along the intersections of track 159a, 160a and 169b, 160b of plates 157a, 157b. The same motions occur on the other side of lid 156. FIG. 60 shows the same configuration as FIG. 59 in side view. As shown in FIGS. 59 and 60, tracks 159a and 159b on stationary plate 157a include branches 169a and 169b, respectively, that are perpendicular to receptacle 155. At the point shown FIGS. 59 and 60, the lid's rollers are about to enter those branches. In those branches 169a and 169b, perpendicular, or vertical, movement of lid 156 is implemented in order to apply relatively even downward pressure or clamping force from lid 156 across the top of a DUT when making the mechanical and electrical connections between the receptacle and the DUT. In the configuration of FIG. 61, lid 156 has moved part-way down along branches 169a and 169b towards the receptacle and DUT therein (not shown). FIG. 62 shows the same configuration as FIG. 61 in side view. In the configuration of FIG. 63, lid 156 has moved all the way down along branches 169a and 169b towards the receptacle at a point to make contact to a DUT therein (not shown). FIG. 64 and FIG. 65 show the final closure of the lid in side view as a two-step process.

A lid, such as those described herein, is configured for a specific socket application in terms of DUT size and thickness, whether the DUT is configured for top testing, and any DUT-specific heating or cooling requirements An attachment mechanism, which may be considered part of or separate from the lid, includes a stop plate that abuts the socket frame when the lid is full engaged with the test socket to establish a precision Z-dimension (or vertical) reference. The lid includes springs that are compressible to provide precise forces to the device in the socket even if there is fluctuation in force applied by the actuator. The lid includes a cap that contacts the device. This cap is aligned to the socket via alignment pins that also align to thermal control components in the lid. The thermal components are described in more detail below and may include passive heat sinks or active components such as a liquid cooled plate, a thermoelectric cooler (TEC), and/or electric heating elements. The test socket may also include temperature one or more sensors to monitor the temperature of the components. The test socket may also include one or more temperature sensors to monitor the temperature of the test socket or the test site containing the test socket.

Figure 67:
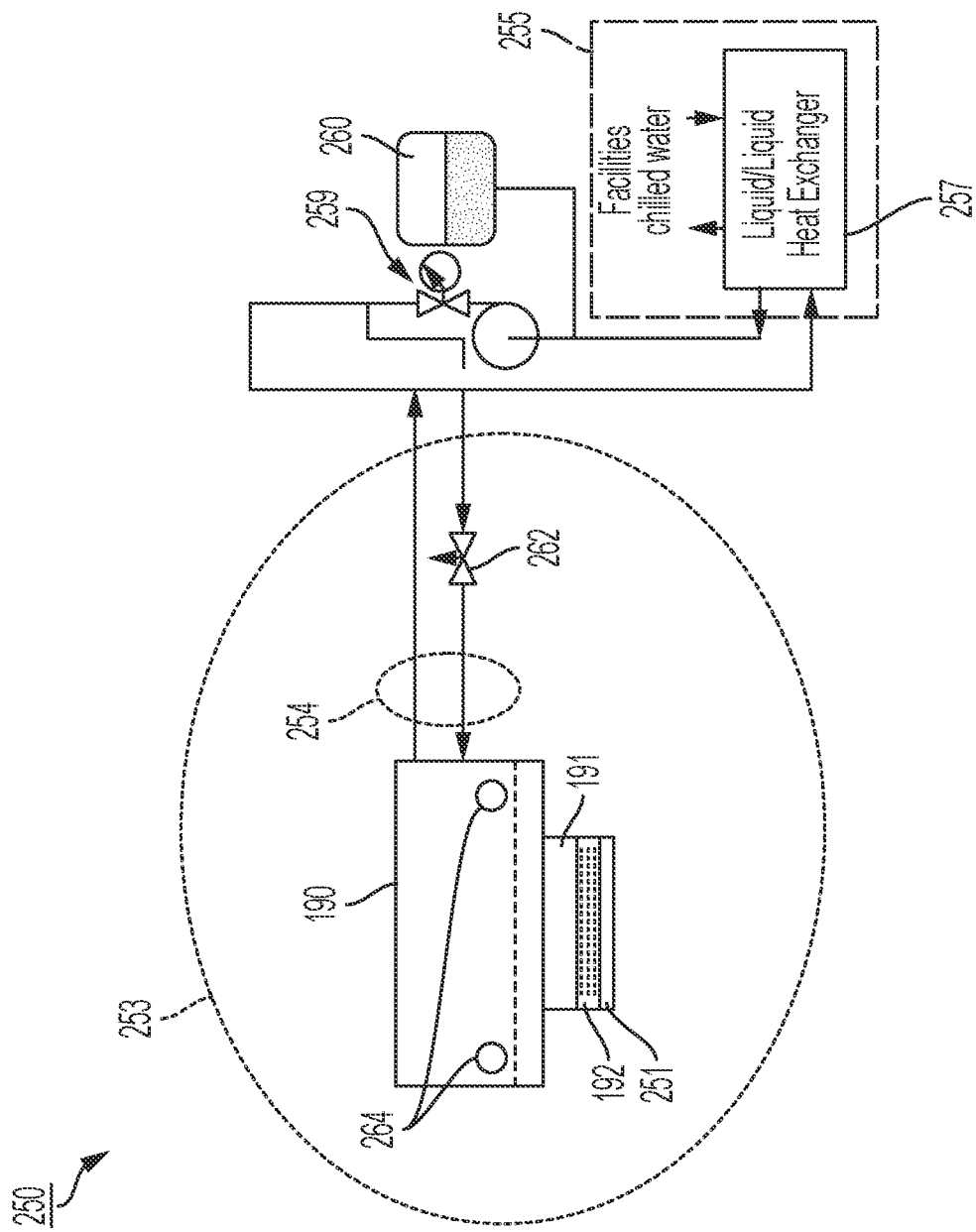
FIG. 67 is a block diagram of components of an example thermal control system for a test site that supports independent and asynchronous testing.

FIG. 67 shows example components 250 that may be included in a thermal control system for the test systems described herein. The example thermal control system includes components 253 that are included at each test site. Those components may be configured to control a temperature of a DUT in a test site separately from control over temperatures of other DUTs in other test sites. The components of FIG. 67 therefore enable and/or contribute to the test system's ability to control the temperature of individual test sockets independently and asynchronously and, therefore, to perform testing, including thermal testing, on DUTs in the test sockets independently and asynchronously.

In FIG. 67, cold plate 190, TEC 191, and cap 192 are shown. As shown, TEC 191 is not directly in contact with a DUT 251, but rather is in indirect contact through cap 192. Cap 192 is made of a thermally conductive material such as metal. Accordingly, the indirect contact between the TEC and the DUT through the cap still enables thermal conduction between the TEC and the DUT. The cap thus creates a thermal path between the TEC and the DUT. The resulting thermal conduction enables control over the temperature of the DUT through transfer of heat between the DUT and cold plate 190. More specifically, heat is transferred by the TEC between the DUT (through the cap) and the cold plate. Operation of the TEC to transfer the heat may be controlled by the control system. In some implementations, the cap may be left off and the TEC may directly contact the DUT. In such implementations, the thermal path will be or include a direct path between the TEC and the DUT.

In this example, cold plate 190 has structure that is at least partly flat, hence use of the term "plate". However, cold plate 190 may have any appropriate structure, including cubical structures or polyhedral structures. The cold plate may be reduced in temperature using liquid coolant conduits that run to, through, and/or over the cold plate. Examples of liquid coolant that may be used include, but are not limited to, liquid nitrogen, chilled water, an ethylene glycol and water mixture, hydrofluoroether (HFE), and silicone oil. One or more conduits 254 are configured to transport the liquid coolant between cold plate 190 and a supply 255 of the liquid coolant. The supply may be within the housing of the test system or external to the test system. The liquid coolant thus circulates between the cold plate and its supply. A liquid/liquid/heat exchanger 257 may be arranged in the circulation path of the liquid coolant, for example at the supply, to maintain the liquid coolant at a target temperature using chilled water. A pressure regulator 259 in conjunction with an expansion tank 260 may be configured to maintain the pressure of the liquid coolant in the conduits. In some examples, the control system described herein may control the flow of liquid coolant shown in FIG. 67 and control operation of the liquid/liquid/heat exchanger 257 to maintain the temperature of the liquid coolant reaching the cold plate at or below 68° Fahrenheit (F) (20° Celsius (C)). In some examples, the control system may control these operations to maintain the temperature of the circulating liquid coolant at different temperatures.

The flow of liquid coolant to each test site is independently and asynchronously controllable to affect—for example, to reduce—a temperature of a DUT in each test site. The control system described herein may control the flow of liquid coolant to the test site based, for example, on active feedback from temperature sensors at the test site. The temperature sensors may include a first temperature sensor at, on, or near the cap 192 to detect a temperature proximate to the DUT and a second temperature sensor at, on, or near the cap but farther away from the DUT than the first temperature sensor. Additional or fewer temperature sensors may be used, which may be distributed across various locations on the lid. In this example, the two temperature sensors send temperature data to the control system. The control system is configured to control the temperature of the DUT based on the sensed temperatures based on the requirements of one or more test programs being run to test the DUT.

As shown in FIG. 67, thermal control system 250 may include one or more valves to control a flow of the liquid coolant through the conduits to and from the cold plate 190. For example, valve 262 may be opened to allow coolant to flow to cold plate 190 or closed to prevent coolant from flowing to cold plate 190. In some implementations, the valve may be opened partially or proportionally to regulate the volume of liquid coolant that is transported to and/or from the cold plate. A greater volume of liquid coolant provided over a shorter period of time may cause a greater rate of temperature change than a lesser volume of liquid coolant provided over a longer period of time.

The thermal control system may also include one or more—for example two—heaters 264 embedded in, or placed on, the cold plate. The heaters are adjustable by the control system to increase a temperature of the cold plate and, through conduction via the TEC and the cap, to increase the temperature of the DUT during testing. The heaters may be arranged at locations on the cold plate that ensure equal or substantially equal distribution of heat over the cold plate. This temperature increase may be a requirement of a test program, for example. During a heating cycle, the flow of liquid coolant to the cold plate may stop or may be reduced so as not to counteract the heating produced by the heaters. The system may control the heaters to heat the cold plate at a rate that is greater than or equal to a predefined rate required for testing. During cooling using the liquid coolant, the heaters may be turned off or turned down so as not to counteract the cooling produced by the liquid coolant.

Figure 68:
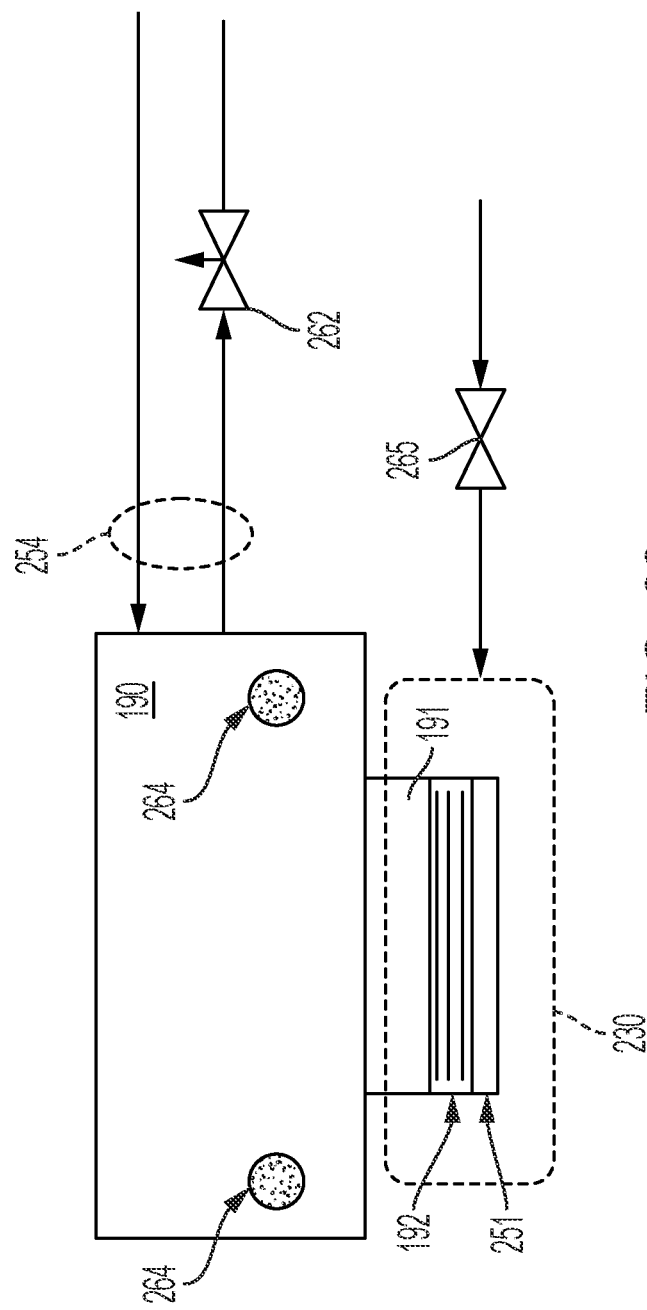
FIG. 68 is a block diagram of components of an example thermal control system for a test site that supports independent and asynchronous testing.

FIG. 68 shows components of the thermal control system in an implementation that includes a thermal and environmental enclosure 230 of over the DUT. The other components of FIG. 68 are the same as those labeled also in FIG. 67. In this example, at least the combination of the liquid coolant, the heaters, and the physical and thermal isolation produced by enclosure 230 enables the test system to test the DUT independently of, and asynchronously from, testing of other DUTs in other test sites. FIG. 68 also shows a fitting connected to the enclosure 230 to introduce vacuum pressure or purge gas and/or ionized gas into the enclosure. In this example, the fitting includes a valve 265 that is controlled by the control system. The valve may be controllable to open to introduce vacuum pressure or vacuum—that is, suction—to the enclosure or to close to prevent vacuum pressure from reaching the enclosure. The valve may be controllable to open to introduce purge gas to the enclosure or to close to prevent the purge gas from reaching the enclosure. The valve may be controllable to open to introduce ionized air from an ionized air supply to the enclosure or to close to prevent the ionized air from reaching the enclosure. In some implementations, the purge gas and ionized air may be mixed and provided to enclosure 230 at the same time.

In operation, the temperature of a DUT in a test socket is controlled by changing a temperature of cold plate 190 that is thermally conductive. This is done by controlling an amount of liquid coolant that flows through the cold plate and/or controlling a temperature of the cold plate by controlling operation of one or more heaters in contact with the plate. The TEC is controlled to transfer heat between the plate and the DUT to control the temperature of the DUT. Following heated testing, the heaters may be turned-off and the liquid coolant may be controlled to flow through the structure to cool the structure down to a handling temperature, such as 68° F. (20° C.).

Figure 69:
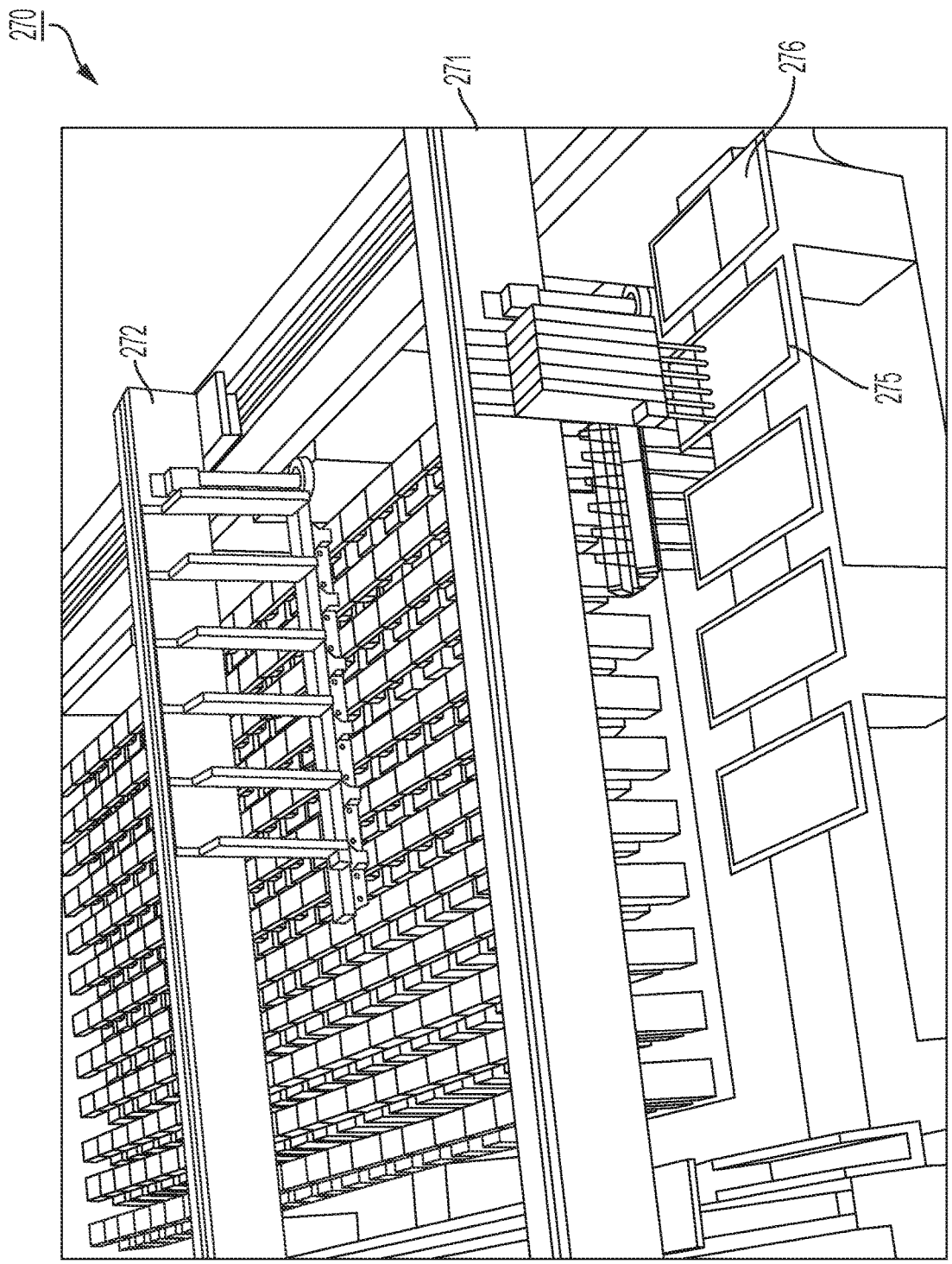
FIG. 69 is a perspective view of parts of pick-and-place automation that may be part of an example test system described herein and that includes two movable gantry beams.

In some implementations of the test system described herein, the automated gantry may include more than one gantry beam that moves relative to a horizontal plane of test sites. For example, as shown in FIG. 69, example test system 270 may include two gantry beams 271 and 272, each operating as described herein and containing a separate set of pickers having the features and operability described herein. During operation, gantry beams 271 and 272 may be controlled by control system so that the two gantry beams access different rows of trays and sockets at the same time or at different times. For example, gantry beam 270 may access front halves of trays 275 and 276 and may service a front half of the test sockets and gantry beam 272 (which is in back of gantry beam 271) may access back halves of trays 275 and 276 and may service a back half of the test sockets. In operation, gantry beams 271 and 272 may retrieve their devices from the front and back halves of tray 276 contemporaneously or concurrently, perform pick and place operations on their respective sockets contemporaneously or concurrently, and then move back to the feeder contemporaneously or concurrently to deposit tested devices in tray 275 and retrieve untested devices from tray 276. In some implementations, the system may include more than two gantry beams, such as three gantry beams or four gantry beams that each contain respective pickers and that operate in the manner described herein to service a proportionate share of the test sockets included on the system. In some implementations, there may be one gantry beam per opposing pair of packs. In some implementations, each gantry beam may be configured to service all sockets in the system, allowing one or more of the additional gantry beams to become inoperable without preventing the system from testing across the whole work area. The other features of test system 270 may be as described herein.

In implementations such as those shown in FIG. 69, the sockets are controllable based on motion of both gantry beams and pickers thereon in order to be open by the time a picker arrives at the socket location, as described herein.

In example implementations, the test system is 1.6 meters (m) in width by 8 m in length. However, the test system is not limited to these dimensions and may be any appropriate size. The test system may scale to accommodate a user's needs.

The example test systems described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example systems described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may include a direct physical connection or a wired or wireless connection that includes or does not include intervening components but that nevertheless allows electrical signals to flow between connected components. Any "connection" involving electrical circuitry that allows signals to flow, unless stated otherwise, includes an electrical connection and is not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test socket for a test system, the test socket comprising:
    a receptacle to make electrical and mechanical connections to a device under test (DUT);
    a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
    an actuator to control opening and closing of the lid, the actuator being configured to move the lid perpendicularly to the receptacle and to pivot the lid relative to the receptacle; and
    a gear connected to the actuator, the gear being usable to move the lid perpendicularly to the receptacle.

2. The test socket of claim 1, wherein the actuator comprises a motor.

3. The test socket of claim 2, where a torque of the motor provides a clamping force to the DUT to complete the electrical and mechanical connections between the test socket and the DUT.

4. A test socket for a test system, the test socket comprising:
- a receptacle to make electrical and mechanical connections to a device under test (DUT);
- a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
- an actuator to control opening and closing of the lid, the actuator being configured to move the lid perpendicularly to the receptacle and to pivot the lid relative to the receptacle; and
- wherein the actuator comprises a helical worm drive screw that causes motion of the lid and that is configured to provide a clamping force to the DUT to complete the electrical and mechanical connections between the test socket and the DUT.

5. A test socket for a test system, the test socket comprising:
- a receptacle to make electrical and mechanical connections to a device under test (DUT);
- a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
- an actuator to control opening and closing of the lid, the actuator being configured to move the lid perpendicularly to the receptacle and to pivot the lid relative to the receptacle; and
- a plate having a track having a first branch that extends perpendicularly to the receptacle and a second branch that extends obliquely relative to the receptacle.

6. The test socket of claim 5, wherein the lid comprises a roller, the actuator for moving the roller along the first branch to move the lid perpendicularly to the receptacle and for moving the roller along the second branch to pivot the lid relative to the receptacle.

7. A test socket for a test system, the test socket comprising:
- a receptacle to make electrical and mechanical connections to a device under test (DUT);
- a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT; and
- a thermal control system to control a temperature of the DUT in the test socket separately from control over temperatures of other DUTs in other test sockets, the thermal control system comprising a thermoelectric cooler (TEC) and a structure connected to the lid that is thermally conductive, the TEC being in thermal communication with the DUT to control the temperature of the DUT by transferring heat between the DUT and the structure.

8. The test socket of claim 7, wherein the thermal control system comprises:
- liquid coolant to flow through the structure to reduce a temperature of the structure.

9. The test socket of claim 8, wherein the liquid coolant comprises liquid nitrogen.

10. The test socket of claim 7, wherein the thermal control system comprises a heater.

11. A test socket for a test system, the test socket comprising:
- a receptacle to make electrical and mechanical connections to a device under test (DUT);
- a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
- a first plate on a first side of the lid, the first plate comprising first tracks;
- a second plate on a second side of the lid, the second plate comprising second tracks;
- first rollers on the first side of the lid; and
- second rollers on the second side of the lid;
- wherein, during opening and closing of the lid, the first rollers move along the first tracks and the second rollers move along the second tracks.

12. The test socket of claim 11, wherein at least one of the first tracks and at least one of the second tracks comprises a right-angled track.

13. The test socket of claim 11, wherein the first plate is a single plate and the second plate is a single plate.

14. The test socket of claim 11, further comprising:
- a hinge to which the lid is connected, the hinge comprising a spring that enables compression of the lid to apply force to the DUT to complete the electrical and mechanical connections between the test socket and the DUT.

15. A test socket for a test system, the test socket comprising:
- a receptacle to make electrical and mechanical connections to a device under test (DUT);
- a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
- a first set of plates on a first side of the lid, the first set of plates comprising first tracks;
- a second set of plates on a second side of the lid, the second set of plates comprising second tracks;
- first rollers on the first side of the lid; and
- second rollers on the second side of the lid;
- wherein, during opening and closing of the lid, the first rollers move along the first tracks and the second rollers move along the second tracks.

16. The test socket of claim 15, wherein the first set of plates comprise a first mobile plate and a first stationary plate, and the second set of plates comprise a second mobile plate and a second stationary plate; and
- wherein the first mobile plate is controllable to move relative to the first stationary plate and the second mobile plate is controllable to move relative to the second stationary plate to cause the lid to open or to close.

17. The test socket of claim 16, wherein the first mobile plate comprises a first track and a second track, the first stationary plate comprises a third track and a fourth track, the first track intersecting the third track at a location of one of the first rollers and the second track intersecting the fourth track a location of one of the first rollers; and wherein the second mobile plate comprises a fifth track and a sixth track, the second stationary plate comprises a seventh track and an eighth track, the fifth track intersecting the seventh track at a location of one of the second rollers and the sixth track intersecting the eighth track a location of one of the second rollers.

18. The test socket of claim 15, wherein each of the first tracks and the second tracks comprises one or more bends.

19. A test system comprising:
a test socket comprising:
a receptacle to make electrical and mechanical connections to a device under test (DUT); and
a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to complete the electrical and mechanical connections between the test socket and the DUT;
a pick-and-place robot to move the DUT relative to the test socket; and
one or more processing devices to coordinate operation of the pick-and-place robot and to control opening and closing the lid so that the lid is pivoted when the pick-and-place robot reaches the test socket.

20. The test system of claim 19, wherein the one or more processing devices are configured to coordinate opening the lid with movement of the pick-and-place robot.

21. The test system of claim 19, further comprising:
a gantry on which the pick-and-place robot is mounted, the gantry being configured to move the pick-and-place robot relative to the test socket to position the pick-and-place robot for picking the DUT from the test socket or placing the DUT into the test socket;
wherein the test socket is arranged in at least one array of test sockets so that the test socket is accessible to the pick-and-place robot.

22. A test system comprising:
packs comprising:
test sockets for testing devices under test (DUTs); and
at least some test electronics for performing tests on the DUTs in the test sockets, where different packs are configured to have different configurations, the different configurations comprising at least different numbers of test sockets arranged at different pitches;
wherein a test socket among the test sockets comprises:
a receptacle to make electrical and mechanical connections a DUT; and
a lid to cover the DUT in the receptacle, the lid being controllable to open automatically to enable receipt of the DUT in the receptacle and, following receipt of the DUT, to close automatically to cover the DUT in the receptacle, where closing the lid applies force to the DUT to make the electrical and mechanical connections between the test socket and the DUT.

23. The test system of claim 22, wherein the test socket comprises:
an actuator to control opening and closing of the lid, the actuator being configured to move the lid perpendicularly to the receptacle and to pivot the lid relative to the receptacle;
wherein the test socket comprises a plate having a track having a first branch that extends perpendicularly to the receptacle and a second branch that extends obliquely relative to the receptacle; and
wherein the lid comprises a roller, the actuator for moving the roller along the first branch to move the lid perpendicularly to the receptacle and for moving the roller along the second branch to pivot the lid relative to the receptacle.

24. The test system of claim 22, wherein the test socket comprises:
a first plate on a first side of the lid, the first plate comprising first tracks;
a second plate on a second side of the lid, the second plate comprising second tracks;
first rollers on the first side of the lid; and
second rollers on the second side of the lid; and
wherein, during opening and closing of the lid, the first rollers move along the first tracks and the second rollers move along the second tracks.

25. The test system of claim 22, wherein the test socket comprises:
an actuator to control opening and closing of the lid, the actuator being configured to move the lid perpendicularly to the receptacle and to pivot the lid relative to the receptacle.

26. The test system of claim 22, wherein the test socket comprises an actuator to open and close the lid;
wherein the actuator comprises one of a hydraulic actuator or a pneumatic actuator.

* * * * *